United States Patent
Takahashi et al.

(10) Patent No.: US 11,888,004 B2
(45) Date of Patent: Jan. 30, 2024

(54) IMAGING APPARATUS HAVING PHASE DIFFERENCE DETECTION PIXELS RECEIVING LIGHT TRANSMITTED THROUGH A SAME COLOR FILTER

(71) Applicant: SONY SEMICONDUCTOR SOLUTIONS CORPORATION, Kanagawa (JP)

(72) Inventors: Keiichiro Takahashi, Kanagawa (JP); Kazuhito Kobayashi, Kanagawa (JP); Katsumi Nishikori, Kanagawa (JP); Shoyu Tanaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 333 days.

(21) Appl. No.: 16/634,303

(22) PCT Filed: Jul. 25, 2018

(86) PCT No.: PCT/JP2018/027844
§ 371 (c)(1),
(2) Date: Jan. 27, 2020

(87) PCT Pub. No.: WO2019/026718
PCT Pub. Date: Feb. 7, 2019

(65) Prior Publication Data
US 2020/0161352 A1 May 21, 2020

(30) Foreign Application Priority Data

Aug. 3, 2017 (JP) .................................. 2017-150744
Feb. 1, 2018 (JP) .................................. 2018-016077

(51) Int. Cl.
*H01L 27/146* (2006.01)
*H04N 25/60* (2023.01)

(52) U.S. Cl.
CPC .. *H01L 27/14621* (2013.01); *H01L 27/14623* (2013.01); *H01L 27/14641* (2013.01); *H04N 25/60* (2023.01)

(58) Field of Classification Search
CPC ......... H01L 27/14621; H01L 27/14623; H01L 27/14641; H01L 27/14627;
(Continued)

(56) References Cited

U.S. PATENT DOCUMENTS

2010/0238330 A1* 9/2010 Hirota ............... H01L 27/14645
348/273
2013/0057735 A1 3/2013 Hirota
(Continued)

FOREIGN PATENT DOCUMENTS

CN 103037161 A 4/2013
CN 105611124 5/2016
(Continued)

OTHER PUBLICATIONS

International Search Report and Written Opinion prepared by the European Patent Office dated Oct. 8, 2018, for International Application No. PCT/JP2018/027844.
(Continued)

*Primary Examiner* — Ermias T Woldegeorgis
(74) *Attorney, Agent, or Firm* — SHERIDAN ROSS P.C.

(57) ABSTRACT

An imaging apparatus includes a pixel array unit including a plurality of pixel groups, each of the plurality of pixel groups being one of i) a normal pixel group including only normal pixels, or ii) a mixed pixel group including at least one normal pixel and at least one phase difference detection pixel, wherein the pixel array unit comprises at least one normal pixel group and at least one mixed pixel group. For each normal pixel group, the normal pixels receive light transmitted through a same colored color filter. For each mixed pixel group, the at least one phase difference detection pixel shares an on-chip lens with at least one other phase difference detection pixel and receives light transmitted
(Continued)

through a same colored color filter as the at least one other phase difference detection pixel.

17 Claims, 31 Drawing Sheets

(58) Field of Classification Search
CPC .......... H01L 27/14605; H01L 27/1464; H01L 27/14643; H04N 5/2173; H04N 5/35554; H04N 5/36961; H04N 9/04557; H04N 5/37457; H04N 5/2254; H04N 5/23212; H04N 5/00
See application file for complete search history.

(56) References Cited

U.S. PATENT DOCUMENTS

| 2013/0057744 | A1 | 3/2013 | Minagawa et al. |
| 2013/0335604 | A1 | 12/2013 | Hirota |
| 2015/0054996 | A1* | 2/2015 | Minagawa ........... H04N 5/3745 348/300 |
| 2015/0288905 | A1 | 10/2015 | Minagawa et al. |
| 2017/0318252 | A1 | 11/2017 | Minagawa et al. |
| 2018/0184036 | A1 | 6/2018 | Sato |

FOREIGN PATENT DOCUMENTS

| JP | 2010239337 A | 10/2010 | |
| JP | 2013055500 A | 3/2013 | |
| JP | 2015133469 A * | 7/2015 | ....... H01L 27/14605 |
| JP | 2015181213 A | 10/2015 | |
| JP | 2016-015430 | 1/2016 | |
| KR | 20160097121 A | 8/2016 | |
| WO | WO-2012042963 A1 | 4/2012 | |
| WO | WO-2015029425 A1 * | 3/2015 | ....... H01L 27/14623 |
| WO | WO-2015151794 A1 | 10/2015 | |
| WO | WO-2016203974 A1 | 12/2016 | |
| WO | WO-2017126326 A1 | 7/2017 | |

OTHER PUBLICATIONS

Official Action (with English translation) for China Patent Application No. 202010579741, dated Oct. 17, 2023, 11 pages.

* cited by examiner

FIG.26

| $G_S$ | $G_L$ | $R_S$ | $R_L$ |
|---|---|---|---|
| $G_L$ | $G_S$ | $R_L$ | $R_S$ |
| $B_S$ | $G_L$ | $G_S$ | $G_L$ |
| $G_L$ | $B_S$ | $G_L$ | $G_S$ |

IMAGING APPARATUS HAVING PHASE DIFFERENCE DETECTION PIXELS RECEIVING LIGHT TRANSMITTED THROUGH A SAME COLOR FILTER

CROSS REFERENCE TO RELATED APPLICATIONS

This application is a national stage application under 35 U.S.C. 371 and claims the benefit of PCT Application No. PCT/JP2018/027844 having an international filing date of 25 Jul. 2018, which designated the United States, which PCT application claimed the benefit of Japanese Patent Application Nos. 2017-150744 filed 3 Aug. 2017 and 2018-016077 filed 1 Feb. 2018, the entire disclosures of each of which are incorporated herein by reference.

TECHNICAL FIELD

The present disclosure relates to an imaging apparatus (e.g., solid-state imaging apparatus) and an electronic device, and particularly, to an imaging apparatus and an electronic device that can provide more suitable phase difference pixels.

BACKGROUND ART

In recent years, a solid-state imaging apparatus provided with pixels for phase difference detection (hereinafter, referred to as phase difference pixels) is used to improve the speed of auto focus. An example of the structure of the phase difference pixels of this type includes a known technique disclosed in PTL 1.

Furthermore, an example of an array pattern of a plurality of pixels two-dimensionally arranged in a pixel array unit includes a known array pattern including systematically arranged shared pixels in which neighboring pixels of the same colors (four (2×2) pixels of the same colors) share pixel circuits.

CITATION LIST

Patent Literature

PTL 1: JP 2016-15430A

SUMMARY OF INVENTION

Technical Problem

Incidentally, in the case of adopting the array pattern including the systematically arranged shared pixels including neighboring pixels of the same colors, a technique for providing more suitable phase difference pixels is desired in providing the phase difference pixels to the pixel array of the shared pixels.

The present disclosure has been made in view of the circumstances, and the present disclosure enables to provide more suitable phase difference pixels.

Solution to Problem

A first imaging apparatus according to an aspect of the present disclosure is an imaging apparatus comprising a pixel array unit including a plurality of pixel groups, each of the plurality of pixel groups being one of i) a normal pixel group including only normal pixels, or ii) a mixed pixel group including at least one normal pixel and at least one phase difference detection pixel. For each normal pixel group, the normal pixels receive light transmitted through a same colored color filter. For each mixed pixel group, the at least one phase difference detection pixel shares an on-chip lens with at least one other phase difference detection pixel and receives light transmitted through a same colored color filter as the at least one other phase difference detection pixel.

The first imaging apparatus according to the aspect of the present disclosure includes that each of the plurality of pixel groups includes four pixels in a 2×2 array, and for the mixed pixel groups, the four pixels include the at least one phase difference detection pixel. The at least one phase difference detection pixel includes a first phase difference detection pixel and the at least one other phase difference detection pixel includes a second phase difference detection pixel, and the first phase difference detection pixel and the second phase difference detection pixel are adjacent to one another and belong to different mixed pixel groups. A contact of the first phase difference detection pixel and a contact of the second phase difference detection pixel are electrically connected to a same drive line. Contacts of the normal pixels in each of the plurality of pixel groups are electrically connected to respective drive lines to control an exposure time period for each normal pixel. The contact of the first phase difference detection pixel and the contact of the second phase difference detection pixel are electrically connected to the same drive line such that the first phase difference detection pixel and the second phase difference detection pixel have a same exposure time period. The imaging apparatus includes a plurality of floating diffusion areas, each floating diffusion area being for a respective pixel group. The imaging apparatus includes a plurality of pixel circuits, each pixel circuit being for a respective pixel group. The plurality of pixel groups are arranged in a matrix, and the mixed pixel groups are arranged at predetermined intervals in a row direction and a column direction. Each of the plurality of pixel groups includes four pixels arranged in a 2×2 array, and the at least one phase difference detection pixel includes a first phase difference detection pixel. The at least one other phase difference detection pixel includes a second phase difference detection pixel, and the first and second phase difference detection pixels have same exposure time periods. The four pixels include a first normal pixel having a first exposure time period, a second normal pixel having a second exposure time period shorter than the first exposure time period, and the same exposure time period of the first phase difference detection pixel and the second phase difference detection pixel is between the first exposure time period and the second exposure time period. The four pixels include a first normal pixel having a first exposure time period and a second normal pixel having a second exposure time period shorter than the first exposure time period, and the same exposure time period of first phase difference detection pixel and the second phase difference detection pixel is the first exposure time period. The first phase difference detection pixel and the second phase difference detection pixel are coupled to different floating diffusion areas. The plurality of pixel groups are arranged in a matrix. Each of the plurality of pixel groups includes first, second, third, and fourth pixels arranged in a 2×2 array. Each of the first pixels includes a first contact, each of the second pixels includes a second contact, each of the third pixels includes a third contact, and each of the fourth pixels includes a fourth contact. The first contacts are aligned with one another in a row direction and a column direction, the second contacts are aligned with one another in the row direction and the column direction, the third contacts are aligned with one another in the row direction and the column direction, and the fourth contacts are aligned with one another in the row direction and the column direction. The first contacts are connected to a same first drive line, the second contacts are connected to a same second drive line, the third contacts are connected to a same third drive line, and the fourth contacts are connected to a same fourth drive line. The normal pixels and the first phase difference detection pixel and the second phase difference detection pixel are red pixels, green pixels, or blue pixels according to red, green, and blue color filters. An array pattern of the pixel groups is a Bayer array pattern. The first phase difference detection pixel and the second phase difference detection pixel are the green pixels, and the first phase difference detection pixel is included in a mixed pixel group with normal pixels that are the blue pixels and the second phase difference detection pixel is included in another mixed pixel group with normal pixels that are the green pixels.

A second imaging apparatus according to an aspect of the present disclosure is an imaging apparatus comprising a pixel array unit including a plurality of pixel groups, each of the plurality of pixel groups being one of i) a normal pixel group including only normal pixels, or ii) a mixed pixel group including at least one normal pixel and a first phase difference detection pixel that is partially shielded from incident light. For each normal pixel group, the normal pixels receive light transmitted through a same colored color filter. For each mixed pixel group, the first phase difference detection pixel has a single corresponding on-chip lens.

The second imaging apparatus according to the aspect of the present disclosure includes that each pixel group includes four pixels arranged in a 2×2 array. Each mixed pixel group includes a second phase difference detection pixel that is partially shielded from incident light. For each mixed pixel group, the first phase difference detection pixel and the second phase difference detection pixel are diagonal to one another and have a same exposure time period. For each mixed pixel group, the first and second phase difference detection pixels are partially shielded on left areas or right areas as viewed from a light incident side. The plurality of pixel groups are arranged in a matrix, and the mixed pixel groups are arranged at predetermined intervals in a row direction and a column direction. Some of the mixed pixel groups include first and second phase difference detection pixels shielded on the left areas, and others of the mixed pixel groups include first and second phase difference detection pixels shielded on the right areas.

An electronic device according to an aspect of the present disclosure is an electronic device comprising a solid-state imaging apparatus that includes a pixel array unit including a plurality of pixel groups, each of the plurality of pixel groups being one of i) a normal pixel group including only normal pixels, or ii) a mixed pixel group including at least one normal pixel and at least one phase difference detection pixel. For each normal pixel group, the normal pixels receive light transmitted through a same colored color filter. For each mixed pixel group, the at least one phase difference detection pixel shares an on-chip lens with at least one other phase difference detection pixel and receives light transmitted through a same colored color filter as the at least one other phase difference detection pixel. The electronic device includes a control unit that performs auto-focus control based on output of the at least one phase difference detection pixel in each mixed pixel group.

The electronic device according to the aspect of the present disclosure may include one or more of the features of the first and/or second imaging apparatuses.

Advantageous Effects of Invention

According to the aspects of the present disclosure, more suitable phase difference pixels can be provided.

Note that the advantageous effect described here may not be limited, and the advantageous effect may be any of the advantageous effects described in the present disclosure.

BRIEF DESCRIPTION OF DRAWINGS

FIG. 26 depicts a configuration of arranging light-shielding pixels in the pixel group in the case of two types of exposure.

DESCRIPTION OF EMBODIMENTS

Hereinafter, embodiments of a technique (present technique) according to the present disclosure will be described with reference to the drawings. Note that the embodiments will be described in the following order.
1. Configuration of Solid-State Imaging Apparatus
2. Embodiments of the Present Technique
(1) First Embodiment: 2×1 OCL structure
(2) Second Embodiment: Structure of Light-Shielding Pixels
(3) Third Embodiment: Manufacturing Method of CF
(4) Fourth Embodiment: Other Examples of Structure
3. Modifications
4. Configuration of Electronic Device
5. Usage Examples of Solid-State Imaging Apparatus
6. Example of Application to Movable Body 1. Configuration of Solid-State Imaging Apparatus (Configuration Example of Solid-State Imaging Apparatus)

Figure 1:
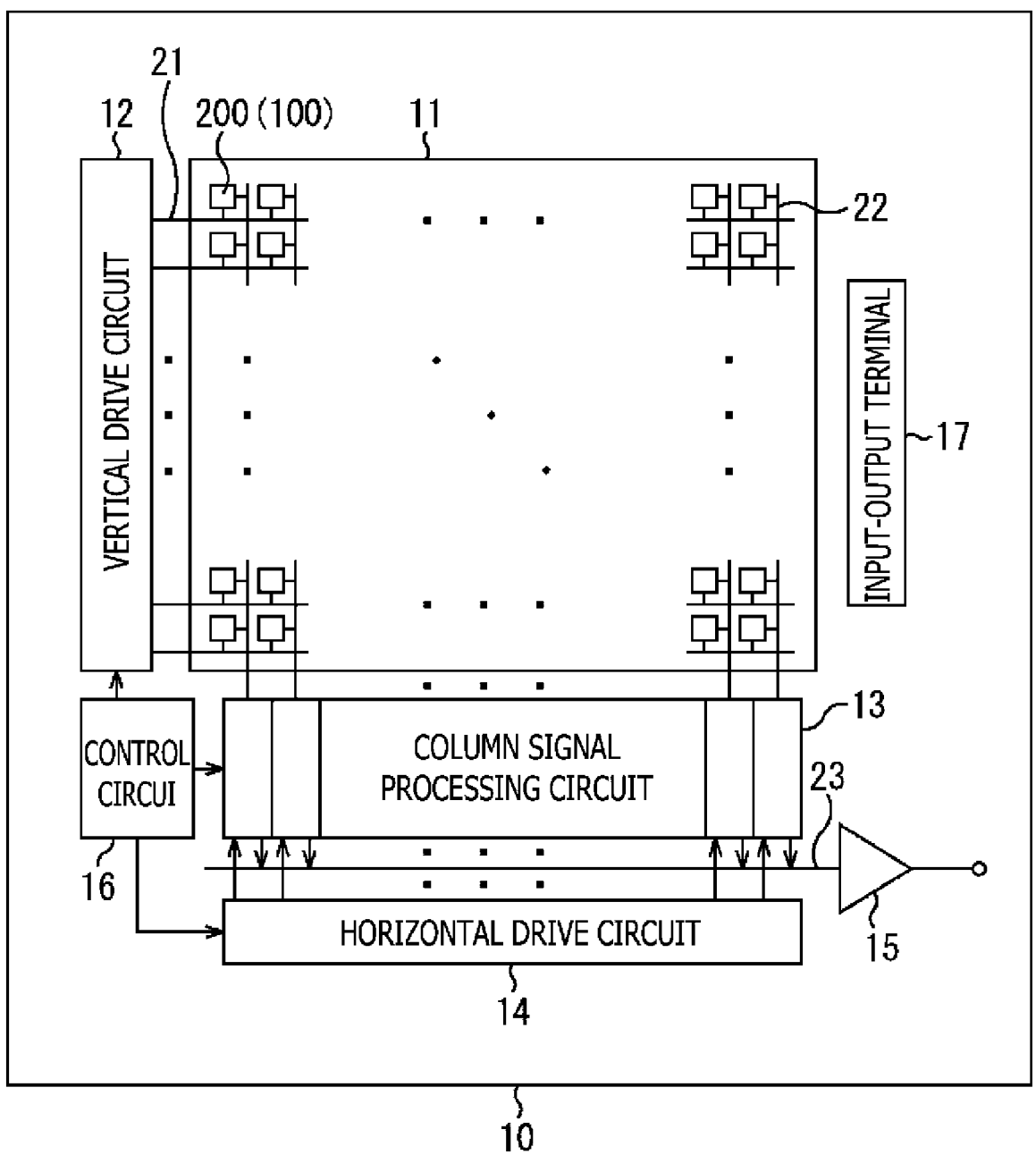
FIG. 1 is a block diagram illustrating a configuration example of an embodiment of a solid-state imaging apparatus according to a technique of the present disclosure.

FIG. 1 is a block diagram illustrating a configuration example of an embodiment of a solid-state imaging apparatus according to the technique of the present disclosure.

A CMOS image sensor 10 of FIG. 1 is an example of a solid-state imaging apparatus using a CMOS (Complementary Metal Oxide Semiconductor). The CMOS image sensor 10 receives incident light (image light) from a subject through an optical lens system (not illustrated) and converts an amount of incident light imaged on an imaging surface into electrical signals on a pixel-by-pixel basis to output the electrical signals as pixel signals.

In FIG. 1, the CMOS image sensor 10 includes a pixel array unit 11, a vertical drive circuit 12, column signal processing circuits 13, a horizontal drive circuit 14, an output circuit 15, a control circuit 16, and an input-output terminal 17.

A plurality of pixel groups 200 are two-dimensionally (in a matrix) arranged in the pixel array unit 11. The pixel group 200 includes four pixels 100 (four (2×2) pixels) of the same color.

The four pixels 100 of the same color of each pixel group 200 include red (R) pixels, green (G) pixels, or blue (B) pixels according to red (R), green (G), or blue (B) color filters. In addition, the pixel group 200 is configured as shared pixels in which a pixel circuit is shared by the four pixels 100 of the same color.

In the pixel group 200, each pixel 100 of the same color includes a photodiode (PD) as a photoelectric conversion element and a transfer transistor TR-Tr. Furthermore, in the pixel group 200, a reset transistor RST-Tr, an amplifier transistor AMP-Tr, and a selection transistor SEL-Tr as pixel circuits are shared by the four pixels 100 of the same color.

Although described in detail later, phase difference pixels as pixels 100 included in the pixel groups 200 are scattered (in a repeated pattern) and arranged in the pixel array unit 11. In addition, the phase difference pixels are pixels for phase difference detection and are also called PDAF (Phase Detection Auto Focus) pixels or the like.

The vertical drive circuit 12 includes, for example, a shift register. The vertical drive circuit 12 selects a predetermined pixel drive line 21 and supplies a drive signal (pulse) for driving the pixels 100 or the pixel groups 200 to the selected pixel drive line 21 to drive the pixels 100 or the pixel groups 200 on a row-by-row basis.

More specifically, the vertical drive circuit 12 sequentially selects and scans each pixel 100 or each pixel group 200 of the pixel array unit 11 in the vertical direction on a row-by-row basis and supplies a pixel signal based on charge (signal charge) generated according to the amount of received light in the photodiode of each pixel 100 to the column signal processing circuit 13 through a vertical signal line 22.

The column signal processing circuit 13 is arranged for each column of the pixel groups 200. For each pixel column, the column signal processing circuit 13 applies signal processing, such as noise removal, to the signals output from the pixel groups 200 of one row. For example, the column signal processing circuit 13 executes signal processing, such as correlated double sampling (CDS) for removing fixed pattern noise specific to pixels and AD (Analog Digital) conversion.

The horizontal drive circuit 14 includes, for example, a shift register and sequentially outputs horizontal scanning pulses to successively select each of the column signal processing circuits 13 to cause each of the column signal processing circuits 13 to output the pixel signals to a horizontal signal line 23.

The output circuit 15 applies signal processing to the signals sequentially supplied from each of the column signal processing circuits 13 through the horizontal signal line 23 and outputs the signals. Note that the output circuit 15 may, for example, just perform buffering or may perform black level adjustment, column variation correction, various types of digital signal processing, and the like.

The control circuit 16 controls operation of each component of the CMOS image sensor 10.

In addition, the control circuit 16 generates clock signals or control signals as standards for the operation of the vertical drive circuit 12, the column signal processing circuits 13, the horizontal drive circuit 14, and the like on the basis of a vertical synchronization signal, a horizontal synchronization signal, and a master clock signal. The control circuit 16 outputs the generated clock signals or control signals to the vertical drive circuit 12, the column signal processing circuits 13, the horizontal drive circuit 14, and the like.

The input-output terminal 17 exchanges signals with the outside.

The CMOS image sensor 10 of FIG. 1 configured in this way is a CMOS image sensor of a so-called column AD system in which the column signal processing circuit 13 that executes the CDS processing and the AD conversion processing is arranged for each pixel column. In addition, the CMOS image sensor 10 of FIG. 1 can be, for example, a back-illuminated CMOS image sensor.

2. Embodiments of the Present Technique

(1) First Embodiment (Plane Layout of Pixels)

Figure 2:
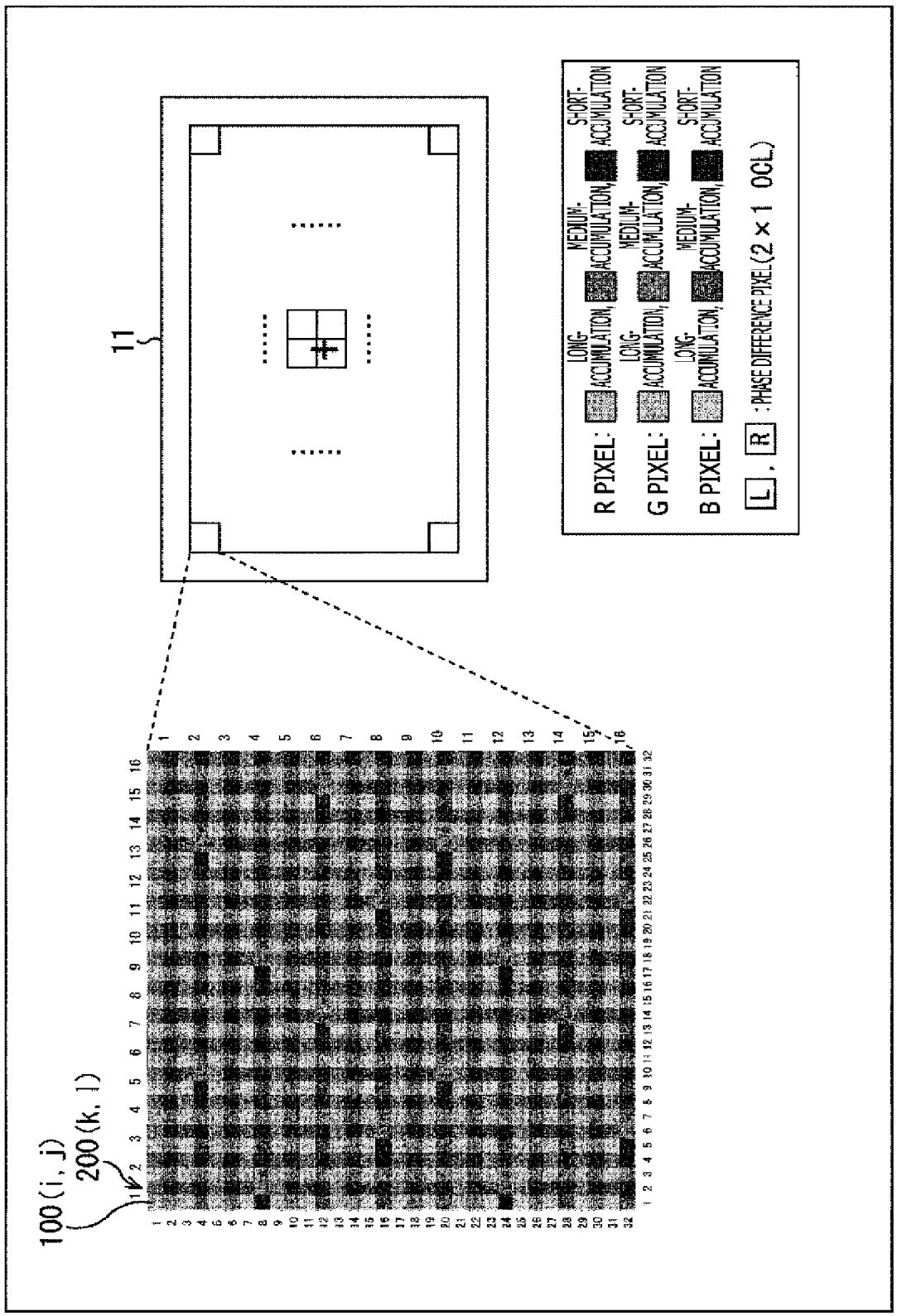
FIG. 2 depicts a plane layout of a plurality of pixels arranged in a pixel array unit.

FIG. 2 depicts a plane layout of the plurality of pixels 100 arranged in the pixel array unit 11 of FIG. 1.

FIG. 2 illustrates the pixels 100 in an area of 32 rows and 32 columns arranged in an upper left area as viewed from the light incident side among the plurality of pixels 100 two-dimensionally arranged in the pixel array unit 11.

Note that in FIG. 2, row i and column j of the pixels 100 arranged in the pixel array unit 11 are described as pixel 100 (i, j), and row k and column l of the pixel groups 200 including neighboring four pixels (2×2 pixels) of the same color are described as pixel group 200 (k, l). In the plane layout of FIG. 2, to facilitate the understanding, the row numbers and the column numbers corresponding to row i and column j of the pixels 100 are described in left and lower areas, and the row numbers and the column numbers corresponding to row k and column l of the pixel groups 200 are described in right and upper areas.

Furthermore, in the following description, an R pixel represents a pixel in which the red (R) color filter is provided as a color filter, and charge corresponding to the light of a red (R) component is obtained from the light transmitted through the R color filter. Furthermore, a G pixel represents a pixel in which charge corresponding to the light of a green (G) component is obtained from the light transmitted through the green (G) color filter. Furthermore, a B pixel represents a pixel in which charge corresponding to the light of a blue (B) component is obtained from the light transmitted through the blue (B) color filter.

For example, when the arrangement position of the upper left pixel 100 is expressed as pixel 100 (1, 1) in the pixel array of 32 rows and 32 columns (pixel group array of 16 rows and 16 columns) in the pixel array unit 11 illustrated in FIG. 2, R pixel group 200 (1, 2) includes four red (R) pixels (shared pixels) including R pixel 100 (1, 3), R pixel 100 (1, 4), R pixel 100 (2, 3), and R pixel 100 (2, 4).

In addition, G pixel group 200 (1, 1) includes four green (G) pixels (shared pixels) including G pixel 100 (1, 1), G pixel 100 (1, 2), G pixel 100 (2, 1), and G pixel 100 (2, 2). Furthermore, G pixel group 200 (2, 2) includes four green (G) pixels (shared pixels) including G pixel 100 (3, 3), G pixel 100 (3, 4), G pixel 100 (4, 3), and G pixel 100 (4, 4).

In addition, B pixel group 200 (2, 1) includes four blue (B) pixels (shared pixels) including B pixel 100 (3, 1), B pixel 100 (3, 2), B pixel 100 (4, 1), and B pixel 100 (4, 2).

In this way, the R pixel groups 200 each including four red (R) pixels (2×2 pixels), the G pixel groups 200 each including four green (G) pixels (2×2 pixels), and the B pixel groups 200 each including four blue (B) pixels (2×2 pixels) are systematically arranged in the pixel array unit 11 to form a Bayer array.

Note that the Bayer array is an array pattern including the G pixels of green (G) arranged in a checkered pattern and including the R pixels of red (R) and the B pixels of blue (B) alternately arranged column by column in the remaining part.

In the pixel groups 200 arranged in the Bayer array, the exposure time period is adjusted for each pixel 100. Here, in a case where the exposure time period is adjusted in three stages of T1, T2, and T3 (T1>T2>T3), a long exposure time period (T1) will be referred to as a long-accumulation exposure time period, a short exposure time period (T3) will be referred to as a short-accumulation exposure time period, and an exposure time period (T2) with a length between them will be referred to as a medium-accumulation exposure time period.

For example, in R pixel group 200 (1, 2), R pixel (1, 3) is a long-accumulation pixel (L) with the long-accumulation exposure time period (T1), R pixel (1, 4) and R pixel (2, 3) are medium-accumulation pixels (M) with the medium-accumulation exposure time period (T2), and R pixel (2, 4) is a short-accumulation pixel (S) with the short-accumulation exposure time period (T3).

Furthermore, since the four R pixels 100 of the R pixel group 200 are configured as shared pixels sharing the pixel circuit, pixel signals (analog signals) obtained from the four R pixels 100 are added in a floating diffusion area (FD: Floating Diffusion), and a signal of R component (R pixel signal) is generated.

In this case, the R pixel group 200 includes a long-accumulation pixel (L), medium-accumulation pixels (M), and a short-accumulation pixel (S) as the R pixels 100 configuring the shared pixels, and the R pixel signal is a pixel signal of HDR (High Dynamic Range) obtained by adding (pixel addition) a long-accumulation pixel signal, medium-accumulation pixel signals, and a short-accumulation pixel signal.

Furthermore, for example, G pixel 100 (1, 1) is a long-accumulation pixel (L), G pixel 100 (1, 2) and G pixel 100 (2, 1) are medium-accumulation pixels (M), and G pixel 100 (2, 2) is a short-accumulation pixel (S) in G pixel group 200 (1, 1). Similarly, G pixel 100 (3, 3) is a long-accumulation pixel (L), G pixel 100 (3, 4) and G pixel 100 (4, 3) are medium-accumulation pixels (M), and pixel 100 (4, 4) is a short-accumulation pixel (S) in G pixel group 200 (2, 2).

Furthermore, since the four G pixels 100 of the G pixel group 200 are configured as shared pixels, pixel signals obtained from the four G pixels 100 are added, and a G pixel signal is generated. In this case, the G pixel group 200 includes a long-accumulation pixel (L), medium-accumulation pixels (M), and a short-accumulation pixel (S) as the G pixels 100 configuring the shared pixels, and the G pixel signal is a pixel signal of HDR obtained by adding a long-accumulation pixel signal, medium-accumulation pixel signals, and a short-accumulation pixel signal.

In addition, for example, B pixel 100 (3, 1) is a long-accumulation pixel (L), B pixel 100 (3, 2) and B pixel 100 (4, 1) are medium-accumulation pixels (M), and B pixel 100 (4, 2) is a short-accumulation pixel (S) in B pixel group 200 (2, 1).

Furthermore, since the four B pixels 100 of the B pixel group 200 are configured as shared pixels, pixel signals obtained from the four B pixels 100 are added, and a B pixel signal is generated. In this case, the B pixel group 200 includes a long-accumulation pixel (L), medium-accumulation pixels (M), and a short-accumulation pixel (S) as the B pixels 100 configuring the shared pixels, and the B pixel signal is a pixel signal of HDR obtained by adding a long-accumulation pixel signal, medium-accumulation pixel signals, and a short-accumulation pixel signal.

In this way, the R pixel signal of HDR as a sum of the pixel signals of four pixels is obtained from the R pixel group 200 among the pixel groups 200 arranged in the Bayer array. The G pixel signal of HDR as a sum of the pixel signals of four pixels is obtained from the G pixel group 200, and the B pixel signal of HDR as a sum of the pixel signals of four pixels is obtained from the B pixel group 200.

Note that in the following description, the long-accumulation pixels (L), the medium-accumulation pixels (M), and the short-accumulation pixels (S) are distinguished by subscripts "L," "M," and "S" in the R pixels 100, the G pixels 100, and the B pixels 100. For example, in the R pixels 100, the long-accumulation pixels (L) will be described as $R_L$ pixels 100, the medium-accumulation pixels (M) will be described as $R_M$ pixels 100, and the short-accumulation pixels (S) will be described as $R_S$ pixels 100.

Here, focusing on an area provided with B pixel group 200 (2, 5) and G pixel group 200 (2, 6) in the pixel array unit 11 of FIG. 2, B pixel group (2, 5) is supposed to include only the B pixels 100. However, $G_M$ pixel 100 (4, 10) is arranged in place of $B_S$ pixel 100 (4, 10) here. Three pixels of the four pixels are the B pixels 100, and the remaining one pixel is the G pixel 100.

Figure 3:
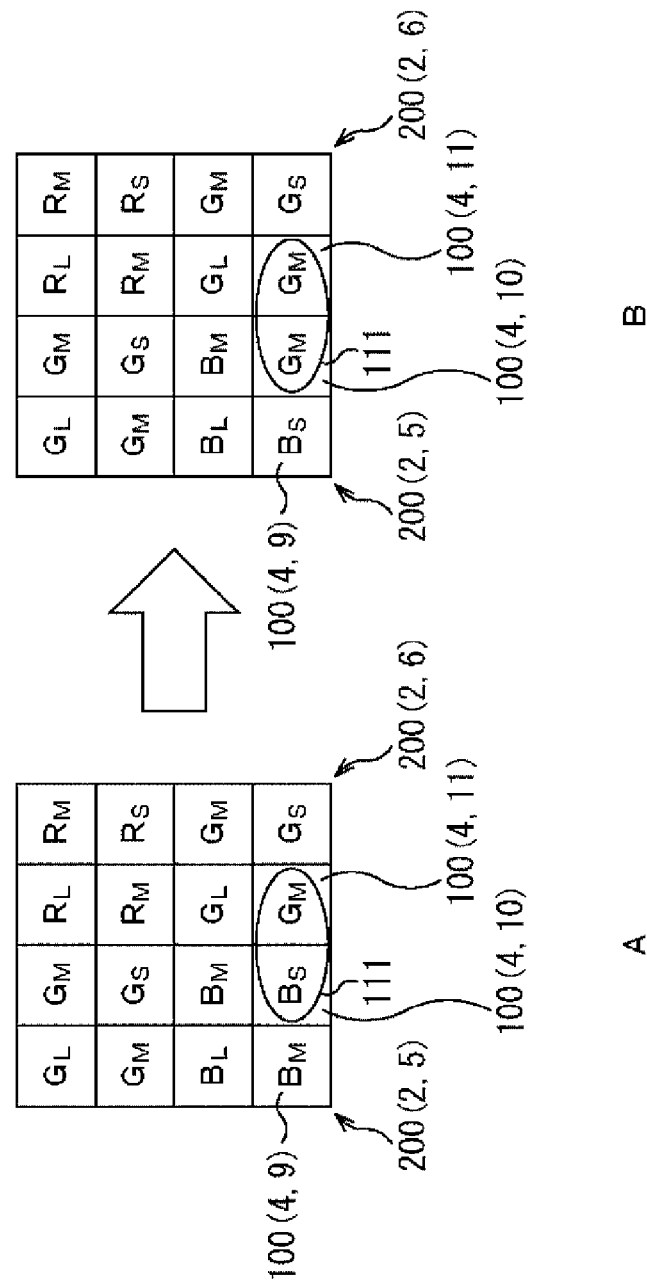
FIG. 3 depicts a configuration of a case of arranging phase difference pixels in adjacent pixel groups.

More specifically, as illustrated in FIG. 3, in a case where pixels 100 for phase difference detection (hereinafter, also described as phase difference pixels 100L and 100R) are arranged for the pixel groups 200 arranged in the Bayer array, a structure of embedding a plurality of photoelectric conversion elements, such as photodiodes, in one on-chip lens (OCL) 111 is adopted as the structure of the phase difference pixels 100L and 100R in the illustrated case.

In this case, the exposure time periods of two pixels arranged in the row direction are different in the four pixels of the pixel group 200, and it is difficult to provide the on-chip lens 111 on these two pixels (2×1 pixels) due to the characteristics of the phase difference pixels. For example, in the four pixels (2×2 pixels) of the pixel group 200, the exposure time periods of the long-accumulation pixel (L) and the medium-accumulation pixel (M) are different in the first row, and the exposure time periods of the medium-accumulation pixel (M) and the short-accumulation pixel (S) are different in the second row.

Therefore, to provide the on-chip lens 111 on the two pixels (2×1 pixels) in the row direction, the on-chip lens 111 can be arranged across the left and right pixel groups 200 adjacent to each other. The left and right pixels 100 adjacent to each other including one of two photodiodes formed on the on-chip lens 111 can include the color filter of the same color, and the exposure time period can be the same.

Here, in a case where one on-chip lens 111 is provided for the photodiode of $B_S$ pixel 100 (4, 10) included in B pixel group 200 (2, 5) and the photodiode of $G_M$ pixel 100 (4, 11) included in G pixel group 200 (2, 6) as illustrated in A of FIG. 3, the structure is as illustrated in B of FIG. 3.

More specifically, the color filter of $B_S$ pixel 100 (4, 10) included in B pixel group 200 (2, 5) is set to the G color filter instead of the B color filter at the manufacturing, and $G_M$ pixel 100 (4, 10) is formed. Furthermore, although $B_S$ pixel 100 (4, 10) is a short-accumulation pixel (S), the arrangement of a contact of $G_M$ pixel 100 (4, 10) is changed in $G_M$ pixel 100 (4, 10) here, and the exposure time period is set to the medium-accumulation exposure time period to form a medium-accumulation pixel (M).

As a result, $G_M$ pixel 100 (4, 10) and $G_M$ pixel 100 (4, 11) are provided as the pixels 100 including the photodiodes provided on one on-chip lens 111, and the $G_M$ pixels 100 include the same G color filter and have the same medium-accumulation exposure time period. Therefore, $G_M$ pixel 100 (4, 10) can be configured as phase difference pixel 100L (4, 10), and $G_M$ pixel 100 (4, 11) can be configured as phase difference pixel 100R (4, 11). As a result, the phase difference between two images can be detected on the basis of the pixel signals obtained from the phase difference pixels 100L and 100R.

Although there is no short-accumulation pixel (S) when lower right $B_S$ pixel 100 (4, 10) is changed to $G_M$ pixel 100 (4, 10) in B pixel group 200 (2, 5), lower left $B_M$ pixel 100 (4, 9) is changed to $B_S$ pixel 100 (4, 9) for example, and the four pixels include the short-accumulation pixel (S) along with the long-accumulation pixel (L) and the medium-accumulation pixels (M).

Furthermore, in the pixel array unit 11 of FIG. 2, B pixel group 200 (2, 13) and G pixel group 200 (2, 14), B pixel group 200 (4, 1) and G pixel group 200 (4, 2), B pixel group 200 (4, 9) and G pixel group 200 (4, 10), B pixel group 200 (6, 7) and G pixel group 200 (6, 8), B pixel group 200 (6, 15) and G pixel group 200 (6, 16), B pixel group 200 (8, 3) and G pixel group 200 (8, 4), and B pixel group 200 (8, 11) and G pixel group 200 (8, 12) are configured similarly to B pixel group 200 (2, 5) and G pixel group 200 (2, 6), and the phase difference pixel 100L and the phase difference pixel 100R are included.

Similarly, in the pixel array unit 11 of FIG. 2, B pixel group 200 (10, 5) and G pixel group 200 (10, 6), B pixel group 200 (10, 13) and G pixel group 200 (10, 14), B pixel group 200 (12, 1) and G pixel group 200 (12, 2), B pixel group 200 (12, 9) and G pixel group 200 (12, 10), B pixel group 200 (14, 7) and G pixel group 200 (14, 8), B pixel group 200 (14, 15) and G pixel group 200 (14, 16), B pixel group 200 (16, 3) and G pixel group 200 (16, 4), and B pixel group 200 (16, 11) and G pixel group 200 (16, 12) are configured similarly to B pixel group 200 (2, 5) and G pixel group 200 (2, 6), and the phase difference pixel 100L and the phase difference pixel 100R are included.

In this way, the phase difference pixels 100L included in the B pixel groups 200 and the phase difference pixels 100R included in the G pixel groups 200 are systematically arranged at predetermined pixel intervals in the row direction and the column direction in the pixel array unit 11 of FIG. 2. In view of FIGS. 2 and 3, it should be understood that the pixel array unit 11 may include normal pixel groups and mixed pixel groups. Normal pixel groups may be pixel groups that include only normal pixels (e.g., a 2×2 array of four pixels receiving light through a same colored color filter). Mixed pixel groups may be pixel groups that include at least one normal pixel (e.g., 100 (4,9)) and at least one phase difference detection pixel (e.g., 100(4,10)). In addition, for each mixed pixel group, the at least one phase difference detection pixel shares an on-chip lens 111 with at least one other phase difference detection pixel and receives light transmitted through a same colored color filter as the at least one other phase difference detection pixel.

(Structure of Cross Section of Pixels)

Figure 4:
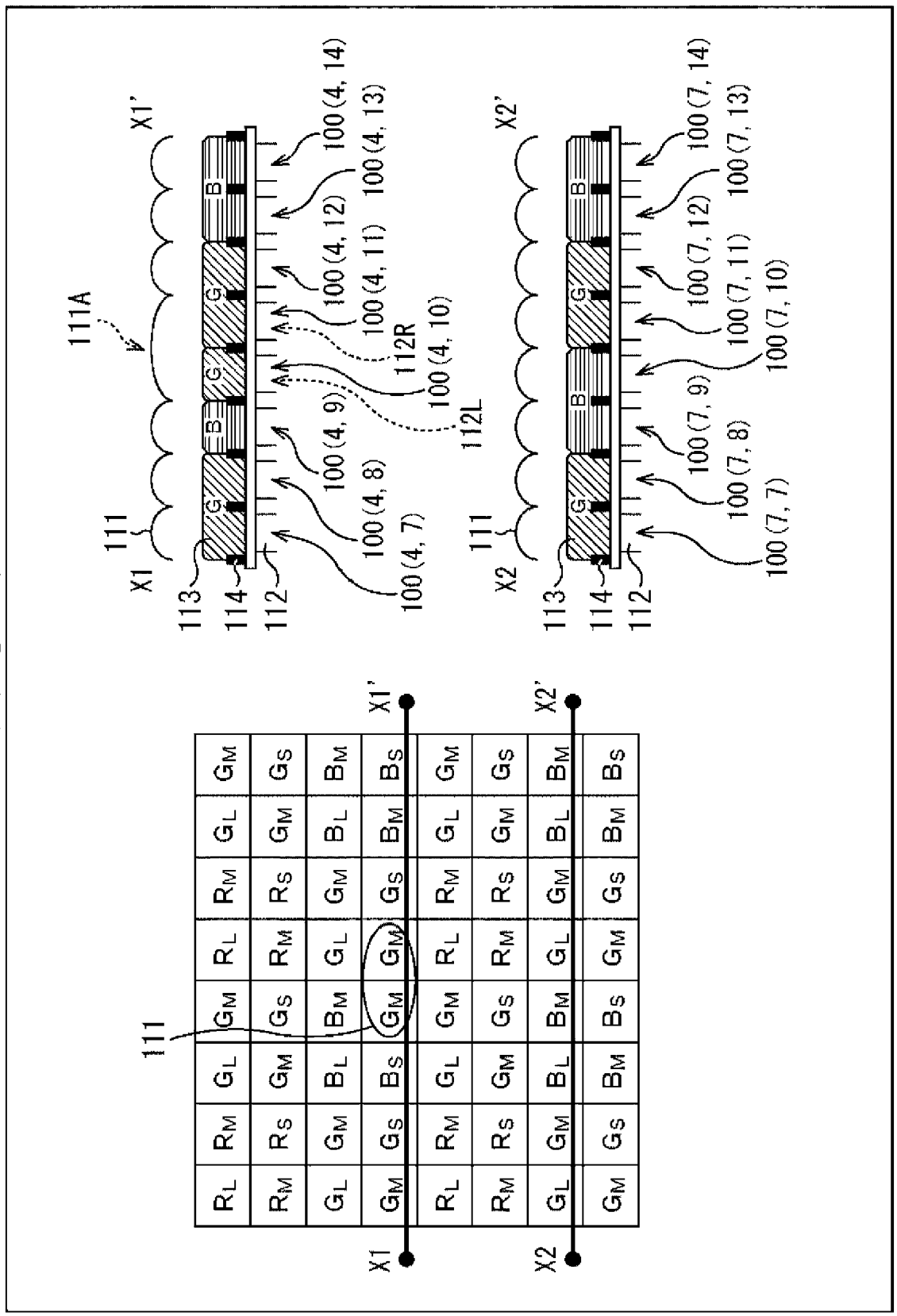
FIG. 4 is a cross-sectional view illustrating a structure of the plurality of pixels arranged in the pixel array unit.

FIG. 4 is a cross-sectional view illustrating a structure of the plurality of pixels 100 arranged in the pixel array unit 11 of FIG. 2.

FIG. 4 illustrates an X1-X1' cross section of the pixels 100 of the fourth row as a cross section of the pixel groups 200 including the phase difference pixels 100L and 100R. FIG. 4 also illustrates an X2-X2' cross section of the pixels 100 of the seventh row as a cross section of the pixel groups 200 not including the phase difference pixels 100L and 100R.

Here, when the arrangement position of the upper left pixel 100 is expressed as pixel (1, 7), the target of the X1-X1' cross section includes $G_M$ pixel 100 (4, 7), $G_S$ pixel 100 (4, 8), $B_S$ pixel 100 (4, 9), $G_M$ pixel 100 (4, 10), $G_M$ pixel 100 (4, 11), $G_S$ pixel 100 (4, 12), $B_M$ pixel 100 (4, 13), and $B_S$ pixel 100 (4, 14).

Here, $G_M$ pixel 100 (4, 7) and $G_S$ pixel 100 (4, 8) are included in G pixel group 200 (2, 4), and $B_S$ pixel 100 (4, 9) and $G_M$ pixel 100 (4, 10) are included in B pixel group 200

(2, 5). In addition, $G_M$ pixel 100 (4, 11) and $G_S$ pixel 100 (4, 12) are included in G pixel group 200 (2, 6), and $B_M$ pixel 100 (4, 13) and $B_S$ pixel 100 (4, 14) are included in B pixel group 200 (2, 7).

As illustrated in the X1-X1' cross section of FIG. 4, a photodiode 112 is formed just below the on-chip lens 111 in each pixel 100, and a color filter 113 and a light-shielding portion 114 are provided in an area between the on-chip lens 111 and a silicon layer provided with the photodiode 112.

G color filters 113 are formed in $G_M$ pixel 100 (4, 7) and $G_S$ pixel 100 (4, 8), in $G_M$ pixel 100 (4, 10), and in $G_M$ pixel 100 (4, 11) and $G_S$ pixel 100 (4, 12). B color filters 113 are formed in $B_S$ pixel 100 (4, 9) and in $B_M$ pixel 100 (4, 13) and $B_S$ pixel 100 (4, 14).

That is, although the B color filter 113 is supposed to be formed to configure the B pixel 100 because $G_M$ pixel 100 (4, 10) is included in B pixel group 200 (2, 5), the G color filter 113 is formed here to configure the G pixel 100.

As a result, a photodiode 112L provided on $G_M$ pixel 100 (4, 10) and a photodiode 112R provided on $G_M$ pixel 100 (4, 11) are provided for one on-chip lens 111A. $G_M$ pixel 100 (4, 10) is configured as phase difference pixel 100L (4, 10), and $G_M$ pixel 100 (4, 11) is configured as phase difference pixel 100R (4, 11). In this case, both of $G_M$ pixel 100 (4, 10) and $G_M$ pixel 100 (4, 11) are G pixels 100 including the G color filters 113 and are medium-accumulation pixels (M) with the medium-accumulation exposure time period.

Note that the light-shielding portion 114 provided in a lattice square shape as viewed from the light incident side shields $G_M$ pixel 100 (4, 7) in a square shape from the adjacent pixels. The light-shielding portion 114 is formed by metal such as tungsten (W) and aluminum (Al).

The light-shielding portions 114 provided in a square lattice shape also shield $G_S$ pixel 100 (4, 8), $B_S$ pixel 100 (4, 9), $G_M$ pixel 100 (4, 10), $G_M$ pixel 100 (4, 11), $G_S$ pixel 100 (4, 12), $B_M$ pixel 100 (4, 13), and $B_S$ pixel 100 (4, 14) from the adjacent pixels as in $G_M$ pixel 100 (4, 7).

Meanwhile, the target of the X2-X2' cross section is $G_L$ pixel 100 (7, 7), $G_M$ pixel 100 (7, 8), $B_L$ pixel 100 (7, 9), $B_M$ pixel 100 (7, 10), $G_L$ pixel 100 (7, 11), $G_M$ pixel 100 (7, 12), $B_L$ pixel 100 (7, 13), and $B_M$ pixel 100 (7, 14).

The G color filters 113 are formed in $G_L$ pixel 100 (7, 7) and $G_M$ pixel 100 (7, 8) and in $G_L$ pixel 100 (7, 11) and $G_M$ pixel 100 (7, 12). The B color filters 113 are formed in $B_L$ pixel 100 (7, 9) and $B_M$ pixel 100 (7, 10) and in $B_L$ pixel 100 (7, 13) and $B_M$ pixel 100 (7, 14).

The light-shielding portions 114 provided in a square lattice shape as viewed from the light incident side shield $G_L$ pixel 100 (7, 7), $G_M$ pixel 100 (7, 8), $B_L$ pixel 100 (7, 9), $B_M$ pixel 100 (7, 10), $G_L$ pixel 100 (7, 11), $G_M$ pixel 100 (7, 12), $B_L$ pixel 100 (7, 13), and $B_M$ pixel 100 (7, 14) from the adjacent pixels.

(Example of Reading of Pixels)

Next, an example of reading of the pixels 100 included in the pixel groups 200 arranged in the pixel array unit 11 will be described with reference to FIGS. 5 to 7.

Figure 5:
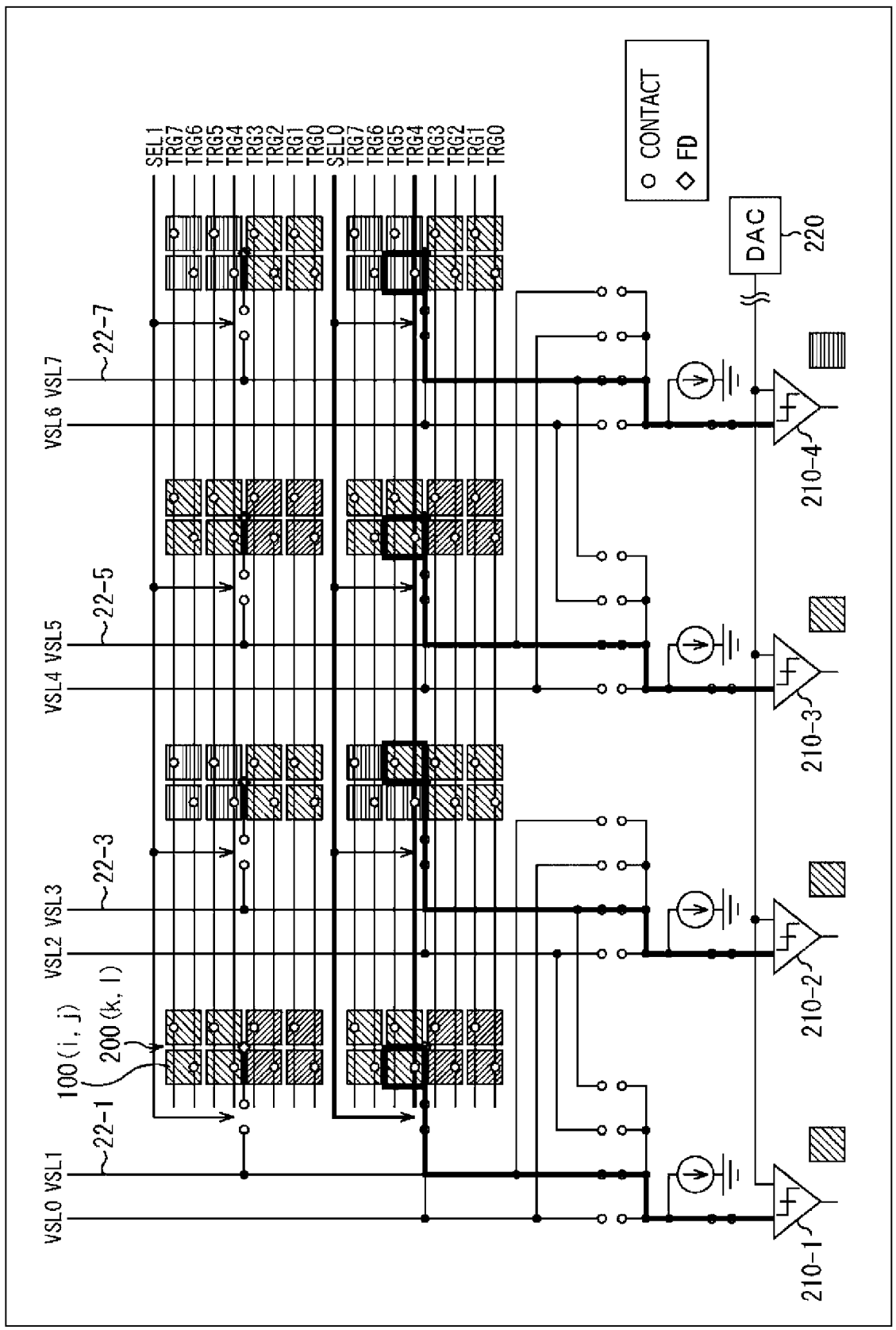
FIG. 5 is a circuit diagram illustrating a first connection mode of four pixels included in the pixel group.
Figure 6:
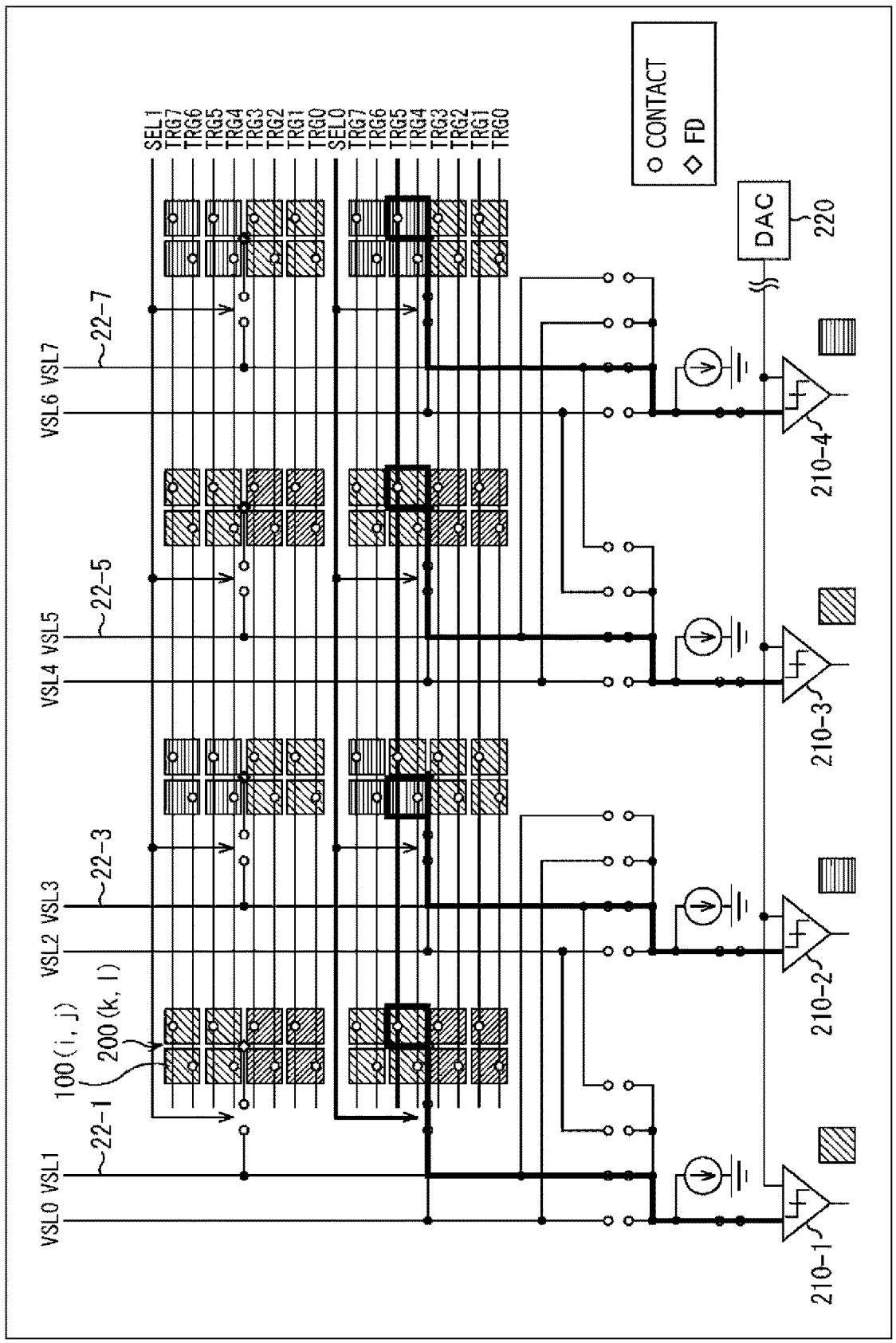
FIG. 6 is a circuit diagram illustrating a second connection mode of four pixels included in the pixel group.
Figure 7:
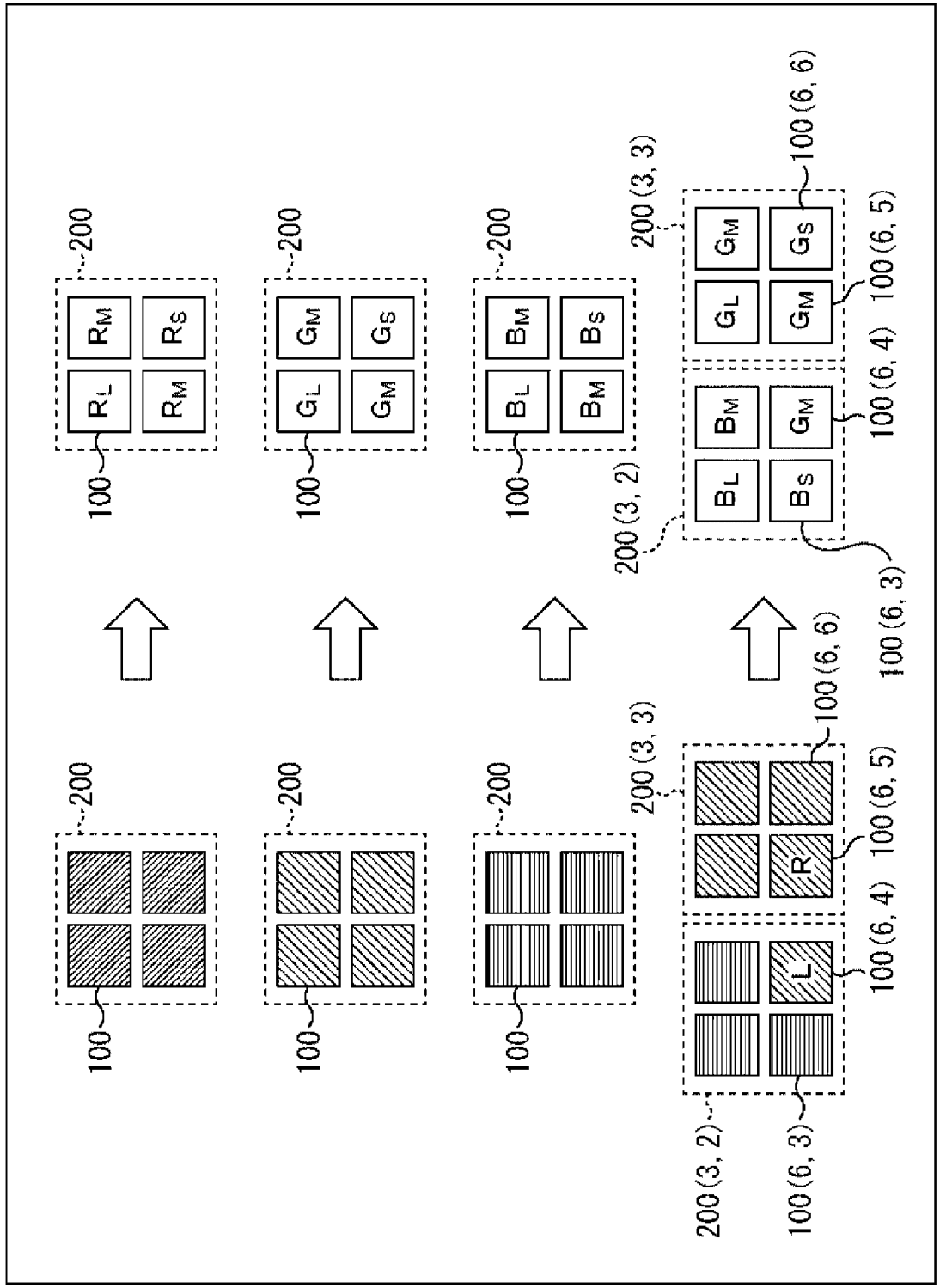
FIG. 7 is a diagram describing exposure time periods of each pixel in FIGS. 5 and 6.

Although the four pixels (2×2 pixels) of the pixel group 200 are not distinguished in FIGS. 5 and 6, each pixel of the four pixels (2×2 pixels) can actually be, for example, one of the long-accumulation pixel (L), the medium-accumulation pixel (M), and the short-accumulation pixel (S) as illustrated in FIG. 7.

In addition, a circle described on the pixel 100 indicates a contact C, and a rhombus described in every four pixels indicates the floating diffusion area FD in FIGS. 5 and 6. In addition, a drive line connected to each contact C is included in the pixel drive lines 21 (FIG. 1) connected to the vertical drive circuit 12 (FIG. 1).

FIG. 5 illustrates an area of part of the pixel area provided with the pixels 100 in the pixel array unit 11 (FIG. 2), and four pixels 100 configure the pixel group 200.

In FIG. 5, the four pixels 100 of the pixel group 200 share the floating diffusion area FD. In addition, drive signals (TRG, SEL) for the transfer transistors TR-Tr and the selection transistors SEL-Tr in FIG. 5 are supplied from the vertical drive circuit 12 (FIG. 1).

In the pixel group 200, each pixel 100 includes the transfer transistor TR-Tr in addition to the photodiode 112. In each pixel 100, the transfer transistor TR-Tr performs an operation of ON/OFF according to the drive signal TRG input to the gate, and charge (signal charge) photoelectrically converted by the photodiode 112 is transferred to the floating diffusion area FD shared by four pixels. In this regard, the drive signal TRG here is controlled according to the exposure time period of each pixel 100.

The floating diffusion area FD is formed at a connection point of the transfer transistor TR-Tr of each pixel 100 of the pixel group 200 and the reset transistor RST-Tr as well as the amplifier transistor AMP-Tr shared by the pixel group 200. The reset transistor RST-Tr performs an operation of ON/OFF according to a drive signal RST input to the gate, and charge accumulated in the floating diffusion area FD is discharged.

The floating diffusion area FD has a function of accumulating the charge transferred by the transfer transistor TR-Tr of each pixel 100. The potential of the floating diffusion area FD is modulated according to the amount of accumulated charge. The amplifier transistor AMP-Tr operates as an amplifier in which the potential fluctuation of the floating diffusion area FD connected to the gate is handled as the input signal voltage, and the output signal voltage is output to the vertical signal line (VSL) 22 through the selection transistor SEL-Tr.

The selection transistor SEL-Tr performs an operation of ON/OFF according to the drive signal SEL input to the gate and outputs the voltage signal from the amplifier transistor AMP-Tr to the vertical signal line (VSL) 22.

In this way, the pixel group 200 shares four pixels, and each pixel 100 includes the photodiode 112 and the transfer transistor TR-Tr. In addition, four pixels (shared pixels) share the floating diffusion area FD in the pixel group 200, and the pixel circuits of the shared pixels include shared transistors including the reset transistor RST-Tr, the amplifier transistor AMP-Tr, and the selection transistor SEL-Tr.

Note that in the pixel array unit 11, two pixel groups 200 in the column direction also share the shared transistors including the reset transistor RST-Tr, the amplifier transistor AMP-Tr, and the selection transistor SEL-Tr.

More specifically, when the arrangement position of the upper left pixel 100 is expressed as pixel 100 (1, 1) in the pixel array illustrated in FIG. 5, each pixel group 200 shares the floating diffusion area FD in the pixel groups 200 of the first row and the second row, and the upper and lower pixel groups 200 in the column direction are paired to also share the shared transistors.

For example, G pixel group 200 (1, 1) and R pixel group 200 (2, 1) of the first column are paired, and the reset transistor RST-Tr, the amplifier transistor AMP-Tr, and the selection transistor SEL-Tr are shared transistors.

Here, the transfer transistor TR-Tr in G pixel 100 (1, 1) among the four pixels of G pixel group 200 (1, 1) operates according to drive signal TRG6 input through the contact C, and the charge generated by the photodiode 112 is transferred to the floating diffusion area FD. Similarly, the transfer transistors TR-Tr in G pixel 100 (1, 2), G pixel 100 (2, 1), and G pixel 100 (2, 2) also transfer the charge from the photodiodes 112 to the floating diffusion area FD according to drive signal TRG7, drive signal TRG4, and drive signal TRG5.

In the floating diffusion area FD shared by the four pixels of G pixel group 200 (1, 1), the charge transferred from the photodiodes 112 of G pixel 100 (1, 1), G pixel 100 (1, 2), G pixel 100 (2, 1), and G pixel 100 (2, 2) is added (analog addition), and the voltage according to the added charge is input to the amplifier transistor AMP-Tr. Note that the addition of the charge in the floating diffusion area FD is also called pixel addition or FD addition.

Furthermore, the potential fluctuation of the floating diffusion area FD shared by four pixels is handled as the input signal voltage for the gate in the amplifier transistor AMP-Tr, and the output signal voltage is output to the vertical signal line (VSL1) 22-1 through the selection transistor SEL-Tr.

Note that the shared transistors, such as the amplifier transistor AMP-Tr and the selection transistor SEL-Tr, are shared by R pixel group 200 (2, 1) paired with G pixel group 200 (1, 1).

In addition, a set of B pixel group 200 (1, 2) and G pixel group 200 (2, 2) of the second column, a set of G pixel group 200 (1, 3) and R pixel group 200 (2, 3) of the third column, and a set of B pixel group 200 (1, 4) and G pixel group 200 (2, 4) of the fourth column in the pixel groups 200 of the first row and the second row are configured similarly to G pixel group 200 (1, 1) and R pixel group 200 (2, 1) of the first column.

In addition, the pixel groups 200 of the third row and the fourth row are configured similarly to the pixel groups 200 of the first row and the second row. The floating diffusion area FD is shared in each pixel group 200, and the upper and lower pixel groups 200 in the column direction are paired to also share the shared transistors.

Here, in FIG. 5, drive signal SEL1 enters an L level, and the selection transistor SEL-Tr shared by the pixel groups 200 of the first row and the second row enters an off-state. On the other hand, drive signal SEL0 enters an H level, and the selection transistor SEL-Tr shared by the pixel groups 200 of the third row and the fourth row enters an on-state. In this way, the pixel groups 200 of the third row and the fourth row are selected.

In this case, as illustrated in FIG. 5, only drive signal TRG4 of drive signals TRG0 to TRG7 is in the H level, and each transfer transistor TR-Tr of $G_M$ pixel 100 (6, 1) of G pixel group 200 (3, 1) of the first column, $G_M$ pixel 100 (6, 4) of B pixel group 200 (3, 2) of the second column, $G_M$ pixel 100 (6, 5) of G pixel group 200 (3, 3) of the third column, and $B_M$ pixel 100 (6, 7) of B pixel group 200 (3, 4) of the fourth column among the four pixels included in the pixel groups 200 of the third row enters the on-state.

In this way, the charge generated by each photodiode 112 of $G_M$ pixel 100 (6, 1), $G_M$ pixel 100 (6, 4), $G_M$ pixel 100 (6, 5), and $B_M$ pixel 100 (6, 7) surrounded by thick frames in FIG. 5 is transferred to the corresponding floating diffusion area FD. In this case, all $G_M$ pixel 100 (6, 1), $G_M$ pixel 100 (6, 4), $G_M$ pixel 100 (6, 5), and $B_M$ pixel 100 (6, 7) are medium-accumulation pixels (M) and can be driven by the same drive signal TRG4.

As a result, the charge accumulated on the photodiode 112 of $G_M$ pixel 100 (6, 4) configured as phase difference pixel 100L (6, 4) and the charge accumulated on the photodiode 112 of $G_M$ pixel 100 (6, 5) configured as phase difference pixel 100R (6, 5) are read.

Subsequently, as illustrated in FIG. 6, the drive signal TRG in the H level is switched from TRG4 to TRG5, and each transfer transistor TR-Tr of $G_S$ pixel 100 (6, 2) of G pixel group 200 (3, 1) of the first column, $B_S$ pixel 100 (6, 3) of B pixel group 200 (3, 2) of the second column, $G_S$ pixel 100 (6, 6) of G pixel group 200 (3, 3) of the third column, and $B_S$ pixel 100 (6, 8) of B pixel group 200 (3, 4) of the fourth column among the four pixels of the pixel groups 200 of the third row enters the on-state.

In this way, the charge generated by each photodiode 112 of $G_S$ pixel 100 (6, 2), $B_S$ pixel 100 (6, 3), $G_S$ pixel 100 (6, 6), and $B_S$ pixel 100 (6, 8) surrounded by thick frames in FIG. 6 is transferred to the corresponding floating diffusion area FD. In this case, all $G_S$ pixel 100 (6, 2), $B_S$ pixel 100 (6, 3), $G_S$ pixel 100 (6, 6), and the $B_S$ pixel 100 (6, 8) are short-accumulation pixels (S) and can be driven by the same drive signal TRG5.

Although not illustrated, drive signals TRG6 and TRG7 are similarly switched to the H level, and the charge is read from the photodiodes of four pixels included in each pixel group 200 of the third row, and the charge is transferred to the floating diffusion area FD shared by the four pixels. In the floating diffusion area FD, the charge transferred from each of the photodiodes 112 of the four pixels is added, and the voltage according to the added charge is input to the amplifier transistor AMP-Tr.

Furthermore, in the pixel groups 200 of the third row, the potential fluctuations of the floating diffusion areas FD shared by four pixels are the input signal voltages for the gates in the amplifier transistors AMP-Tr, and the output signal voltages are output to the vertical signal lines (VSL1, VSL3, VSL5, VSL7) 22 through the selection transistors SEL-Tr.

Here, the vertical signal line (VSL1) 22-1 is connected to a comparator 210-1 in the column signal processing circuit 13 (FIG. 1). The comparator 210-1 compares a signal voltage (Vx) from the vertical signal line (VSL1) 22-1 input to the comparator 210-1 and a reference voltage (Vref) of a ramp wave (Ramp) from a DAC 220 and outputs an output signal in a level according to the comparison result.

In addition, comparators 210-2 to 210-4 are similar to the comparator 210-1 except that the signal voltage compared with the reference voltage is replaced by the signal voltage from the vertical signal line (VSL3) 22-3, the vertical signal line (VSL5) 22-5, or the vertical signal line (VSL7) 22-7, and the output signal in a level according to the comparison result is output.

Note that the column signal processing circuit 13 performs AD conversion by counting the reset level or the signal level on the basis of the output signal from the comparator 210. Details of the column AD system using the correlated double sampling (CDS) will be described later with reference to FIGS. 8 to 10. Furthermore, details of the arrangement of the contacts C of the pixels 100 will be described later with reference to FIGS. 11 to 15.

(Example of Drive of Pixels)

Next, the details of the column AD system using the correlated double sampling (CDS) will be described with reference to FIGS. 8 to 10.

Figure 8:
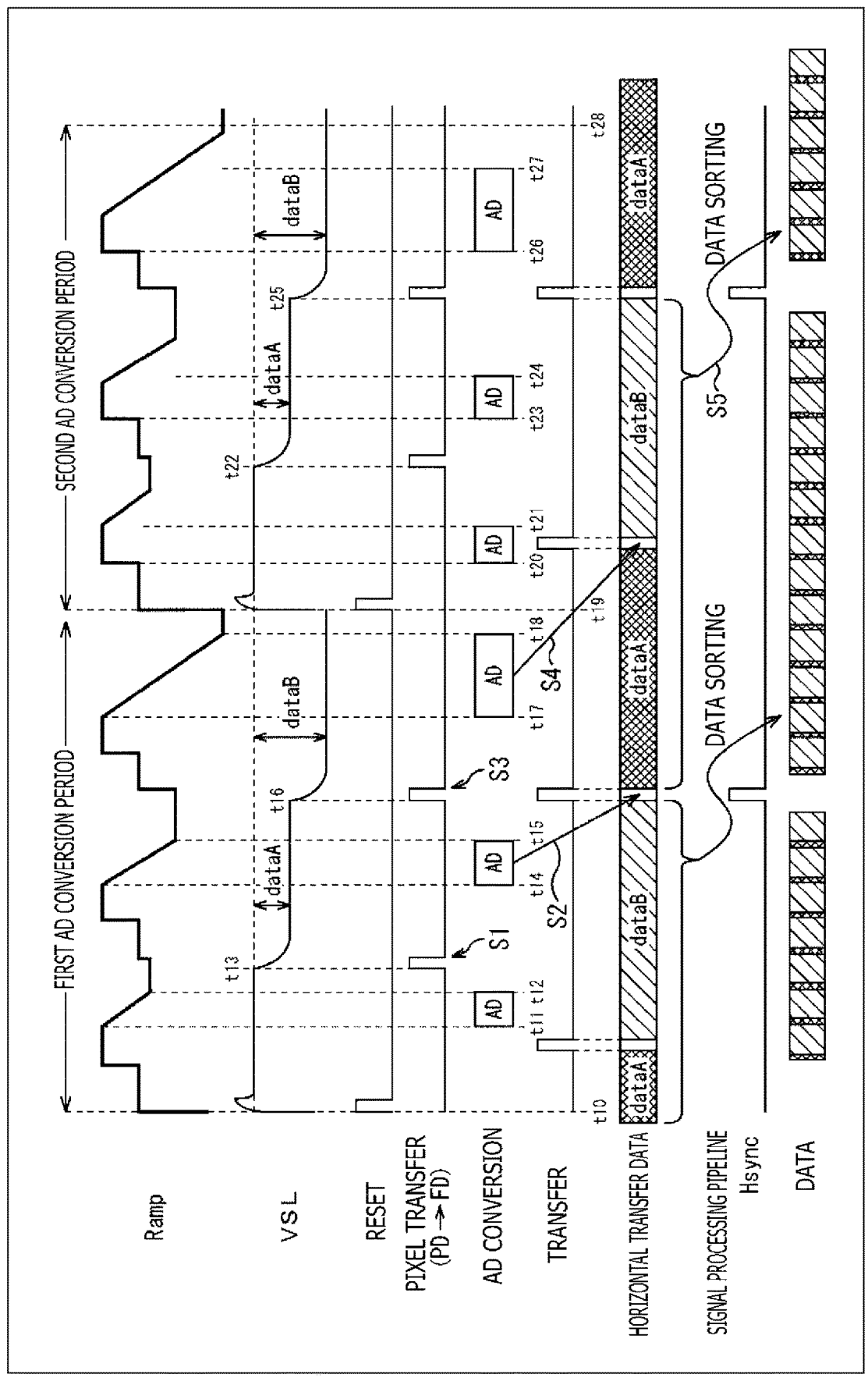
FIG. 8 is a timing chart describing AD conversion using correlated double sampling (CDS).

A timing chart of FIG. 8 illustrates timing of AD conversion and pixel addition in a case where the column AD system using the correlated double sampling (CDS) is adopted in the CMOS image sensor 10 (FIG. 1), and the photodiodes 112 of the four pixels included in the pixel group 200 share the pixels sharing the floating diffusion area (FD).

Here, as described above, the ramp wave (Ramp) from the DAC 220 (FIG. 5 and the like) and the VSL signal from the vertical signal line (VSL) 22 connected to the pixel group 200 are input to and compared by the comparator 210 (FIG. 5 and the like) in the column signal processing circuit 13 (FIG. 1).

In the timing chart of FIG. 8, the ramp wave (Ramp) from the DAC 220 and the VSL signal from the vertical signal line (VSL) 22 input to the comparator 210 are illustrated in chronological order. Note that in FIG. 8, the direction of time is a direction from the left to the right in FIG. 8.

The timing chart of FIG. 8 also illustrates a timing chart of "reset" corresponding to the drive signal RST input to the gate of the reset transistor RST-Tr, "pixel transfer" corresponding to the drive signal TRG input to the gate of the transfer transistor TR-Tr, "transfer" corresponding to the transfer timing of data after the AD conversion, and "Hsync" corresponding to the horizontal synchronization signal of the signal processing pipeline.

Note that "AD conversion" in FIG. 8 indicates periods of AD conversion performed by the column signal processing circuit 13, "horizontal transfer data" indicates data transferred according to the timing of "transfer," and "data" indicates data after sorting of the "horizontal transfer data."

At time t10, the reset transistor RST-Tr enters the on-state, and the floating diffusion area (FD) shared by four pixels of the pixel group 200 are reset. As a result, a reset level Srst is read in a period from time t10 to time t12 (hereinafter, referred to as first period). Here, the period from time t11 to time t12 is a period of AD conversion.

Next, at time t13, the transfer transistors TR-Tr corresponding to the phase difference pixels 100L and 100R enter the on-state, and a pixel signal Sa corresponding to charge QA accumulated in the photodiode 112 of one pixel of the four pixels included in each pixel group 200 is transferred to the floating diffusion area (FD) (S1 in FIG. 8). In this case, potential according to the charge QA is generated in the floating diffusion area (FD), and the amplifier transistor AMP-Tr and the selection transistor SEL-Tr output (apply) the potential to the vertical signal line (VSL) 22.

As a result, a pixel signal level SA according to the charge QA is read in a period from time t12 to time t16 (hereinafter, referred to as second period). Then, a difference between the pixel signal level SA during the reading in the second period and the reset level Srst during the reading in the first period can be calculated to remove the offset component to obtain a true signal component Sa.

Here, the period from time t14 to time t15 is a period of AD conversion of the pixel signal level SA, and the column signal processing circuit 13 performs correlated double sampling (CDS) and obtains a CDS signal of the second period (CDS signal of one pixel) (S2 of FIG. 8).

Next, at time t16, the transfer transistors TR-Tr of the remaining three pixels enter the on-state, and a pixel signal Sb according to charge QB accumulated in the photodiodes 112 of the remaining three pixels of the four pixels included in each pixel group 200 is transferred to the floating diffusion area (FD) (S3 of FIG. 8). In this regard, the charge QB is equivalent to a compilation of charge QB1, QB2, and QB3 accumulated in the photodiodes 112 of the remaining three pixels.

Here, the charge QB from the photodiodes 112 of the remaining three pixels is read without the reset of the floating diffusion area (FD) by the reset transistor RST-Tr, and the charge QB is added with the charge QA from the photodiode 112 of one pixel already accumulated in the floating diffusion area (FD). In this case, potential according to the amount of charge QAB obtained by combining the charge QA and the charge QB is generated in the floating diffusion area (FD), and the amplifier transistor AMP-Tr and the selection transistor SEL-Tr output (apply) the charge QAB to the vertical signal line (VSL) 22.

As a result, a pixel signal level SAB according to the charge QAB is read in a period from time t16 to time t19 (hereinafter, referred to as third period). Then, a difference between the pixel level signal SAB during the reading in the third period and the reset level Srst during the reading in the first period can be calculated to remove the offset component to obtain a true signal component Sab.

Note that the pixel signal Sb (true signal component Sb) according to the charge QB from the photodiode 112 of the remaining three pixels can be obtained by calculating a difference between the combined component Sab (true signal component Sab) and the pixel signal Sa (true signal component Sa).

In this regard, the period from time t17 to time t18 is a period of AD conversion of the pixel level signal SAB, and the column signal processing circuit 13 performs correlated double sampling (CDS) and obtains a CDS signal of the third period (CDS signal of three pixels) (S4 of FIG. 8).

Here, in the column signal processing circuit 13, the comparator 210 performs a comparison operation of the signal voltage Vx of the VSL signal from the vertical signal line (VSL) 22 and the reference voltage Vref based on the ramp wave (Ramp) from the DAC 220 input to the comparator 210, and an output signal Vco in a level according to the comparison result is output. The output signal Vco from the comparator 210 is counted by a counter (not illustrated) in a later stage.

In this way, in the column AD system using the correlated double sampling (CDS), the reset level Srst is read in the first period. The comparison operation of the signal voltage Vx and the reference voltage Vref is performed, and the output signal Vco is counted.

Furthermore, the pixel signal level SA is read in addition to the reset level Srst in the second period. The comparison operation of the signal voltage Vx and the reference voltage Vref is performed, and the output signal Vco is counted. Furthermore, the pixel signal level SAB according to the combined charge QAB of the signal charge QA and QB is read in addition to the reset level Srst in the third period. The comparison operation of the signal voltage Vx and the reference voltage Vref is performed, and the output signal Vco is counted.

The data obtained by the AD conversion (dataA of second period and dataB of third period) is applied as horizontal transfer data to the signal processing pipeline, and the data is sorted to obtain the data of the normal pixels 100 and the phase difference pixels 100L and 100R (S5 of FIG. 8).

Note that when a first AD conversion period of a period from time t10 to time t19 ends, a second AD conversion period of a period from time t19 to time t28 follows. However, the operation performed in the second AD conversion period is similar to the operation performed in the first AD conversion period, and the description will not be repeated.

By performing the drive illustrated in the timing chart of FIG. 8, the correlated double sampling (CDS) can be applied to the charge accumulated in the floating diffusion area (FD) in two stages. More specifically, the phase difference pixels 100L and 100R are read in the first stage, and the four pixels (2×2 pixels) are added and read in the second stage.

In addition, as a result of the drive, the operation in the first period for reading the reset level Srst, the operation in the second period for reading the pixel signal level SA, and the operation in the third period for reading the pixel signal level SAB are sequentially performed in one AD conversion period. Therefore, one period for reading the reset level can be eliminated compared to the case of normal CDS operation, and the time period of the correlated double sampling (CDS) can be shortened.

(Driving Operation of Pixels in Second Period)

Here, details of the driving operation of the pixels 100 in the second period (time t12 to time t16) illustrated in FIG. 8 will be described with reference to FIG. 9.

Figure 9:
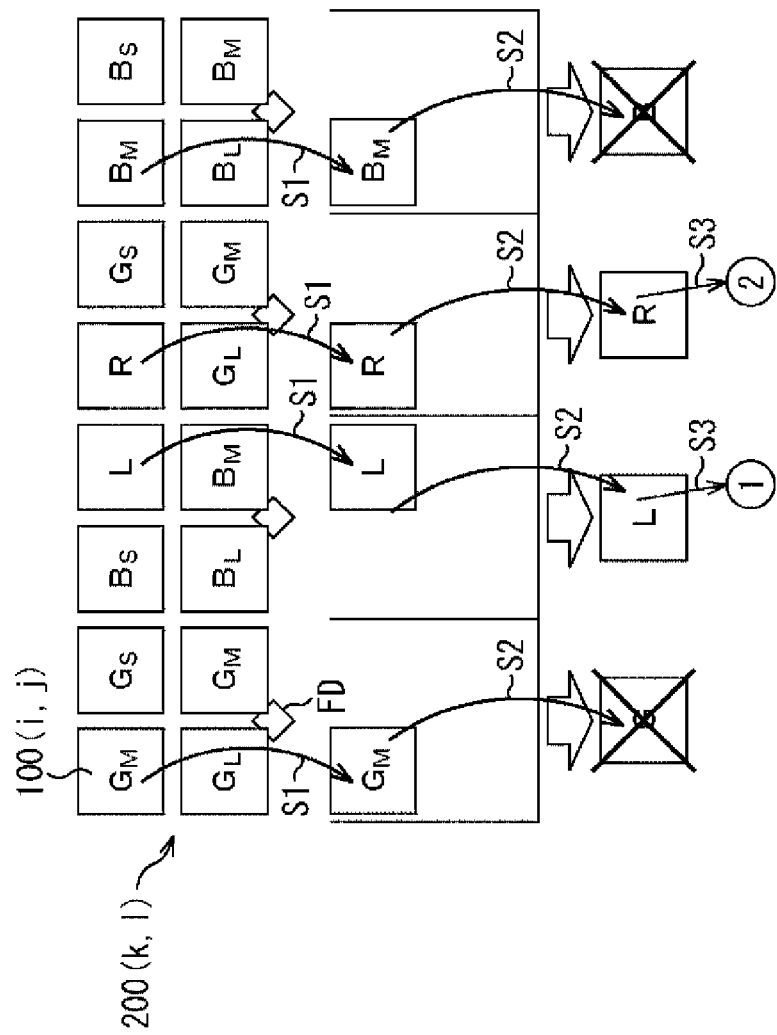
FIG. 9 is a diagram describing details of a driving operation of the pixels in a second period.

When the arrangement position of the upper left pixel 100 is expressed as pixel 100 (1, 1) in the pixel array illustrated in FIG. 9, G pixel group 200 (1, 1), B pixel group 200 (1, 2), G pixel group 200 (1, 3), and B pixel group 200 (1, 4) are arranged in the row direction.

Here, $G_M$ pixel 100 (1, 4) is arranged in place of $B_S$ pixel 100 (1, 4) in B pixel group 200 (1, 2). As a result, $G_M$ pixel 100 (1, 4) of B pixel group 200 (1, 2) is configured as phase difference pixel 100L (1, 4), and $G_M$ pixel 100 (1, 5) of G pixel group 200 (1, 3) is configured as phase difference pixel 100R (1, 5). Note that the relationship between the pixels 100 and the pixel groups 200 is also similar in FIG. 10 described later.

In the second period, the charge accumulated in the photodiode 112 of one pixel among the four pixels of each pixel group 200 is transferred to the floating diffusion area FD (S1 of FIG. 9).

More specifically, for $G_M$ pixel 100 (1, 1) of G pixel group 200 (1, 1), phase difference pixel 100L (1, 4) of B pixel group 200 (1, 2), phase difference pixel 100R (1, 5) of G pixel group 200 (1, 3), and $B_M$ pixel 100 (1, 7) of B pixel group 200 (1, 4), the transfer transistor TR-Tr transfers the charge accumulated in the photodiode 112 of each pixel 100 to the floating diffusion area FD different in each pixel group 200.

Then, the potential fluctuation of the floating diffusion area FD is handled as the input signal voltage for the gate in the amplifier transistor AMP-Tr of each pixel group 200, and the output signal voltage is output to the vertical signal line 22 through the selection transistor SEL-Tr. In this way, the column signal processing circuit 13 performs the correlated double sampling (CDS) and obtains the signal (CDS signal) after the CDS of the second period (S2 of FIG. 9).

However, only the CDS signals obtained from phase difference pixel 100L (1, 4) and phase difference pixel 100R (1, 5) are used here (S3 of FIG. 9), and the CDS signals obtained from $G_M$ pixel 100 (1, 1) and $B_M$ pixel 100 (1, 7) are not used and are discarded (X marks in FIG. 9).

More specifically, $G_M$ pixel 100 (1, 4) of B pixel group 200 (1, 2) and $G_M$ pixel 100 (1, 5) of G pixel group 200 (1, 3) are configured as phase difference pixel 100L (1, 4) and phase difference pixel 100R (1, 5), and the CDS signals obtained from the pixels 100 are held. On the other hand, $G_M$ pixel 100 (1, 1) of G pixel group 200 (1, 1) and $B_M$ pixel 100 (1, 7) of B pixel group 200 (1, 4) are configured as normal pixels 100, and the CDS signals obtained from the pixels 100 are not used and are discarded.

(Driving Operation of Pixels in Third Period)

Next, the details of the driving operation of the pixels 100 in the third period (time t16 to time t19) illustrated in FIG. 8 will be described with reference to FIG. 10.

Figure 10:
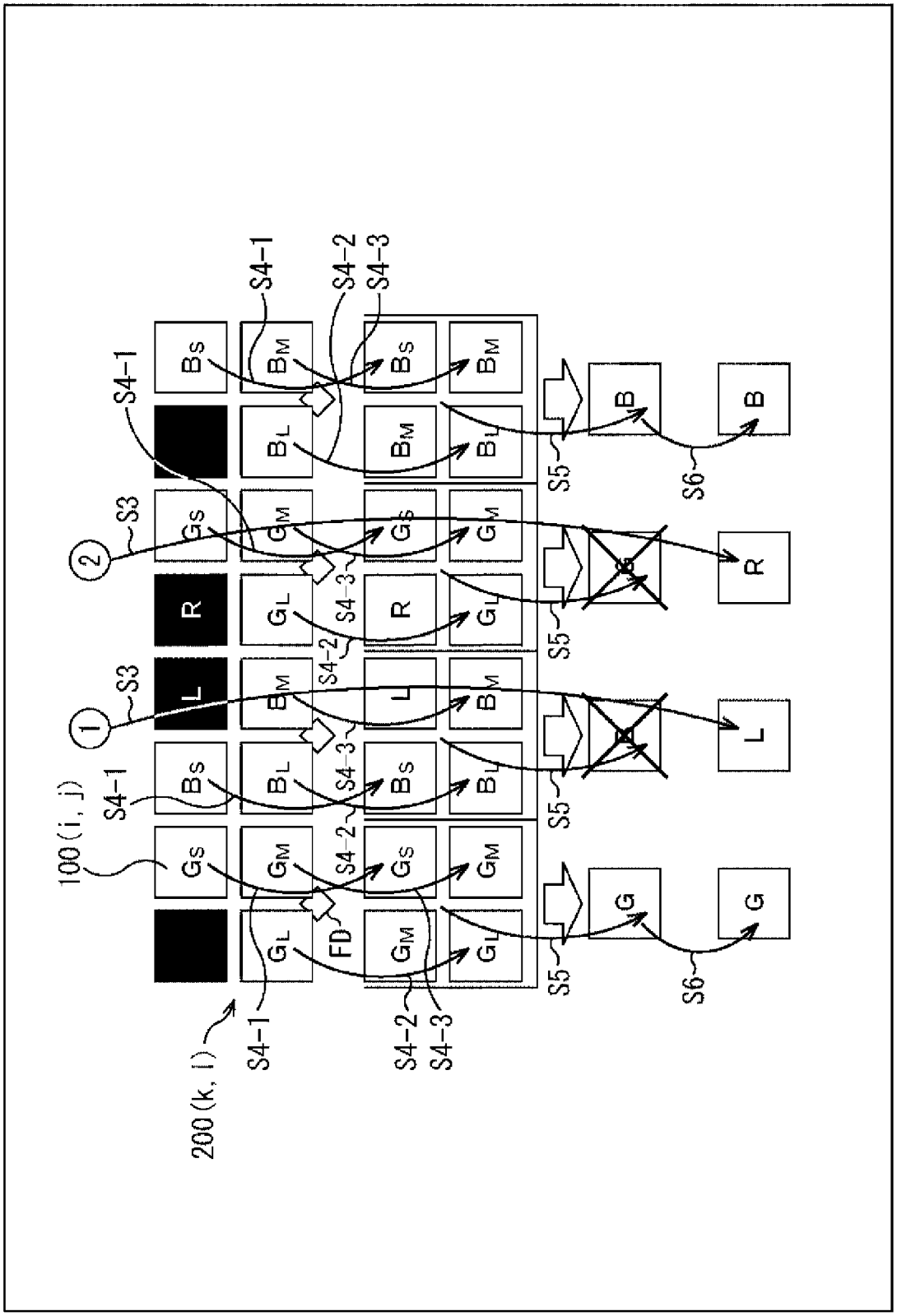
FIG. 10 is a diagram describing details of a driving operation of the pixels in a third period.

In the third period, the charge accumulated in the photodiodes 112 of three pixels excluding the one pixel as a target of the transfer in the second period among the four pixels of each pixel group 200 is transferred to the floating diffusion area FD (S4-1 to S4-3 of FIG. 10).

Note that in FIG. 10, the one pixel as a target of the transfer in the second period illustrated in FIG. 9 is indicated by a black rectangle, and $G_M$ pixel 100 (1, 1), $G_M$ pixel 100 (1, 4), $G_M$ pixel 100 (1, 5), and $B_M$ pixel 100 (1, 7) are removed from the target of the transfer in the third period.

More specifically, for $G_S$ pixel 100 (1, 2), $G_L$ pixel 100 (2, 1), and $G_M$ pixel 100 (2, 2) of G pixel group 200 (1, 1) and $B_S$ pixel 100 (1, 3), $B_L$ pixel 100 (2, 3), and $B_M$ pixel 100 (2, 4) of B pixel group 200 (1, 2), the transfer transistor TR-Tr transfers the charge accumulated in the photodiode 112 of each pixel 100 to the floating diffusion area FD different in each pixel group 200.

Similarly, for $G_S$ pixel 100 (1, 6), $G_L$ pixel 100 (2, 5), and $G_M$ pixel 100 (2, 6) of G pixel group 200 (1, 3) and $B_S$ pixel 100 (1, 8), $B_L$ pixel 100 (2, 7), and $B_M$ pixel 100 (2, 8) of B pixel group 200 (1, 4), the transfer transistor TR-Tr transfers the charge accumulated in the photodiode 112 of each pixel 100 to the floating diffusion area FD different in each pixel group 200.

Then, the potential fluctuation of the floating diffusion area FD is handled as the input signal voltage for the gate in the amplifier transistor AMP-Tr of each pixel group 200, and the output signal voltage is output to the vertical signal line 22 through the selection transistor SEL-Tr. In this way, the column signal processing circuit 13 performs the correlated double sampling (CDS) and obtains the CDS signals of the third period (S5 of FIG. 10).

However, the CDS signals obtained from the pixel group 200 including the phase difference pixels 100L and 100R are not used here and are discarded (X marks in FIG. 10), and only the CDS signals obtained from the pixel groups 200 including only normal pixels 100 are used (S6 of FIG. 10).

More specifically, $G_M$ pixel 100 (1, 4) of B pixel group 200 (1, 2) and $G_M$ pixel 100 (1, 5) of G pixel group 200 (1, 3) are configured as phase difference pixel 100L (1, 4) and phase difference pixel 100R (1, 5), and the CDS signals obtained from B pixel group 200 (1, 2) and G pixel group 200 (1, 3) are discarded. On the other hand, the four pixels of G pixel group 200 (1, 1) and the four pixels of B pixel group 200 (1, 4) include only normal pixels 100, and the CDS signals obtained from G pixel group 200 (1, 1) and B pixel group 200 (1, 4) are held.

In this way, the phase difference signals from the phase difference pixels 100L and 100R are obtained as CDS signals in the second period illustrated in FIG. 9 (S3 of FIGS. 9 and 10), and the pixel signals from the pixel groups 200 including only the normal pixels 100 are obtained as CDS signals in the third period illustrated in FIG. 10 (S6 of FIG. 10). One of the phase difference signals and the pixel signals is then selected and output.

(Example of Arrangement of Contacts)

Next, an example of arrangement of the contacts of the pixels 100 for performing the drive illustrated in the timing chart of FIG. 8 will be described with reference to FIGS. 11 to 15.

Figure 11:
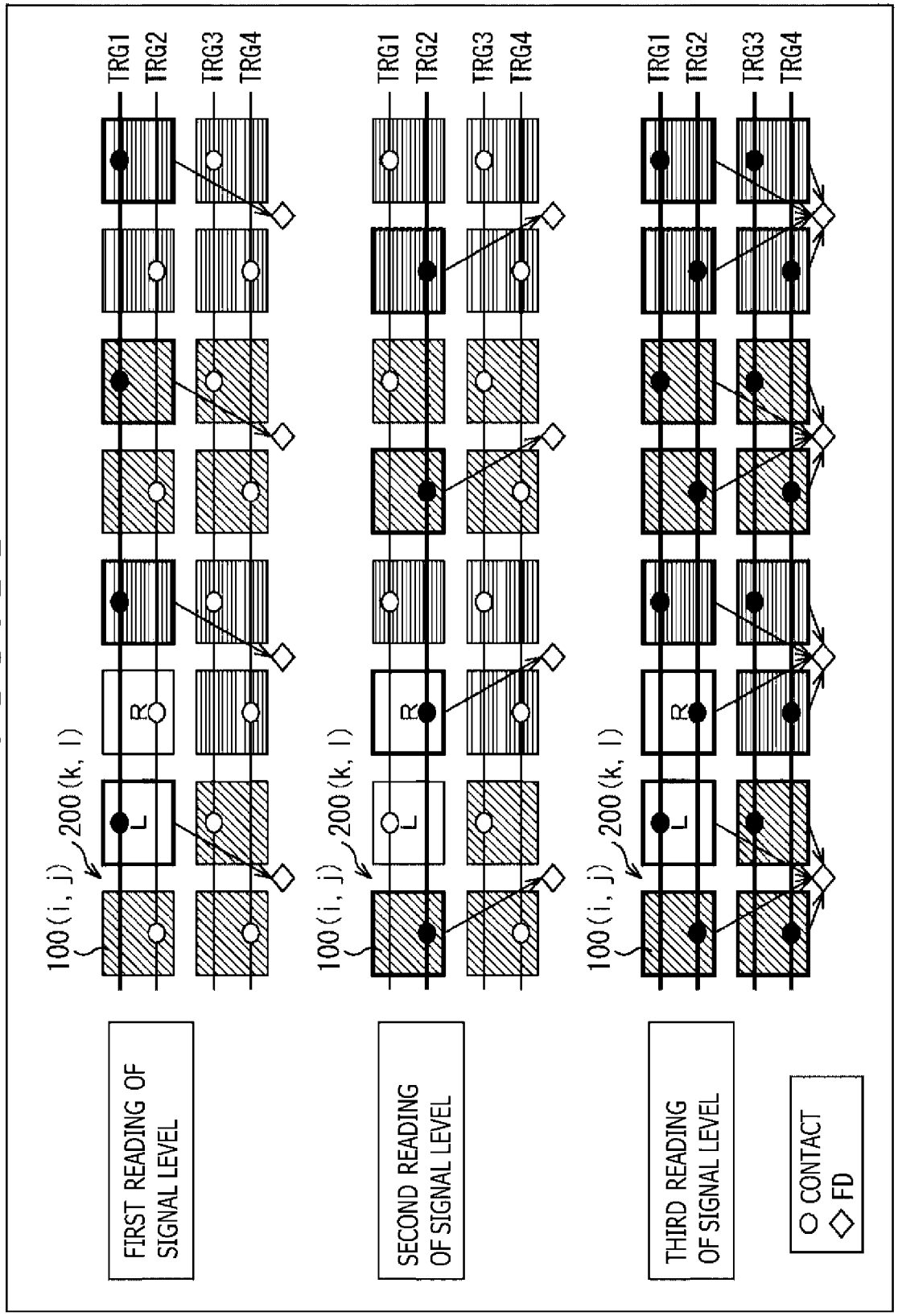
FIG. 11 depicts an arrangement of contacts in a case where the phase difference pixels (L, R) are separately read.

FIG. 11 illustrates an arrangement of the contacts in a case where the phase difference pixel 100L and the phase difference pixel 100R are separately read.

Note that in FIG. 11, an ellipse described on the pixel 100 indicates the contact C, and a rhombus described on every four pixels indicates the floating diffusion area FD. Furthermore, the drive line connected to each contact C is included in the pixel drive lines 21 (FIG. 1) connected to the vertical drive circuit 12 (FIG. 1). The meaning of the ellipses and the rhombuses is similar in the other drawings described later.

In the arrangement of the contacts C illustrated in FIG. 11, the contacts C of the phase difference pixel 100L included in the G pixel group 200 and the phase difference pixel 100R included in the B pixel group 200 are connected to different drive lines.

Therefore, the phase difference pixel 100L is independently read in the first reading period of the pixel signal level, and the charge accumulated in the photodiode 112 of the phase difference pixel 100L is transferred to the floating diffusion area FD of each pixel group 200.

Next, the phase difference pixel 100R is independently read in the second reading period of the pixel signal level, and the charge accumulated in the photodiode 112 of the phase difference pixel 100R is transferred to the floating diffusion area FD of each pixel group 200.

Then, four pixels (2×2 pixels) of each pixel group 200 are added and read in the third reading period of the pixel signal level, and the charge accumulated in the photodiode 112 of each of the four pixels is transferred to the floating diffusion area FD of each pixel group 200.

In this way, the phase difference pixel 100L is read in the first stage, the phase difference pixel 100R is read in the second stage, and the four pixels (2×2 pixels) of each pixel group 200 are added and read in the third stage in the arrangement of the contacts illustrated in FIG. 11. There are three reading periods of the pixel signal level, and as a result, the time period of the correlated double sampling (CDS) is long.

Figure 12:
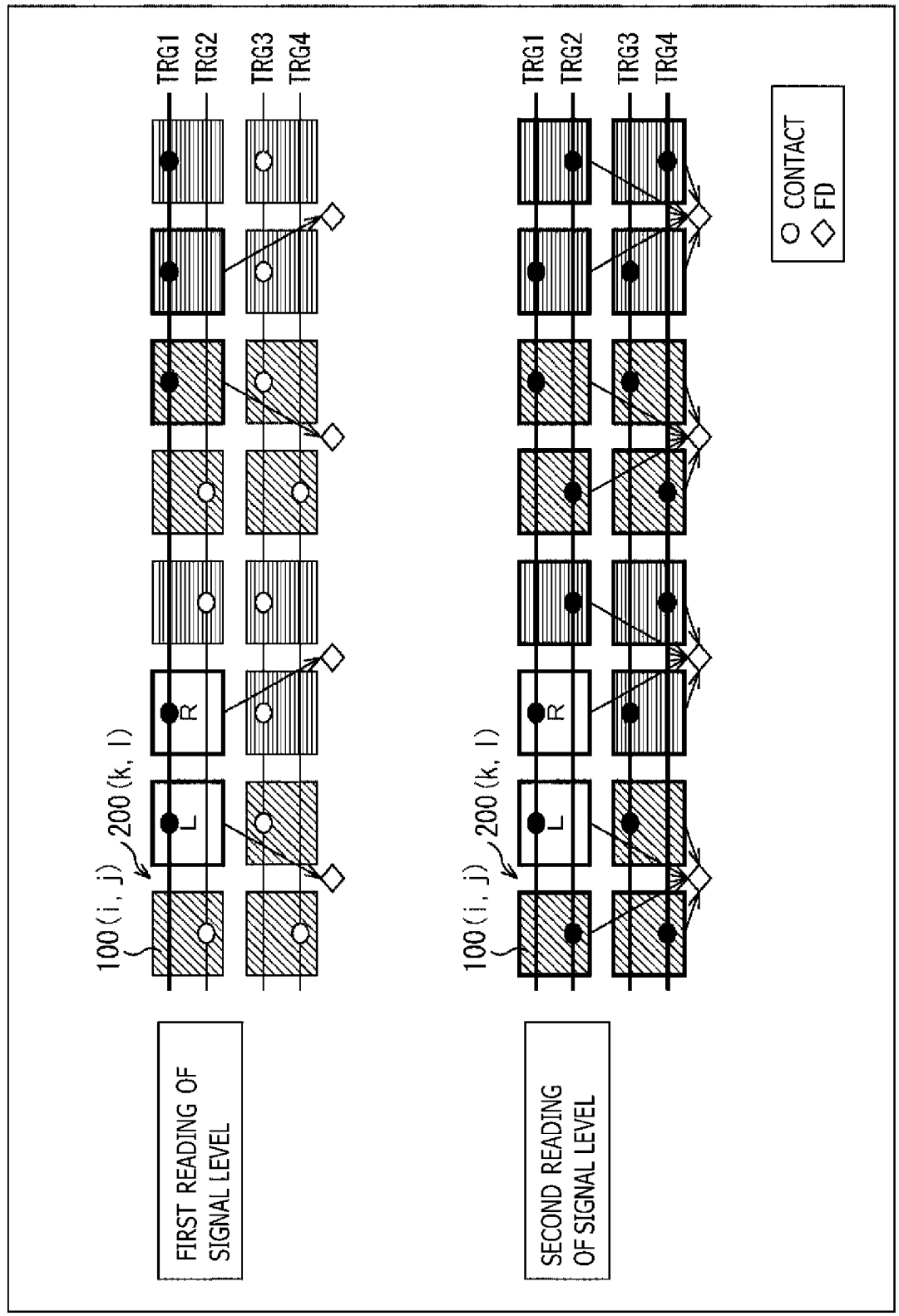
FIG. 12 depicts an arrangement of the contacts in a case where the phase difference pixels (L, R) are read at the same time.

Therefore, in the present technique, the contacts C of the pixels 100 are reconstructed to arrange the contacts C as illustrated for example in FIG. 12. One reading period of the pixel signal level is eliminated, and there are two reading periods of the pixel signal level. In this way, the time period of the correlated double sampling (CDS) can be shortened.

FIG. 12 illustrates an arrangement of the contacts in a case where the phase difference pixel 100L and the phase difference pixel 100R are read at the same time.

In the example of the arrangement of the contacts C illustrated in FIG. 12, the contacts C of the phase difference pixel 100L included in the G pixel group 200 and the phase difference pixel 100R included in the B pixel group 200 are connected to the same drive line.

Therefore, the phase difference pixel 100L is independently read in the first reading period of the pixel signal level, and the charge accumulated in the photodiode 112 of the phase difference pixel 100L is transferred to the floating diffusion area FD of the G pixel group 200. At the same time, the phase difference pixel 100R is independently read, and the charge accumulated in the photodiode 112 of the phase difference pixel 100R is transferred to the floating diffusion area FD of the B pixel group 200.

Then, in the second reading period of the pixel signal level, four pixels (2×2 pixels) of each pixel group 200 are added and read, and the charge accumulated in the photodiode 112 of each of the four pixels is transferred to the floating diffusion area FD of each pixel group 200.

In this way, the phase difference pixel 100L and the phase difference pixel 100R are read in the first stage, and the four pixels (2×2 pixels) of each pixel group 200 are added and read in the second stage in the example of arrangement of the contacts C illustrated in FIG. 12. Therefore, there are just two reading periods of the pixel signal level, and as a result, the time period of the correlated double sampling (CDS) can be shortened.

(Examples of Arrangement of Contacts)

Next, details of examples of arrangement of the contacts C according to the present technique will be described with reference to FIGS. 13 to 15.

Figure 13:
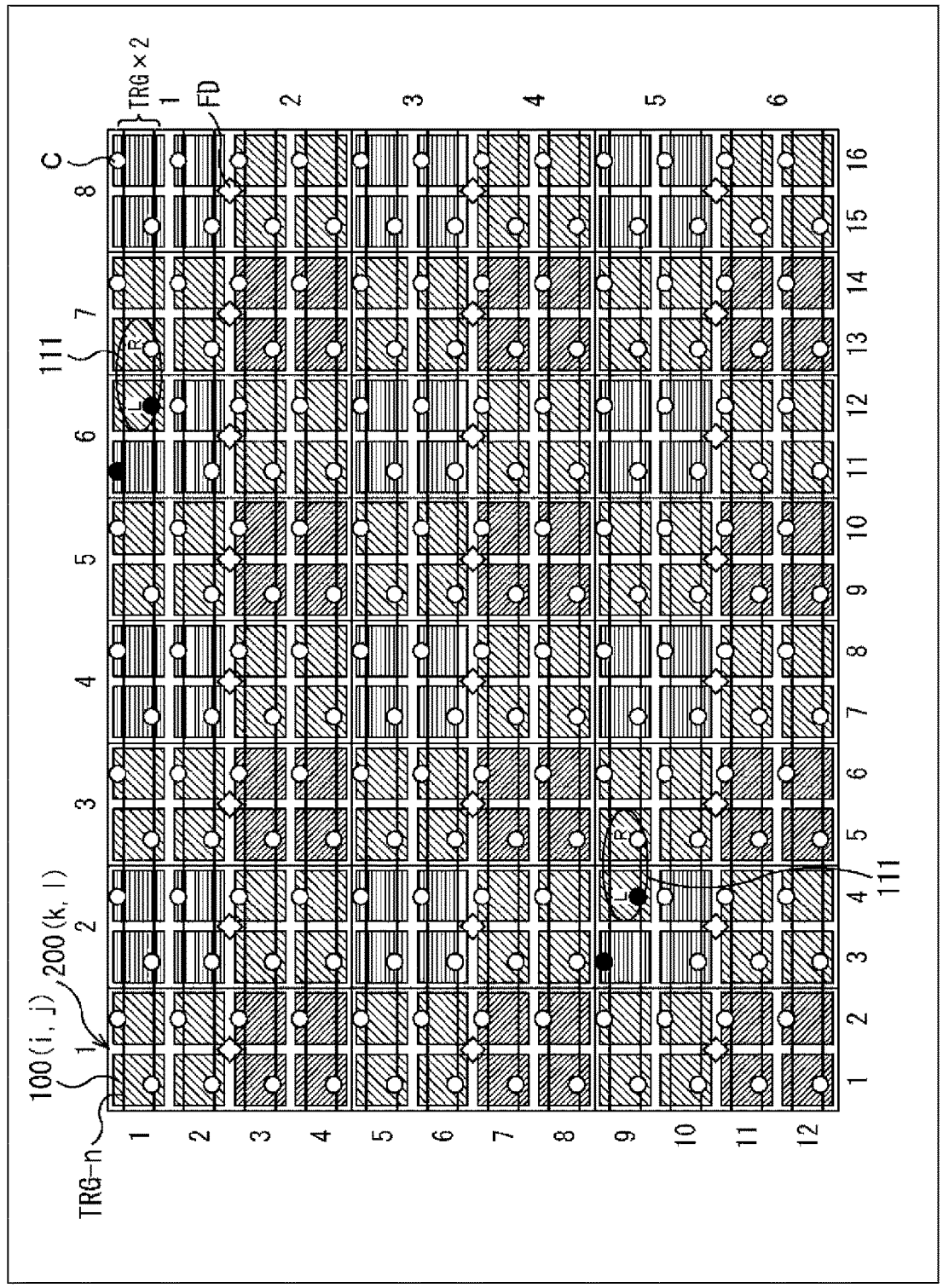
FIG. 13 depicts an example of arrangement of the contacts in a case with two drive lines.
Figure 14:
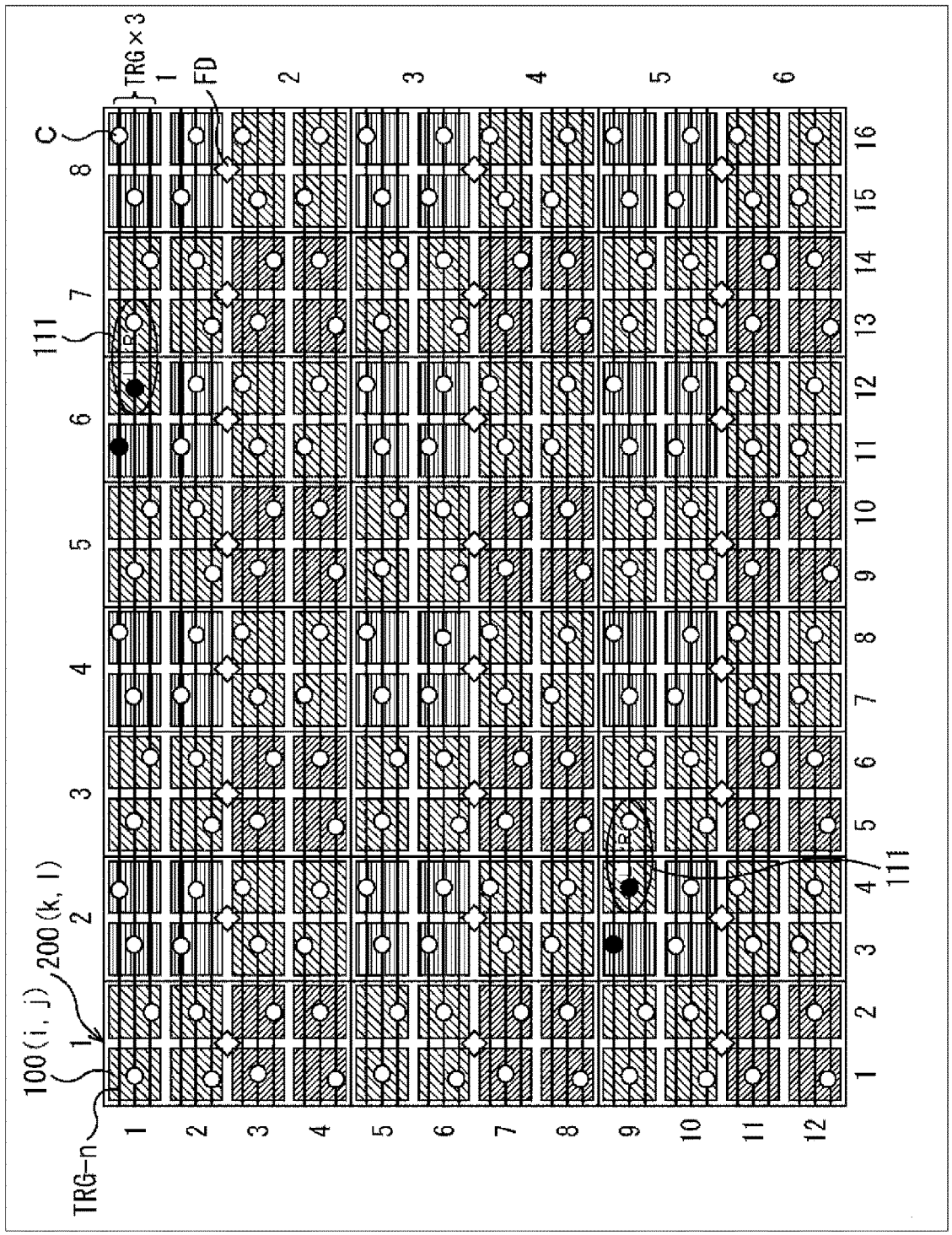
FIG. 14 depicts an example of arrangement of the contacts in a case with three drive lines.
Figure 15:
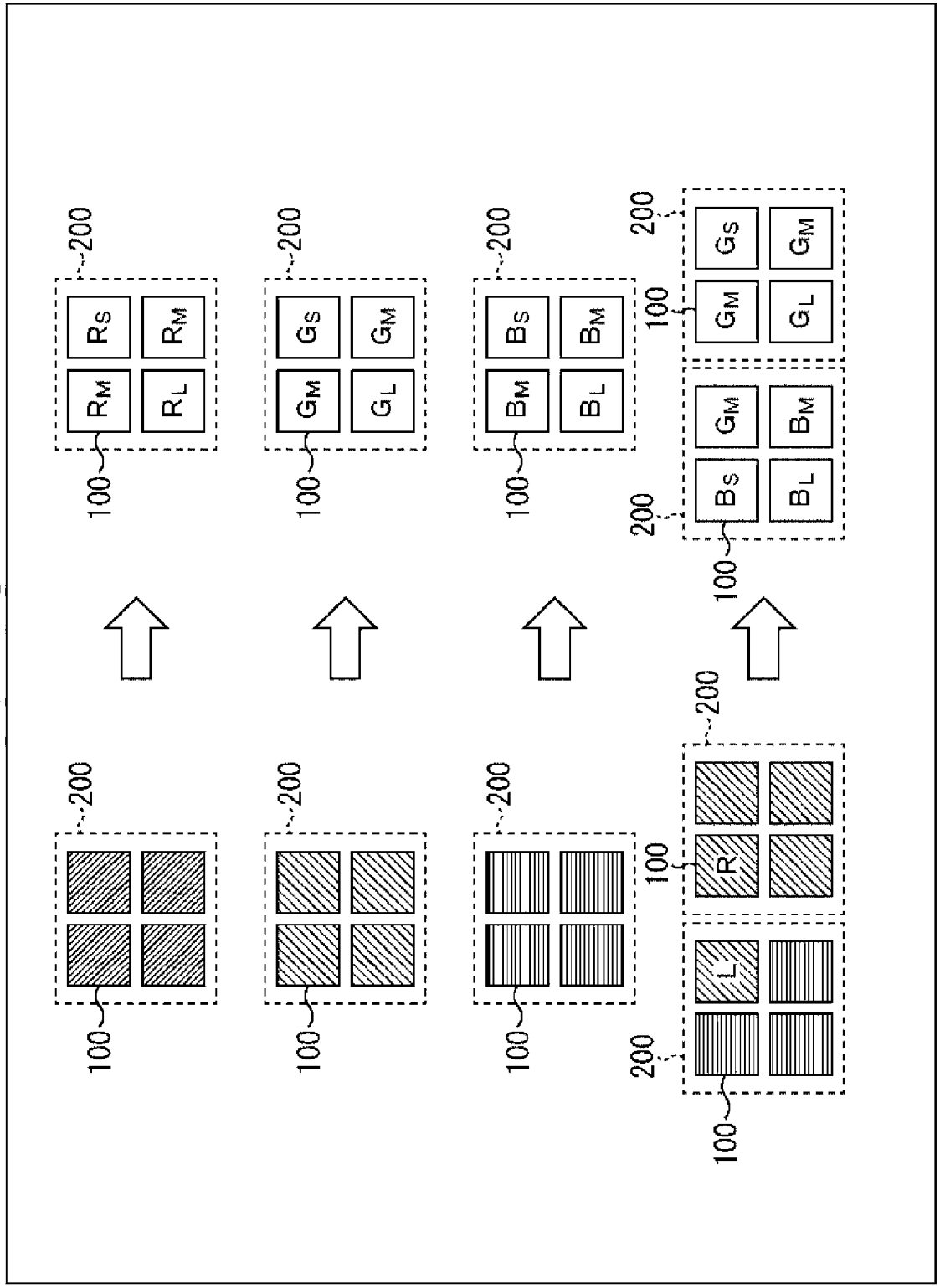
FIG. 15 is a diagram describing the exposure time periods of each pixel in FIGS. 13 and 14.

Although the four pixels (2×2 pixels) of the pixel group 200 are not distinguished in FIGS. 13 and 14, each pixel of the four pixels (2×2 pixels) can actually be, for example, one of the long-accumulation pixel (L), the medium-accumulation pixel (M), and the short-accumulation pixel (S) as illustrated in FIG. 15.

(Example of Arrangement in Case with Two Drive Lines)

FIG. 13 depicts an example of arrangement of the contacts C in a case with two drive lines.

Note that in the pixel array of FIG. 13, the row numbers and the column numbers corresponding to i rows and j columns of the pixels 100 are described in the areas on the left side and the lower side, and the row numbers and the column numbers corresponding to k rows and l columns of the pixel groups 200 are described in the areas on the right side and the upper side to facilitate the understanding. Therefore, an area of a pixel array with 12 rows and 16 columns (pixel group array with 6 rows and 8 columns) is extracted from the pixel array of the pixel array unit 11 in the illustration of FIG. 13.

Furthermore, the drive line connected to each contact C is included in the pixel drive lines 21 (FIG. 1), and row n of the drive lines in the horizontal direction is described as TRG-n. More specifically, two drive lines TRG are provided for the pixels 100 of each row in the pixel array of FIG. 13, and the contact C of each pixel 100 is electrically connected to one drive line TRG of the two drive lines TRG.

Here, when the arrangement position of the upper left pixel 100 is expressed as pixel 100 (1, 1), the contact C of upper left $G_M$ pixel 100 (1, 1) of the four pixels (shared pixels) of G pixel group 200 (1, 1) is connected to drive line TRG-2, and the contact C of the upper right $G_S$ pixel 100 (1, 2) is connected to drive line TRG-1, for example. In addition, the contact C of lower left $G_L$ pixel 100 (1, 2) is connected to drive line TRG4, and the contact C of lower right $G_M$ pixel 100 (1, 1) is connected to drive line TRG3.

In this way, in the G and B pixel groups 200 of the first row, the contact C of the upper left pixel 100 of the four pixels is connected to drive line TRG-2, the contact C of the upper right pixel 100 is connected to drive line TRG-1, the contact C of the lower left pixel 100 is connected to drive line TRG-4, and the contact C of the lower right pixel 100 is connected to drive line TRG-3.

Furthermore, in the R and G pixel groups 200 of the second row, the contact C of the upper left pixel 100 of the four pixels is connected to drive line TRG-6, the contact C of the upper right pixel 100 is connected to drive line TRG-5, the contact C of the lower left pixel 100 is connected to drive line TRG-8, and the contact C of the lower right pixel 100 is connected to drive line TRG-7. The connection relationship is similar to the G and B pixel groups 200 of the first row.

Although the description is omitted to avoid the repetition, the connection relationships of the G and B pixel groups 200 of the third row, the R and G pixel groups 200 of the fourth row, the G and B pixel groups 200 of the fifth row, and the R and G pixel groups 200 of the sixth row are similar to the connection relationships of the G and B pixel groups 200 of the first row and the R and G pixel groups 200 of the second row.

Here, focusing on the areas provided with B pixel group 200 (1, 6) and G pixel group 200 (1, 7) of the first row in the pixel array of FIG. 13, upper right $G_M$ pixel 100 (1, 12) of B pixel group 200 (1, 6) and upper left $G_M$ pixel 100 (1, 13) of G pixel group 200 (1, 7) are configured as phase difference pixel 100L (1, 12) and phase difference pixel 100R (1, 13).

Therefore, phase difference pixel 100L (1, 12) and phase difference pixel 100R (1, 13) have a structure (2×1 OCL structure) in which the photodiode 112 of $G_M$ pixel 100 (1, 12) and the photodiode 112 of $G_M$ pixel 100 (1, 13) are provided on one on-chip lens 111.

In this case, in B pixel group 200 (1, 6), the contact C of upper left $B_S$ pixel 100 (1, 11) is connected to drive line TRG-1, and upper right $G_M$ pixel 100 (1, 12) is connected to drive line TRG-2 as indicated by black circles in FIG. 13.

As described above, although the B pixel group 200 is supposed to include only B pixels 100, $G_M$ pixel 100 (1, 12) is arranged in B pixel group 200 (1, 6) in place of the upper right $B_S$ pixel 100 (1, 12) to configure phase difference pixel 100L (1, 12). In addition, $B_S$ pixel 100 (1, 11) is arranged as the upper left B pixel 100 in B pixel group 200 (1, 6) instead of $B_M$ pixel 100 (1, 11).

In this way, in the pixel groups 200 of the first row, the arrangement of the pixels in B pixel group 200 (1, 6) based on the type of exposure is different from the arrangement of the other B and G pixel groups 200. More specifically, the upper left and the lower right are the medium-accumulation pixels (M), the upper right is the short-accumulation pixel (S), and the lower left is the long accumulation pixel (L) in the other B and G pixel groups 200. The upper right and the lower right are the medium-accumulation pixels (M), the upper left is the short-accumulation pixel (S), and the lower left is the long-accumulation pixel (L) only in B pixel group 200 (1, 6).

Therefore, the contacts C are arranged in B pixel group 200 (1, 6) such that the contact C of upper left $B_S$ pixel 100 (1, 11) is connected to drive line TRG-1 instead of drive line TRG-2, and the contact C of upper right $G_M$ pixel 100 (1, 12) is connected to drive line TRG-2 instead of drive line TRG-1. As a result, the pixels 100 can be driven on the basis of the type of exposure in the pixel groups 200 of the first row.

In addition, focusing on the areas provided with B pixel group 200 (5, 2) and G pixel group 200 (5, 3) of the fifth row, upper right $G_M$ pixel 100 (9, 4) of B pixel group 200 (5, 2) and upper left $G_M$ pixel 100 (9, 5) of G pixel group 200 (5, 3) are configured as phase difference pixel 100L (9, 4) and phase difference pixel 100R (9, 5).

In this case, the contact C of upper left $B_S$ pixel 100 (9, 3) is connected to drive line TRG-17 instead of drive line TRG-18, and the contact C of upper right $G_M$ pixel 100 (9, 4) is connected to drive line TRG-18 instead of drive line TRG-17 in the arrangement of B pixel group 200 (5, 2) as indicated by black circles in FIG. 13. As a result, the pixels 100 can be driven on the basis of the type of exposure in the pixel groups 200 of the fifth row as in the pixel groups 200 of the first row.

Note that in the pixel array illustrated in FIG. 13, each floating diffusion area FD is shared by four pixels (2×2 pixels) of each pixel group 200, and the floating diffusion area FD is also shared by a pair of upper and lower pixel groups 200 in the column direction.

In this way, in the case where two drive lines TRG are provided for the pixels 100 of each row, the contacts C can be arranged as illustrated in the pixel array of FIG. 13 (for example, the contacts C of $B_S$ pixel 100 (1, 11) and $G_M$ pixel 100 (1, 12) of B pixel group 200 (1, 6) can be reconstructed) to read the phase difference pixel 100L and the phase difference pixel 100R at the same time. Therefore, the time period of the correlated double sampling (CDS) can be shortened.

(Example of Arrangement in Case with Three Drive Lines)

FIG. 14 depicts an example of arrangement of the contacts C in a case with three drive lines.

In the pixel array of FIG. 14, three drive lines TRG are provided for the pixels 100 of each row, and the contact C of each pixel 100 is electrically connected to one drive line TRG of the three drive lines TRG.

Here, when the arrangement position of the upper left pixel 100 is expressed as pixel 100 (1, 1), the contact C of upper left $G_M$ pixel 100 (1, 1) of the four pixels (shared pixels) included in G pixel group 200 (1, 1) is connected to drive line TRG-2, and the contact C of the upper right $G_S$ pixel 100 (1, 2) is connected to drive line TRG-3, for example. Furthermore, the contact C of lower left $G_L$ pixel 100 (1, 2) is connected to drive line TRG-6, and the contact C of lower right $G_M$ pixel 100 (1, 1) is connected to drive line TRG-5.

Furthermore, for example, the contact C of the upper left $B_M$ pixel 100 (1, 3) of the four pixels (shared pixels) included in B pixel group 200 (1, 2) is connected to drive line TRG-2, and the contact C of the upper right $G_S$ pixels 100 (1, 4) is connected to drive line TRG-1. Furthermore, the contact C of lower left $G_L$ pixel 100 (2, 3) is connected to drive line TRG-4, and the contact C of lower right $G_M$ pixel 100 (2, 4) is connected to drive line TRG-5.

In this way, in the G and B pixel groups 200 of the first row, the contact C of the upper left pixel 100 of the four pixels is connected to drive line TRG-2, the contact C of the upper right pixel 100 is connected to drive line TRG-3 or drive line TRG-1, the contact C of the lower left pixel 100 is connected to drive line TRG-6 or drive line TRG-4, and the contact C of the lower right pixel 100 is connected to TRG-5.

Furthermore, in the R and G pixel groups 200 of the second row, the contact C of the upper left pixel 100 of the four pixels is connected to drive line TRG-8, the contact C of the upper right pixel 100 is connected to drive line TRG-9 or drive line TRG-7, the contact C of the lower left pixel 100 is connected to the TRG-12 or drive line TRG-10, and the contact C of the lower right pixel 100 is connected to drive line TRG-11. The connection relationship is similar to the G and B pixel groups 200 of the first row.

Although the description is omitted to avoid the repetition, the connection relationships of the G and B pixel groups 200 of the third row, the R and G pixel groups 200 of the fourth row, the G and B pixel groups 200 of the fifth row, and the R and G pixel groups 200 of the sixth row are similar to the connection relationships of the G and B pixel groups 200 of the first row and the R and G pixel groups 200 of the second row.

Here, focusing on the areas provided with B pixel group 200 (1, 6) and G pixel group 200 (1, 7) of the first row in the pixel array of FIG. 14, upper right $G_M$ pixel 100 (1, 12) of B pixel group 200 (1, 6) and upper left $G_M$ pixel 100 (1, 13) of G pixel group 200 (1, 7) are configured as phase difference pixel 100L (1, 12) and phase difference pixel 100R (1, 13).

In this case, in B pixel group 200 (1, 6), the contact C of upper left $B_S$ pixel 100 (1, 11) is connected to drive line TRG-1, and upper right $G_M$ pixel 100 (1, 12) is connected to drive line TRG-2 as indicated by black circles in FIG. 14.

As described above, the reason is as follows. In the pixel groups 200 of the first row, the arrangement of the pixels in B pixel group 200 (1, 6) based on the type of exposure is different from the arrangement of the other B pixel groups 200. More specifically, the upper left and the lower right are the medium-accumulation pixels (M), the upper right is the short-accumulation pixel (S), and the lower left is the long accumulation pixel (L) in the other B pixel groups 200. The upper right and the lower right are the medium-accumulation pixels (M), the upper left is the short-accumulation pixel (S), and the lower left is the long-accumulation pixel (L) only in B pixel group 200 (1, 6).

Therefore, the contacts C are arranged in B pixel group 200 (1, 6) such that the contact C of upper left $B_S$ pixel 100 (1, 11) is connected to drive line TRG-1 instead of drive line TRG-2, and the contact C of upper right $G_M$ pixel 100 (1, 12) is connected to drive line TRG-2 instead of drive line TRG-1. As a result, the pixels 100 can be driven on the basis of the type of exposure in the pixel groups 200 of the first row.

In addition, focusing on the areas provided with B pixel group 200 (5, 2) and G pixel group 200 (5, 3) of the fifth row, upper right $G_M$ pixel 100 (9, 4) of B pixel group 200 (5, 2) and upper left $G_M$ pixel 100 (9, 5) of G pixel group 200 (5, 3) are configured as phase difference pixel 100L (9, 4) and phase difference pixel 100R (9, 5).

In this case, the contacts C are arranged in B pixel group 200 (5, 2) such that the contact C of upper left $B_S$ pixel 100 (9, 3) is connected to drive line TRG-25 instead of drive line TRG-26, and upper right $G_M$ pixel 100 (9, 4) is connected to drive line TRG26 instead of drive line TRG-25 as indicated by black circles in FIG. 14. As a result, the pixels 100 can be driven on the basis of the type of exposure in the pixel groups 200 of the fifth row as in the pixel groups 200 of the first row.

In this way, in the case where three drive lines TRG are provided for the pixels 100 of each row, the contacts C can be arranged as illustrated in the pixel array of FIG. 14 (for example, the contacts C of $B_S$ pixel 100 (1, 11) and $G_M$ pixel 100 (1, 12) of B pixel group 200 (1, 6) can be reconstructed) to read the phase difference pixel 100L and the phase difference pixel 100R at the same time. Therefore, the time period of the correlated double sampling (CDS) can be shortened.

Note that the arrangements of the contacts C illustrated in FIGS. 13 and 14 are examples, and other arrangements may be adopted. Although part of the contacts C of the pixels 100 included in the pixel group 200 including the phase difference pixel 100L is reconstructed in the cases described in FIGS. 13 and 14, part of the contacts C of the pixels 100 included in the pixel group 200 including the phase difference pixel 100R may be reconstructed. Furthermore, part of the contacts C of the pixels 100 may be reconstructed in both of the pixel group 200 including the phase difference pixel 100R and the pixel group 200 including the phase difference pixel 100L.

The first embodiment has been described. In the array pattern adopted in the first embodiment, the pixel groups 200 each including four pixels (shared pixels) of the same color are systematically arranged. In the case where the exposure time period is adjusted for each of the four pixels of the pixel groups 200, higher phase difference detection accuracy can be realized when the phase difference pixels 100L and 100R are provided for the pixel array of the pixels 100 included in the pixel groups 200.

The reason is as follows. More specifically, in the case of arranging the phase difference pixels 100L and 100R on the pixel groups 200 arranged in the Bayer array in the pixel array unit 11, the structure (2×1 OCL structure) providing the photodiode 112 of the phase difference pixel 100L and the photodiode 112 of the phase difference pixel 100R on one on-chip lens 111 can be adopted to improve the performance during low light intensity. For example, in the case of adopting the 2×1 OCL structure, the sensitivity of the phase difference pixels is substantially twice the sensitivity in the case of using the phase difference pixels of the light-shielding type.

On the other hand, in the case of adopting the structure of the pixel groups 200 each including four pixels 100 (four (2×2) pixels) of the same color, the exposure time period can be adjusted for each pixel 100 to obtain pixel signals of HDR (High Dynamic Range). However, different types of exposure are performed for two pixels in the row direction in the four pixels 100 (four (2×2) pixels), and the 2×1 OCL structure cannot be adopted. Therefore, the sensitivity of the phase difference pixels is reduced in the case of using the phase difference pixels of the light-shielding type.

More specifically, in the case of adopting the 2×1 OCL structure, the accuracy of the phase difference detection using the phase difference signals obtained from the phase difference pixels 100L and 100R is deteriorated when different types of exposure are performed for two pixels in the row direction. Therefore, it is difficult to adopt the 2×1 OCL structure for the two pixels with different types of exposure. Furthermore, in the case of using the phase difference pixels of the light-shielding type (type in which 1/2 of light incident surface is shielded), the sensitivity of the phase difference pixels is substantially 1/2, and the performance of the phase difference detection using the phase difference signals obtained from the phase difference pixels is deteriorated.

Therefore, in the case of adopting the structure of the pixel groups 200 each including four pixels (shared pixels) of the same color, the phase difference pixel 100L and the phase difference pixel 100R are pixels 100 of the same color adjacent to each other and are included in different adjacent pixel groups 200 when the exposure time period is adjusted for each pixel 100, and the 2×1 OCL structure is realized in the present technique. In this way, the 2×1 OCL structure can be realized to improve the sensitivity of the phase difference pixels, and higher phase difference detection accuracy can be realized.

Note that in the description of the first embodiment, the exposure time period is adjusted for each pixel 100 in the pixel group 200, and the pixel 100 is set to, for example, one of the long-accumulation pixel (L), the medium-accumulation pixel (M), and the short-accumulation pixel (S) to obtain a pixel signal of HDR. However, the exposure time period may not be changed for each pixel 100, and the exposure time period may be the same.

Although the pixel signals of HDR cannot be obtained in the case of adopting the configuration, the phase difference pixels 100L and 100R of the 2×1 OCL structure are included in different adjacent pixel groups 200, and the structure remains unchanged in which, for example, one of the four pixels of the G pixel group 200 is extended as one pixel of the B pixel group 200 or the R pixel 200. Therefore, the configuration has, for example, the following advantage.

That is, in the case where the exposure time period is not adjusted for each pixel 100 in the pixel groups 200, there is an advantage that the phase difference pixels 100L and 100R that are pixels hard to use for obtaining image information can be dispersed into a plurality of pixel groups 200 (for example, G pixel groups 200 and B pixel groups 200 or G pixel groups 200 and R pixel groups 200).

Furthermore, although the driving method of the pixels for performing the pixel addition in the case of sharing the pixels that share the floating diffusion area (FD) is described in FIGS. 8 to 15, the exposure time period also does not have to be adjusted for each pixel 100 in the pixel groups 200 when the driving method is applied.

(2) Second Embodiment (Plane Layout of Pixels)

Figure 16:
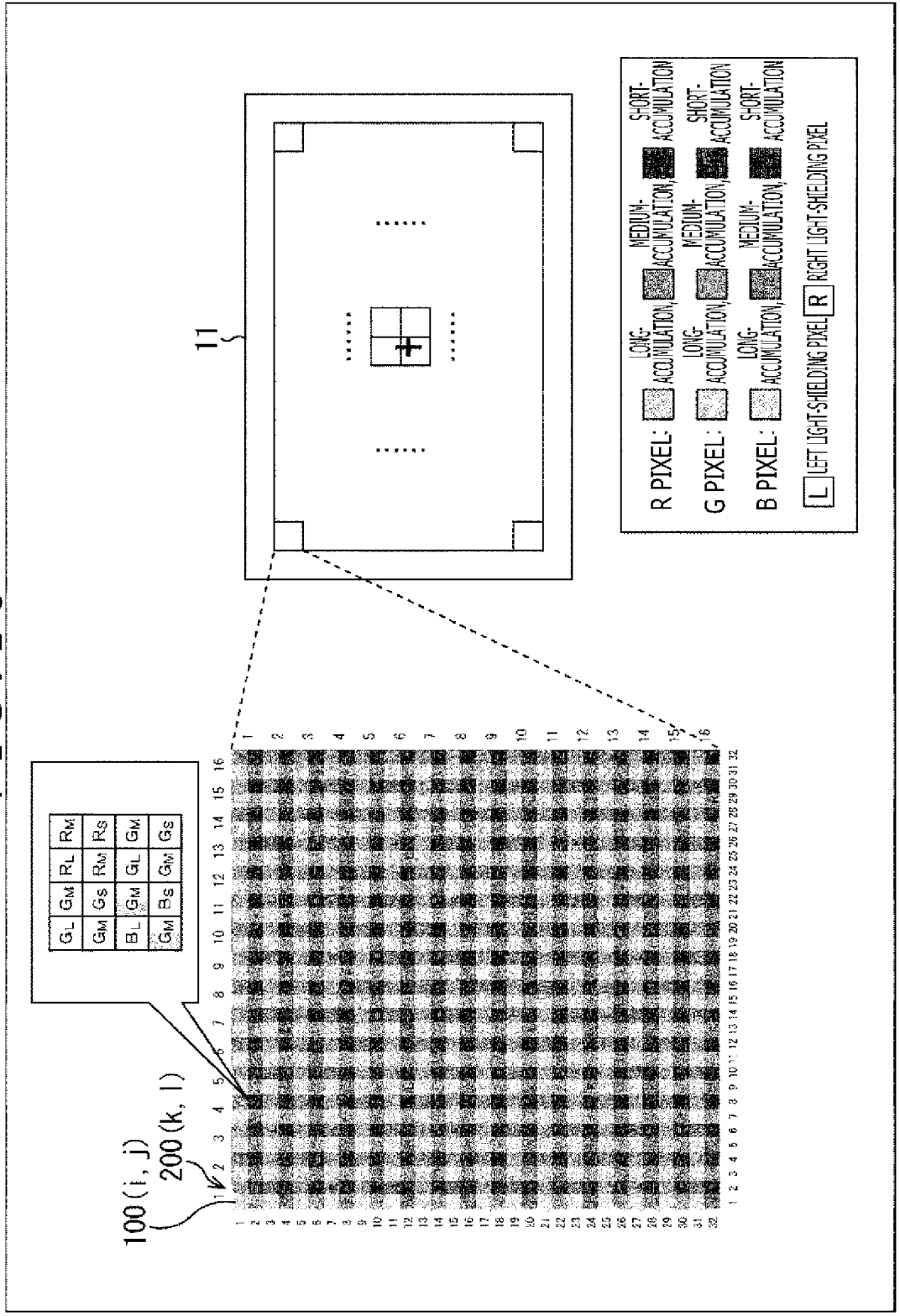
FIG. 16 depicts a plane layout of the plurality of pixels arranged in the pixel array unit.

FIG. 16 depicts a plane layout of the plurality of pixels 100 arranged in the pixel array unit 11 of FIG. 1.

FIG. 16 illustrates the pixels 100 in an area of 32 rows and 32 columns arranged in an upper left area as viewed from the light incident side among the plurality of pixels 100 two-dimensionally arranged in the pixel array unit 11.

In the pixel array unit 11 of FIG. 16, the R pixel groups 200 each including four red (R) pixels (2×2 pixels), the G pixel groups 200 each including four green (G) pixels (2×2 pixels), and the B pixel groups 200 each including four blue (B) pixels (2×2 pixels) are systematically arranged to form a Bayer array.

In addition, the four pixels 100 of the pixel groups 200 arranged in the Bayer array are configured as shared pixels, and the pixel signals obtained from the four pixels 100 are added to generate a pixel signal.

In this case, the exposure time period is adjusted for each pixel 100 in the pixel groups 200, and the pixels 100 configuring the shared pixels include the long-accumulation pixel (L), the medium-accumulation pixels (M), and the short-accumulation pixel (S). Therefore, the pixel signal obtained here is a pixel signal of HDR obtained by adding the long-accumulation pixel signal, the medium-accumulation pixel signals, and the short-accumulation pixel signal.

Here, focusing on the area provided with pixel group 200 (2, 3), left light-shielding pixel 100L (3, 6) and left light-shielding pixel 100L (4, 5) are arranged in place of $B_M$ pixel 100 (3, 6) and $B_M$ pixel 100 (4, 5).

Figure 17:
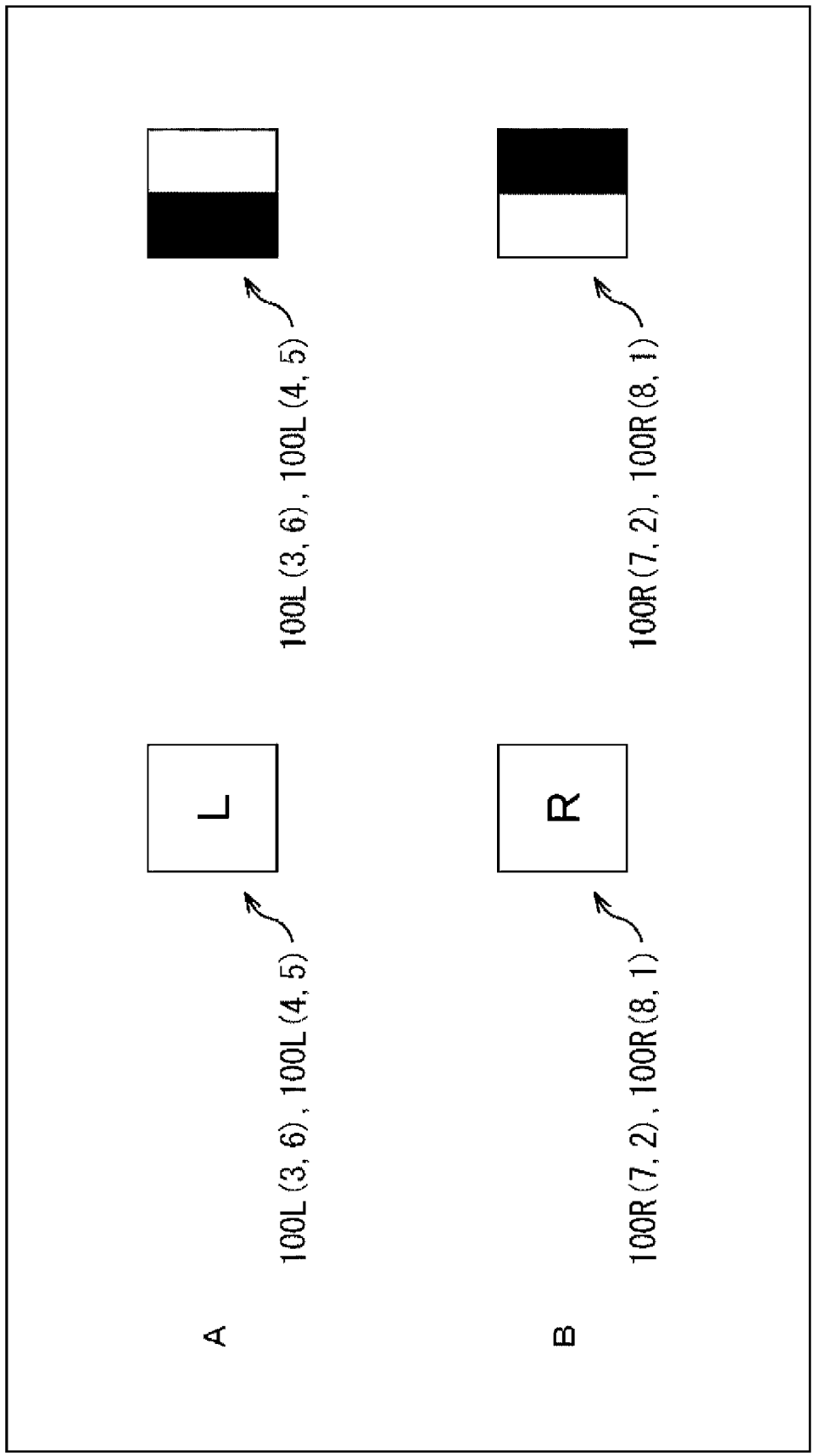
FIG. 17 depicts an example of structure of a left light-shielding pixel and a right light-shielding pixel.

As illustrated in A of FIG. 17, left areas (areas illustrated in black in FIG. 17) of left light-shielding pixel 100L (3, 6) and left light-shielding pixel 100L (4, 5) are shielded as viewed from the light incident side. Note that each of left light-shielding pixel 100L (3, 6) and left light-shielding pixel 100L (4, 5) is provided with the G color filter 113 and is configured as the $G_M$ pixel 100.

Returning to the description of FIG. 16, in the pixel array unit 11, the left light-shielding pixels 100L are arranged as upper right and lower left pixels of the four pixels in place of the $B_M$ pixels 100 in pixel group 200 (2, 11), pixel group 200 (6, 5), pixel group 200 (6, 13), pixel group 200 (10, 7), pixel group 200 (10, 15), pixel group 200 (10, 7), pixel group 200 (14, 1), and pixel group 200 (14, 9), as in pixel group 200 (2, 3).

Furthermore, focusing on the area provided with pixel group 200 (4, 1), right light-shielding pixel 100R (7, 2) and right light-shielding pixel 100R (8, 1) are arranged in place of $B_M$ pixel 100 (7, 2) and $B_M$ pixel 100 (8, 1).

As illustrated in B of FIG. 17, right areas (areas illustrated in black in FIG. 17) of right light-shielding pixel 100R (7, 2) and right light-shielding pixel 100R (8, 1) are shielded as viewed from the light incident side. Note that each of right light-shielding pixel 100R (7, 2) and right light-shielding pixel 100R (8, 1) is provided with the G color filter 113 and is configured as the $G_M$ pixel 100.

Returning to the description of FIG. 16, in the pixel array unit 11, the right light-shielding pixels 100R are arranged as upper right and lower left pixels of the four pixels in place of the $B_M$ pixels 100 in pixel group 200 (4, 9), pixel group 200 (8, 3), pixel group 200 (8, 11), pixel group 200 (12, 5), pixel group 200 (12, 13), pixel group 200 (16, 7), and pixel group 200 (16, 15), as in pixel group 200 (4, 1).

In this way, the R pixel groups 200 each including four (2×2) R pixels 100, the G pixel groups 200 each including four (2×2) G pixels 100, and the B pixel groups 200 each including four (2×2) B pixels 100 are arranged in the Bayer array in the pixel array unit 11, and part of the pixels (upper right and lower left pixels of four pixels) of the B pixel group 200 are replaced with the left light-shielding pixels 100L or the right light-shielding pixels 100R.

Here, the left light-shielding pixels 100L and the right light-shielding pixels 100R with horizontally symmetrical light-shielding areas are paired as pixels for phase difference detection (phase difference pixels). An image for phase difference detection is generated on the basis of the left light-shielding pixel signals and the right light-shielding pixel signals obtained by the left and right light-shielding pixels, and the phase difference is detected.

For example, in the pixel array unit 11, a set of the left light-shielding pixels 100L of pixel group 200 (2, 3) and the right light-shielding pixels 100R of pixel group 200 (4, 1), a set of the left light-shielding pixels 100L of pixel group 200 (2, 11) and the right light-shielding pixels 100R of pixel group 200 (4, 9), and the like can be pairs of phase difference pixels.

(Structure of Cross Section of Pixels)

Figure 18:
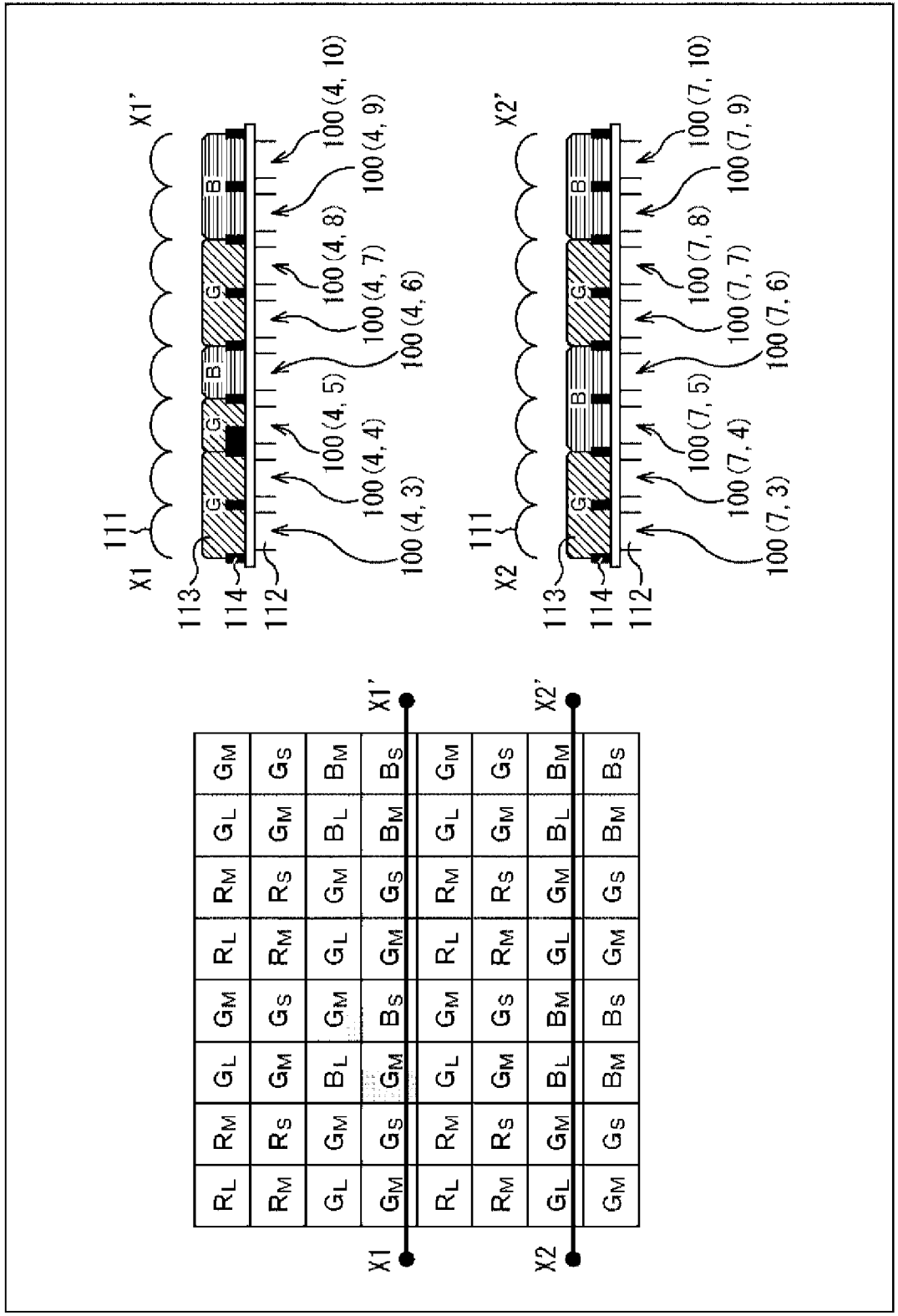
FIG. 18 is a cross-sectional view illustrating a structure of the plurality of pixels arranged in the pixel array unit.

FIG. 18 is a cross-sectional view illustrating a structure of the plurality of pixels 100 arranged in the pixel array unit 11 of FIG. 16.

FIG. 18 illustrates an X1-X1' cross section of the fourth row as a cross section of the pixel groups 200 including the left light-shielding pixels 100L as phase difference pixels. FIG. 18 also illustrates an X2-X2' cross section of the pixels 100 of the seventh row as a cross section of the pixel groups 200 not including the phase difference pixels.

Here, when the arrangement position of the upper left pixel 100 is expressed as pixel (1, 3), the target of the X1-X1' cross section includes $G_M$ pixel 100 (4, 3), $G_S$ pixel 100 (4, 4), left light-shielding pixel 100L (4, 5), $B_S$ pixel 100 (4, 6), $G_M$ pixel 100 (4, 7), $G_S$ pixel 100 (4, 8), $B_M$ pixel 100 (4, 9), and $B_S$ pixel 100 (4, 10).

Here, $G_M$ pixel 100 (4, 3) and $G_S$ pixel 100 (4, 4) are included in G pixel group 200 (2, 2), and left light-shielding pixel 100L (4, 5) and $B_S$ pixel 100 (4, 6) are included in B pixel group 200 (2, 3). In addition, $G_M$ pixel 100 (4, 7) and $G_S$ pixel 100 (4, 8) are included in G pixel group 200 (2, 4), and $B_M$ pixel 100 (4, 9) and $B_S$ pixel 100 (4, 10) are included in B pixel group 200 (2, 5).

As illustrated in the X1-X1' cross section of FIG. 18, the G color filters 113 are formed in $G_M$ pixel 100 (4, 3) and $G_S$ pixel 100 (4, 4), in left light-shielding pixel 100L (4, 5), and in $G_M$ pixel 100 (4, 7) and $G_S$ pixel 100 (4, 8). The B color filters 113 are formed in $B_S$ pixel 100 (4, 6) and in $B_M$ pixel 100 (4, 9) and $B_S$ pixel 100 (4, 10).

That is, although the B color filter 113 is supposed to be formed to configure the $B_M$ pixel 100 because left light-shielding pixel 100L (4, 5) is included in B pixel group 200 (2, 3), the G color filter 113 is formed here to configure the $G_M$ pixel 100. Although the light-shielding pixels such as left light-shielding pixel 100L (4, 5) are $G_M$ pixels 100 provided with the G color filters in the description here, the color filters may not be provided, and the light-shielding pixels may be configured as white (W) pixels.

Furthermore, the light-shielding portion 114 not only shields left light-shielding pixel 100L (4, 5) from the adjacent pixels, but also shields the left area of left light-shielding pixel 100L (4, 5). Therefore, the light-shielding portion 114 is extended toward the light incident surface, and the incident surface of the light incident on the photodiode 112 is narrower than the other pixels. As a result, as illustrated in A of FIG. 17, the left area of left light-shielding pixel 100L (4, 5) is shielded by the light-shielding portion 114 as viewed from the light incident side.

Meanwhile, the target of the X2-X2' cross section is $G_L$ pixel 100 (7, 3), $G_M$ pixel 100 (7, 4), $B_L$ pixel 100 (7, 5), $B_M$ pixel 100 (7, 6), $G_L$ pixel 100 (7, 7), $G_M$ pixel 100 (7, 8), the $B_L$ pixel 100 (7, 9), and $B_M$ pixel 100 (7, 10).

The G color filters 113 are formed in $G_L$ pixel 100 (7, 3) and $G_M$ pixel 100 (7, 4) and in $G_L$ pixel 100 (7, 7) and $G_M$ pixel 100 (7, 8). The B color filters 113 are formed in $B_L$ pixel 100 (7, 5) and $B_M$ pixel 100 (7, 6) and in $B_L$ pixel 100 (7, 9) and $B_M$ pixel 100 (7, 10).

Although not illustrated, in the cross section of the right light-shielding pixel 100R, the light-shielding portion 114 not only shields the right light-shielding pixel 100R from the adjacent pixels as in the left light-shielding pixel 100L, but is also extended toward the light incident surface. The incident surface of the light incident on the photodiode 112 is narrowed, and the right area of the right light-shielding pixel 100R is shielded. As a result, as illustrated in B of FIG. 17, the right area of the right light-shielding pixel 100R is shielded by the light-shielding portion 114 as viewed from the light incident side.

The second embodiment has been described. In the array pattern adopted in the second embodiment, the pixel groups 200 each including four pixels (shared pixels) of the same color are systematically arranged. In the case where the exposure time period is adjusted for each of the four pixels of the pixel groups 200, the light-shielding pixels are arranged for two pixels in the oblique direction (two pixels on the same diagonal) of the four pixels in the structure of the phase difference pixels included in the pixel groups 200.

In this way, the structure using the light-shielding pixels as phase difference pixels is adopted, and the sensitivity of the phase difference pixels is lower than in the first embodiment. However, the accumulation time period (exposure time period) of the pixels as light-shielding pixels does not have to be changed from the original structure, and there is an advantage that the CMOS image sensor 10 can be easily manufactured.

(3) Third Embodiment

Incidentally, in the 2×1 OCL structure described in the first embodiment, the $G_M$ pixel 100 is arranged in place of the lower right $B_S$ pixel 100 in the B pixel group 200, and the lower right $G_M$ pixel 100 of the B pixel group 200 and the lower left $G_M$ pixel 100 of the G pixel group 200 adjacent to and on the right of the lower right $G_M$ pixel 100 are configured as the phase difference pixel 100L and the phase difference pixel 100R.

In this case, the color filter of the lower right pixel 100 of the B pixel group 200 is the G color filter 113 instead of the B color filter 113, and the G pixel 100 is arranged in place of the B pixel 100.

Figure 19:
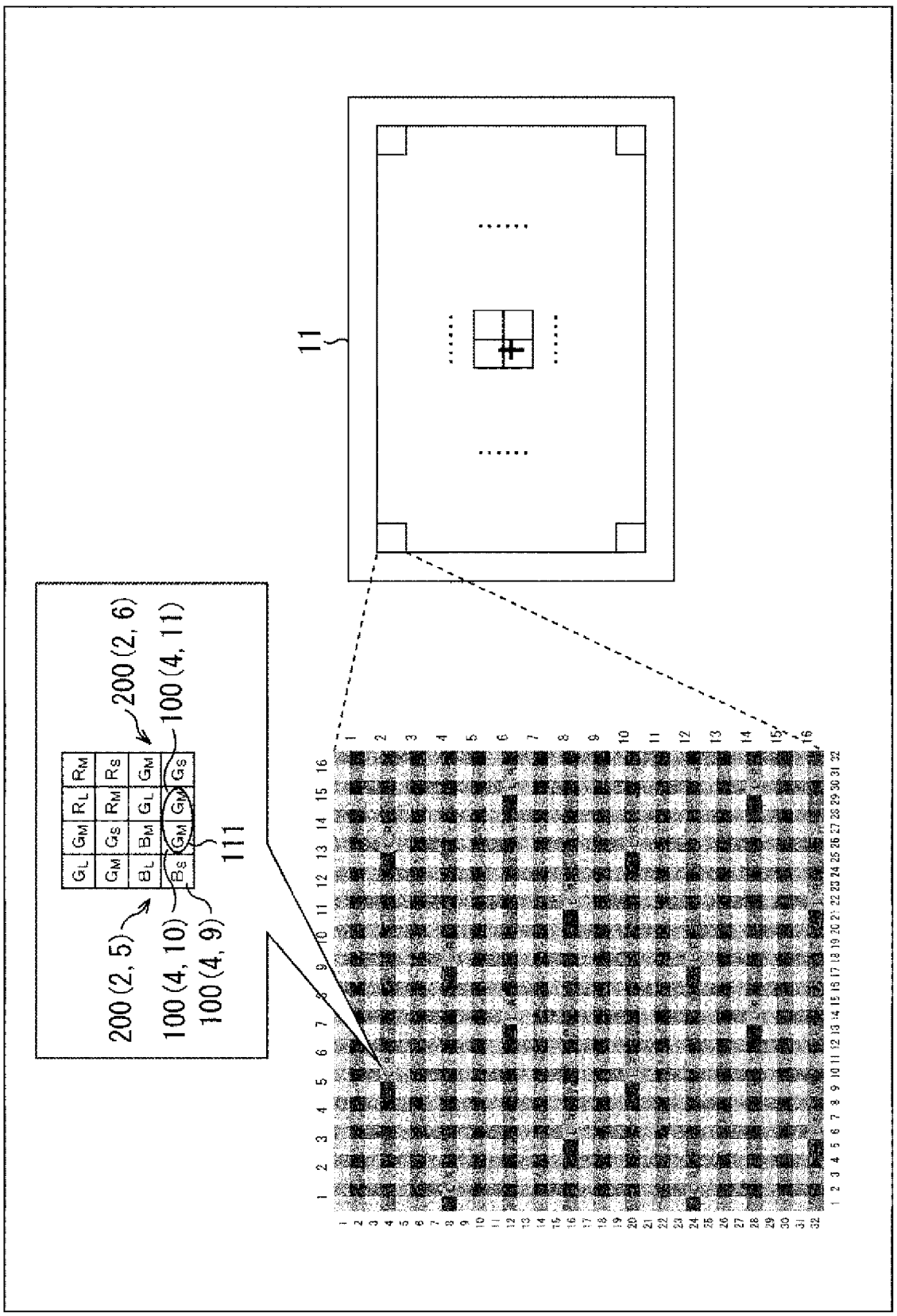
FIG. 19 depicts a plane layout of the plurality of pixels arranged in the pixel array unit.

Here, in the 2×1 OCL structure, $G_M$ pixel 100 (4, 10) is arranged in place of lower right $B_S$ pixel 100 (4, 10) in B pixel group 200 (2, 5) as illustrated in FIG. 19. Therefore, in the entire pixel array of the pixel array unit 11, the number of G pixels 100 is increased by one, and the number of B pixels 100 is decreased by one.

Furthermore, the G pixel 100 is also arranged in place of the B pixel 100 in, for example, B pixel group 200 (2, 13), B pixel group 200 (4, 1), B pixel group 200 (4, 9), B pixel group 200 (6, 7), B pixel group 200 (6, 15), B pixel group 200 (8, 3), B pixel group 200 (8, 11), B pixel group 200 (10, 5), B pixel group 200 (10, 13), B pixel group 200 (12, 1), B pixel group 200 (12, 9), B pixel group 200 (14, 7), B pixel group 200 (14, 15), B pixel group 200 (16, 3), and B pixel group 200 (16, 11).

Therefore, in the entire pixel array of the pixel array unit 11, the number of G pixels 100 is the largest, the number of R pixels 100 is the second largest, and the number of B pixels 100 is the smallest.

More specifically, the pixel array is the Bayer array in the pixel array unit 11, and the G pixel groups 200 (2×2 pixels) are arranged in a checkered pattern. The R pixel groups 200 (2×2 pixels) and the B pixel groups 200 (2×2 pixels) are alternately arranged column by column in the remaining part. Therefore, the number of R pixels 100 and the number of B pixels 100 are the same, and the number of G pixels 100 is twice the number. As a result, the number of B pixels 100 is smaller than the number of R pixels 100 when the G pixels 100 are arranged in place of the B pixels 100.

Here, in the case of arranging normal pixels in the Bayer array, the G color filters can be formed first to prevent (or alternatively, mitigate) the color filter formed on each pixel from being easily peeled off when the color filter is formed in each pixel.

In the 2×1 OCL structure according to the present technique, the G color filters 113 can also be formed first to prevent (or alternatively, mitigate) the color filter 113 formed on each pixel 100 from being easily peeled off in the case of forming the color filters 113. In this case, the color filters to be formed after the G color filters 113 can be, for example, the R color filters 113 and the B color filters 113 in descending order of pixels.

Figure 20:
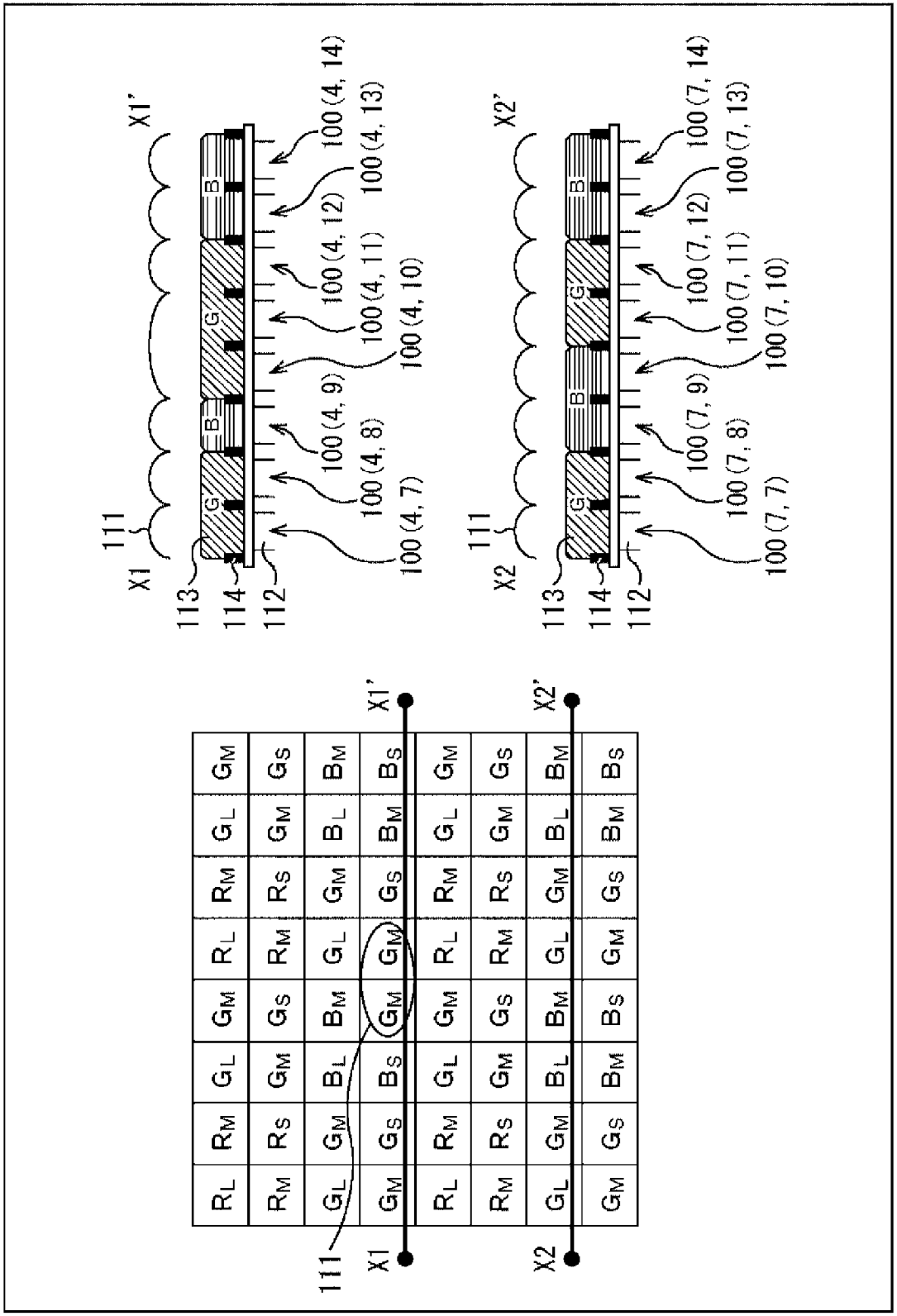
FIG. 20 is a cross-sectional view illustrating a structure of the plurality of pixels arranged in the pixel array unit.

FIG. 20 depicts a cross-sectional view illustrating a structure of the plurality of pixels 100 arranged in the pixel array unit 11 of FIG. 19. In FIG. 20, while the X1-X1' cross section includes the phase difference pixels 100L and 100R, the X2-X2' cross section does not include the phase difference pixels 100L and 100R.

Here, the color filters 113 are formed in the following order as illustrated in the X1-X1' cross section and the X2-X2' cross section of FIG. 20.

First, the G color filters 113 are formed in the G pixels 100, such as in $G_M$ pixel 100 (4, 7) and $G_S$ pixel 100 (4, 8), in $G_M$ pixel 100 (4, 10), $G_M$ pixel 100 (4, 11), and $G_S$ pixel 100 (4, 12), in $G_L$ pixel 100 (7, 7) and $G_M$ pixel 100 (7, 8), and in $G_L$ pixel 100 (7, 11) and $G_M$ pixel 100 (7, 12).

Next, the R color filters 113 are formed in the R pixels 100.

Lastly, the B color filters 113 are formed in the B pixels 100, such as in $B_S$ pixel 100 (4, 9), in $B_M$ pixel 100 (4, 13) and $B_S$ pixel 100 (4, 14), in $B_L$ pixel 100 (7, 9) and $B_M$ pixel 100 (7, 10), and in $B_L$ pixel 100 (7, 13) and $B_M$ pixel 100 (7, 14).

The step (manufacturing method including the step) of forming the color filters 113 in the pixel array including the pixels of the 2×1 OCL structure of the first embodiment has been described in the third embodiment. In the third embodiment, the color filters 113 are formed in the order of, for example, the G color filters 113, the R color filters 113, and the B color filters 113, and the G color filters 113 are formed first in the step of forming the color filters 113 in the pixel array including the pixels of the 2×1 OCL structure. This can prevent (or alternatively, mitigate) the color filters 113 from being easily peeled off.

(4) Fourth Embodiment

Incidentally, although the phase difference pixels 100L and 100R are provided in the 2×1 OCL structure in the pixel array described in the first embodiment, structures other than the 2×1 OCL structure may be adopted. Here, examples of the structures that can be adopted include a structure of providing one on-chip lens 111 for four (2×2) pixels (photodiodes 112 of the pixels) included in each pixel group 200 (hereinafter, also referred to as 2×2 OCL structure) and a structure of lining up the 2×1 OCL structures in the row direction (hereinafter, also referred to as 2×1 OCL×2 structure).

Therefore, the cases of adopting the 2×2 OCL structure and the 2×1 OCL×2 structure as examples of the other structures of the phase difference pixels 100L and 100R will be described in a fourth embodiment.

(2×2 OCL Structure)

Figure 21:
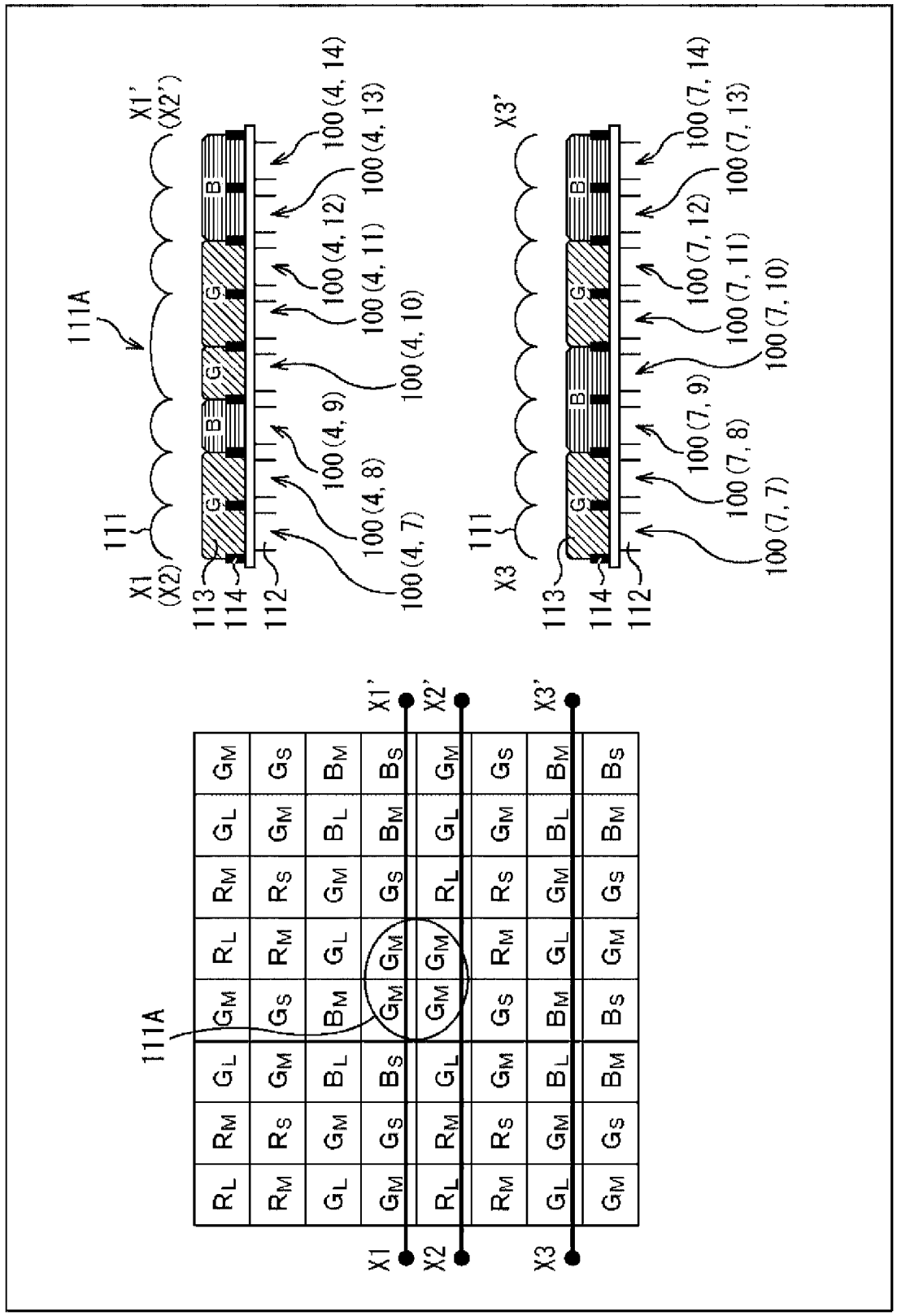
FIG. 21 depicts another structure of the plurality of pixels arranged in the pixel array unit.

FIG. 21 depicts another structure of the plurality of pixels 100 arranged in the pixel array unit 11 of FIG. 1.

FIG. 21 illustrates a plane layout of the plurality of pixels 100 on the left side of FIG. 21 and illustrates cross sections of the plurality of pixels 100 on the right side of FIG. 21. Note that in FIG. 21, the arrangement position of the upper left pixel 100 is expressed as pixel (1, 7) as in FIG. 4.

Here, the 2×2 OCL structure is adopted as a structure of the phase difference pixels 100L and 100R, and one on-chip lens 111A is provided on four pixels including $G_M$ pixel 100 (4, 10) of B pixel group 200 (2, 5), $G_M$ pixel 100 (4, 11) of G pixel group 200 (2, 6), $G_M$ pixel 100 (5, 10) of G pixel group 200 (3, 5), and $G_M$ pixel 100 (5, 11) of R pixel group 200 (3, 6).

FIG. 21 illustrates an X1-X1' cross section of the pixels 100 of the fourth row and an X2-X2' cross section of the pixels 100 of the fifth row as cross sections of the pixel groups 200 including the phase difference pixels 100L and 100R. FIG. 21 also illustrates an X3-X3' cross section of the pixels 100 of the seventh row as a cross section of the pixel group 200 not including the phase difference pixels 100L and 100R.

As illustrated in the X1-X1' cross section of FIG. 21, the G color filters 113 are formed in $G_M$ pixel 100 (4, 7) and $G_S$ pixel 100 (4, 8), in $G_M$ pixel 100 (4, 10), and in $G_M$ pixel 100 (4, 11) and $G_S$ pixel 100 (4, 12), and the B color filters 113 are formed in $B_S$ pixel 100 (4, 9) and in $B_M$ pixel 100 (4, 13) and $B_S$ pixel 100 (4, 14).

That is, although the B color filter 113 is supposed to be formed to configure the $B_S$ pixel 100 because $G_M$ pixel 100 (4, 10) is included in B pixel group 200 (2, 5), the G color filter 113 is formed here to change the arrangement of the contact to configure the $G_M$ pixel 100.

Note that lower left $B_M$ pixel 100 (4, 9) is changed to $B_S$ pixel 100 (4, 9) in B pixel group 200 (2, 5), and the four pixels include the short-accumulation pixel (S) along with the long-accumulation pixel (L) and the medium-accumulation pixels (M).

Furthermore, in the X2-X2' cross section of FIG. 21, the R color filters 112 are formed in $R_L$ pixel 100 (5, 7) and $R_M$ pixel 100 (5, 8) and in $R_L$ pixel 100 (5, 12), and the G color filters 113 are formed in $G_L$ pixel 100 (5, 9) and $G_M$ pixel 100 (5, 10), in $G_M$ pixel 100 (5, 11), and in $G_L$ pixel 100 (5, 13) and $G_M$ pixel 100 (5, 14).

That is, although the R color filter 113 is supposed to be formed to configure the $R_L$ pixel 100 because $G_M$ pixel 100 (5, 11) is included in R pixel group 200 (3, 6), the G color filter 113 is formed here to change the arrangement of the contact to configure the $G_M$ pixel 100.

Note that upper right $R_M$ pixel 100 (5, 12) is changed to $R_L$ pixel 100 (5, 12) in R pixel group 200 (3, 6), and the four pixels include the long-accumulation pixel (L) along with the short-accumulation pixel (S) and the medium-accumulation pixels (M).

In this way, the photodiode $112L_U$ provided on lower right $G_M$ pixel 100 (4, 10) of B pixel group 200 (2, 5), the photodiode $112 R_U$ provided on lower left $G_M$ pixel 100 (4, 11) of G pixel group 200 (2, 6), the photodiode $112L_D$ provided on upper right $G_M$ pixel 100 (5, 10) of G pixel group 200 (3, 5), and the photodiode $112R_D$ provided on upper left $G_M$ pixel 100 (5, 11) of R pixel group 200 (3, 6) are provided for one on-chip lens 111A to configure the 2×2 OCL structure.

Furthermore, $G_M$ pixel 100 (4, 10) and $G_M$ pixel 100 (5, 10) are configured as the phase difference pixels 100L, and $G_M$ pixel 100 (4, 11) and $G_M$ pixel 100 (5, 11) are configured as the phase difference pixels 100R in the pixel array unit 11. Therefore, the phase difference between two images can be detected on the basis of the pixel signals obtained from the phase difference pixels 100L and 100R.

Note that the X3-X3' cross section illustrated in FIG. 21 is similar to the X2-X2' cross section illustrated in FIG. 4, and the description will not be repeated here.

(2×1 OCL×2 Structure)

Figure 22:
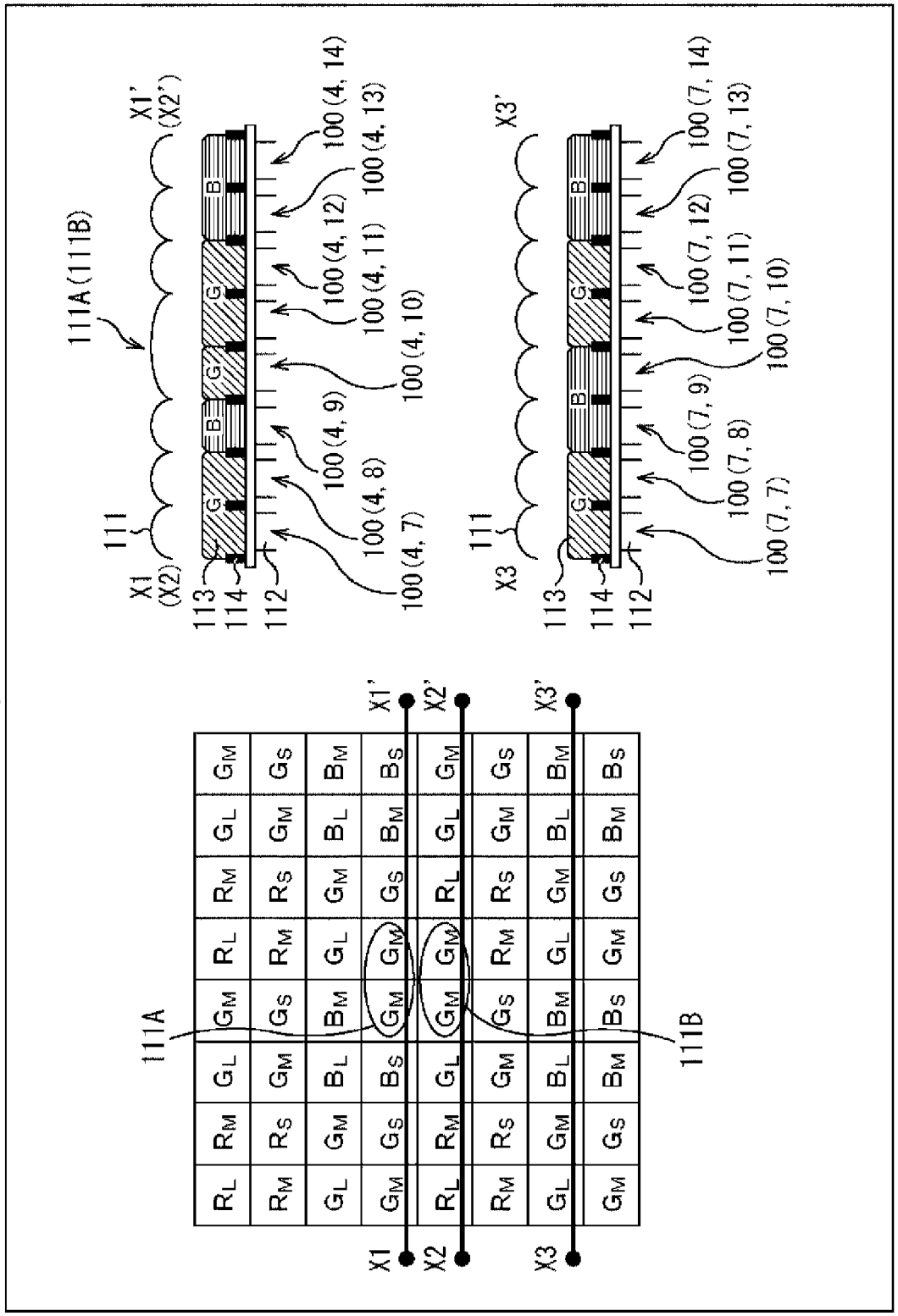
FIG. 22 depicts yet another structure of the plurality of pixels arranged in the pixel array unit.

FIG. 22 depicts yet another structure of the plurality of pixels 100 arranged in the pixel array unit 11 of FIG. 1.

FIG. 22 illustrates a plane layout of the plurality of pixels 100 on the left side of FIG. 22 and illustrates cross sections of the plurality of pixels 100 on the right side of FIG. 22 as in FIG. 21.

Here, the 2×1 OCL×2 structure is adopted as a structure of the phase difference pixels 100L and 100R, and one on-chip lens 111A is provided for two pixels including $G_M$ pixel 100 (4, 10) of B pixel group 200 (2, 5) and $G_M$ pixel 100 (4, 11) of G pixel group 200 (2, 6). In the column below the on-chip lens 111A, one on-chip lens 111B is further provided for two pixels including $G_M$ pixel 100 (5, 10) of G pixel group 200 (3, 5) and $G_M$ pixel 100 (5, 11) of R pixel group 200 (3, 6).

FIG. 22 illustrates an X1-X1' cross section of the pixels 100 of the fourth row and an X2-X2' cross section of the pixels 100 of the fifth row as cross sections of the pixel groups 200 including the phase difference pixels 100L and 100R. FIG. 22 also illustrates an X3-X3' cross section of the pixels 100 of the seventh row as a cross section of the pixel groups 200 not including the phase difference pixels 100L and 100R.

Although the X1-X1' cross section and the X2-X2' cross section illustrated in FIG. 22 have structures similar to the X1-X1' cross section and the X2-X2' cross section illustrated in FIG. 21, the photodiode 112L provided on lower right $G_M$ pixel 100 (4, 10) of B pixel group 200 (2, 5) and the photodiode 112R provided on lower left $G_M$ pixel 100 (4, 11) of G pixel group 200 (2, 6) are provided for one on-chip lens 111A to configure the upper 2×1 OCL structure in FIG. 22.

Furthermore, the photodiode 112L provided on upper right $G_M$ pixel 100 (5, 10) of G pixel group 200 (3, 5) and the photodiode 112R provided on upper left $G_M$ pixel 100 (5, 11) of R pixel group 200 (3, 6) are provided on one on-chip lens 111B to configure the lower 2×1 OCL structure in FIG.

22. The upper 2×1 OCL structure and the lower 2×1 OCL structure configure the 2×1 OCL×2 structure.

In addition, upper $G_M$ pixel 100 (4, 10) and lower $G_M$ pixel 100 (5, 10) are configured as the phase difference pixels 100L, and upper $G_M$ pixel 100 (4, 11) and lower $G_M$ pixel 100 (5, 11) are configured as the phase difference pixels 100R in the pixel array unit 11. Therefore, the phase difference between two images can be detected on the basis of the pixel signals obtained from the phase difference pixels 100L and 100R.

Note that the X3-X3' cross section illustrated in FIG. 22 is similar to the X2-X2' cross section illustrated in FIG. 4, and the description will not be repeated here.

(Example of Reading of Pixels)

Next, an example of reading of the pixels 100 in the case of adopting the 2×2 OCL structure illustrated in FIG. 21 will be described with reference to FIGS. 23 and 24.

Figure 23:
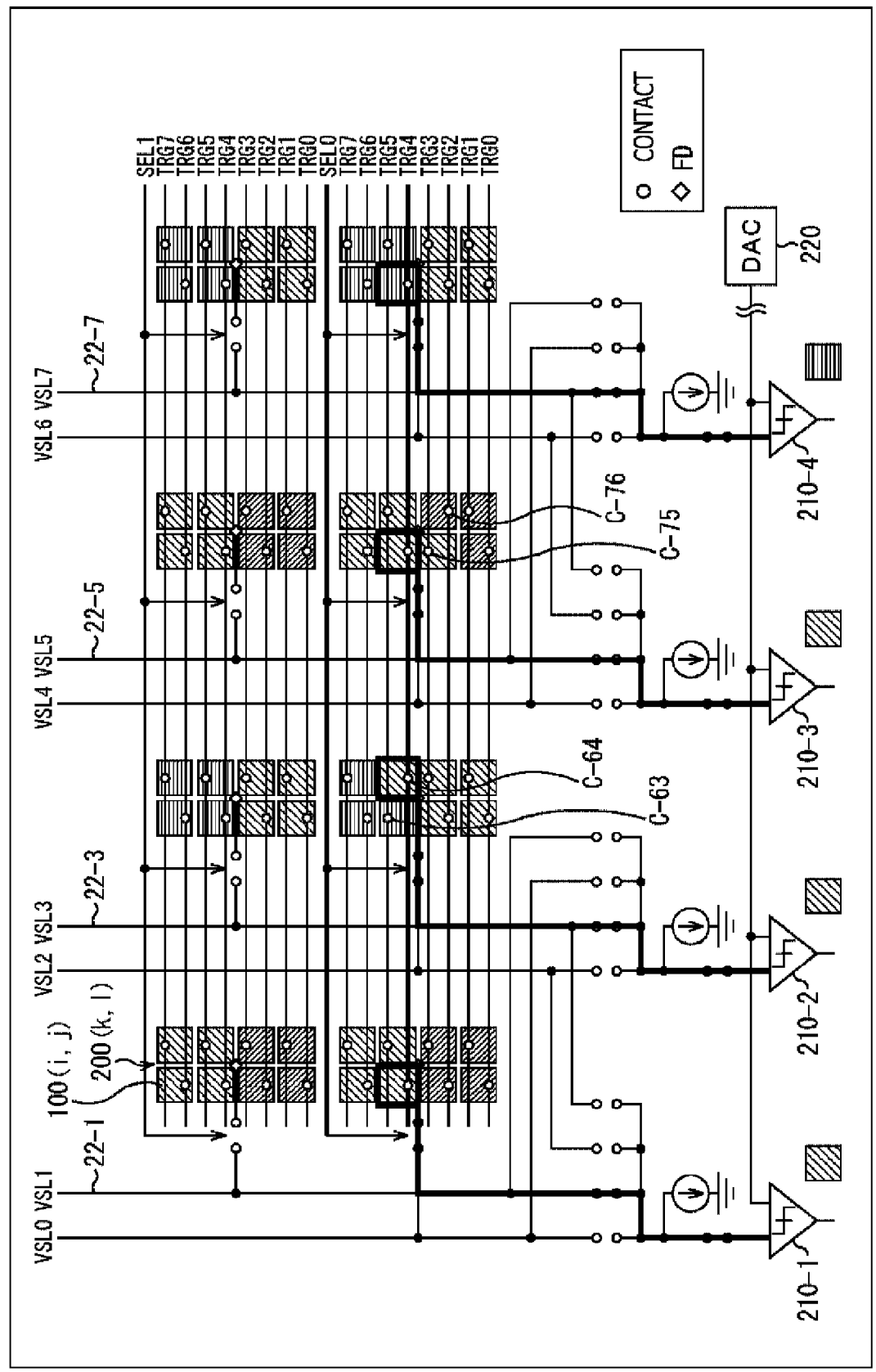
FIG. 23 is a circuit diagram illustrating a first connection mode of four pixels included in the pixel group.

FIG. 23 illustrates an area of part of the pixel area arranged in the pixel array unit 11 as in FIG. 5, and the pixel group 200 includes four pixels 100. Although the arrangement position of the upper left pixel 100 is expressed as pixel (1, 1) in FIG. 23 in accordance with the description of FIG. 5, FIG. 23 corresponds to the pixel array of the case of adopting the 2×2 OCL structure illustrated in FIG. 21.

In FIG. 23, four pixels 100 included in the pixel group 200 share the floating diffusion area FD as in FIG. 5, and the drive signals (TRG, SEL) for the transfer transistors TR-Tr and the selection transistors SEL-Tr are supplied from the vertical drive circuit 12 (FIG. 1).

Since the 2×2 OCL structure is adopted here in FIG. 23 instead of the 2×1 OCL structure, not only lower right $B_S$ pixel 100 (6, 4) of B pixel group 200 (3, 2), but also upper left $R_L$ pixel 100 (7, 5) of R pixel group 200 (4, 3) is configured as the $G_M$ pixel 100. Note that the lower left B pixel 100 is $B_S$ pixel 100 (6, 3) in B pixel group 200 (3, 2). Furthermore, the upper right R pixel 100 is $R_L$ pixel 100 (7, 6) in R pixel group 200 (4, 3).

Therefore, contact C-63 of lower left $B_S$ pixel 100 (6, 3) is connected to drive line TRG5 instead of drive line TRG4, and contact C-64 of lower right $G_M$ pixel 100 (6, 4) is connected to drive line TRG4 instead of drive line TRG5 in B pixel group 200 (3, 2). In addition, contact C-75 of upper left $G_M$ pixel 100 (7, 5) is connected to drive line TRG3 instead of drive line TRG2, and contact C-76 of upper right $R_L$ pixel 100 (7, 6) is connected to drive line TRG2 instead of drive line TRG3 in R pixel group 200 (4, 3).

The contacts C can be arranged in this way (the contacts C can be reconstructed) to drive the pixels 100 on the basis of the type of exposure in the pixel groups 200 of the third row and the fourth row including the phase difference pixels 100L and 100R of the 2×2 OCL structure.

More specifically, in FIG. 23, drive signal SEL1 enters the L level, and the selection transistor SEL-Tr shared by the pixel groups 200 of the first row and the second row enters the off-state. On the other hand, drive signal SEL0 enters the H level, and the selection transistor SEL-Tr shared by the pixel groups 200 of the third row and the fourth row enters the on-state. In this way, the pixel groups 200 of the third row or the fourth row are selected.

In this case, as illustrated in FIG. 23, only drive signal TRG4 of drive signals TRG0 to TRG7 is in the H level, and each transfer transistor TR-Tr of $G_M$ pixel 100 (6, 1) of G pixel group 200 (3, 1) of the first column, $G_M$ pixel 100 (6, 4) of B pixel group 200 (3, 2) of the second column, $G_M$ pixel 100 (6, 5) of G pixel group 200 (3, 3) of the third column, and $B_M$ pixel 100 (6, 7) of B pixel group 200 (3, 4) of the fourth column among the four pixels included in the pixel groups 200 of the third row enters the on-state.

In this way, the charge generated by each photodiode 112 of $G_M$ pixel 100 (6, 1), $G_M$ pixel 100 (6, 4), $G_M$ pixel 100 (6, 5), and $B_M$ pixel 100 (6, 7) surrounded by thick frames in FIG. 23 is transferred to the corresponding floating diffusion area FD. In this case, all $G_M$ pixel 100 (6, 1), $G_M$ pixel 100 (6, 4), $G_M$ pixel 100 (6, 5), and $B_M$ pixel 100 (6, 7) are medium-accumulation pixels (M) and can be driven by the same drive signal TRG4.

As a result, the charge accumulated in the photodiode 112 of $G_M$ pixel 100 (6, 4) configured as phase difference pixel 100L (6, 4) and the charge accumulated in the photodiode 112 of $G_M$ pixel 100 (6, 5) configured as phase difference pixel 100R (6, 5) are read.

Figure 24:
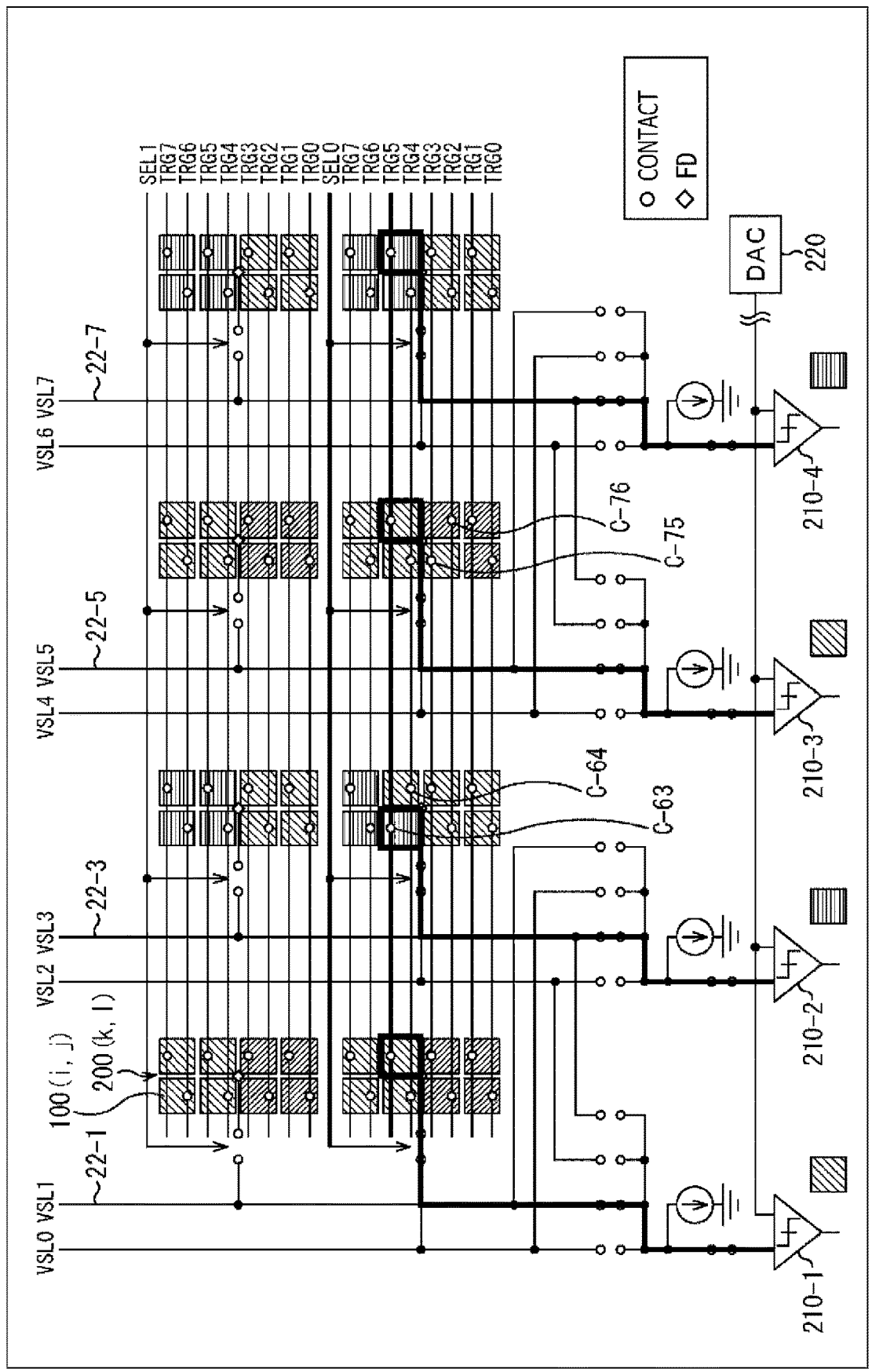
FIG. 24 is a circuit diagram illustrating a second connection mode of four pixels included in the pixel group.

Subsequently, as illustrated in FIG. 24, the drive signal TRG in the H level is switched from TRG4 to TRG5, and each transfer transistor TR-Tr of $G_S$ pixel 100 (6, 2) of G pixel group 200 (3, 1) of the first column, $B_S$ pixel 100 (6, 3) of B pixel group 200 (3, 2) of the second column, $G_S$ pixel 100 (6, 6) of G pixel group 200 (3, 3) of the third column, and $B_S$ pixel 100 (6, 8) of B pixel group 200 (3, 4) of the fourth column among the four pixels of the pixel groups 200 of the third row enters the on-state.

In this way, the charge generated by each photodiode 112 of $G_S$ pixel 100 (6, 2), $B_S$ pixel 100 (6, 3), $G_S$ pixel 100 (6, 6), and $B_S$ pixel 100 (6, 8) surrounded by thick frames in FIG. 24 is transferred to the corresponding floating diffusion area FD. In this case, all $G_S$ pixel 100 (6, 2), $B_S$ pixel 100 (6, 3), $G_S$ pixel 100 (6, 6), and the $B_S$ pixel 100 (6, 8) are short-accumulation pixels (S) and can be driven by the same drive signal TRG5.

Similarly, drive signals TRG6 and TRG7 are sequentially switched to the H level, and the charge is read from the photodiodes of four pixels included in each pixel group 200 of the third row, and the charge is transferred to the floating diffusion area FD shared by the four pixels. Furthermore, the charge transferred from each of the photodiodes 112 of the four pixels is added in the floating diffusion area FD, and the voltage according to the added charge is input to the amplifier transistor AMP-Tr. The subsequent process executed by the column signal processing circuit 13 is similar to the details described above with reference to FIGS. 8 to 10, and the description will not be repeated here.

Furthermore, although not illustrated, only drive signal TRG2 of drive signals TRG0 to TRG7 similarly enters the H level, and each transfer transistor TR-Tr of $R_L$ pixel 100 (7, 1) of R pixel group 200 (4, 1) of the first column, $G_L$ pixel 100 (7, 3) of G pixel group 200 (4, 2) of the second column, $R_L$ pixel 100 (7, 6) of R pixel group 200 (4, 3) of the third column, and $G_L$ pixel 100 (7, 7) of G pixel group 200 (4, 4) of the fourth column among the four pixels included in the pixel groups 200 of the fourth row enters the on-state.

In this way, the charge generated by each photodiode 112 of $R_L$ pixel 100 (7, 1), $G_L$ pixel 100 (7, 3), $R_L$ pixel 100 (7, 6), and $G_L$ pixel 100 (7, 7) is transferred to the corresponding floating diffusion area FD. In this case, all $R_L$ pixel 100 (7, 1), $G_L$ pixel 100 (7, 3), $R_L$ pixel 100 (7, 6), and $G_L$ pixel 100 (7, 7) are long-accumulation pixels (L) and can be driven by the same drive signal TRG2.

Subsequently, although not illustrated, the drive signal TRG in the H level is similarly switched from TRG2 to TRG3, and each transfer transistor TR-Tr of $R_M$ pixel 100 (7, 2) of R pixel group 200 (4, 1) of the first column, $G_M$ pixel 100 (7, 4) of G pixel group 200 (4, 2) of the second column, $G_M$ pixel 100 (7, 5) of R pixel group 200 (4, 3) of the third column, and $G_M$ pixel 100 (7, 8) of G pixel group 200 (4, 4)

of the fourth column among the four pixels included in the pixel groups 200 of the fourth row enters the on-state.

In this way, the charge generated by each photodiode 112 of $R_M$ pixel 100 (7, 2), $G_M$ pixel 100 (7, 4), $G_M$ pixel 100 (7, 5), and $G_M$ pixel 100 (7, 8) is transferred to the corresponding floating diffusion area FD. In this case, all of $R_M$ pixel 100 (7, 2), $G_M$ pixel 100 (7, 4), $G_M$ pixel 100 (7, 5), and $G_M$ pixel 100 (7, 8) are medium-accumulation pixels (M) and can be driven by the same drive signal TRG3.

Although the examples of reading the pixels 100 in the case of adopting the 2×2 OCL structure illustrated in FIG. 21 are described in FIGS. 23 and 24, the pixels 100 can also be similarly read in the case of adopting the 2×1 OCL×2 structure illustrated in FIG. 22.

3. Modifications (Another Example of Exposure Time Period)

In the cases described above, the exposure time period is adjusted on the basis of three types of exposure, that is, three stages including T1, T2, and T3, and the long-accumulation pixel signals, the medium-accumulation pixel signals, and the short-accumulation pixel signals are obtained. However, the number of stages in the adjustment of the exposure time period is not limited to three as long as there are two or more stages. For example, the adjustment may be made on the basis of two types of exposure, that is, two stages including T1 and T3, and the long-accumulation pixel signals and the short-accumulation pixel signals may be obtained.

Figure 25:
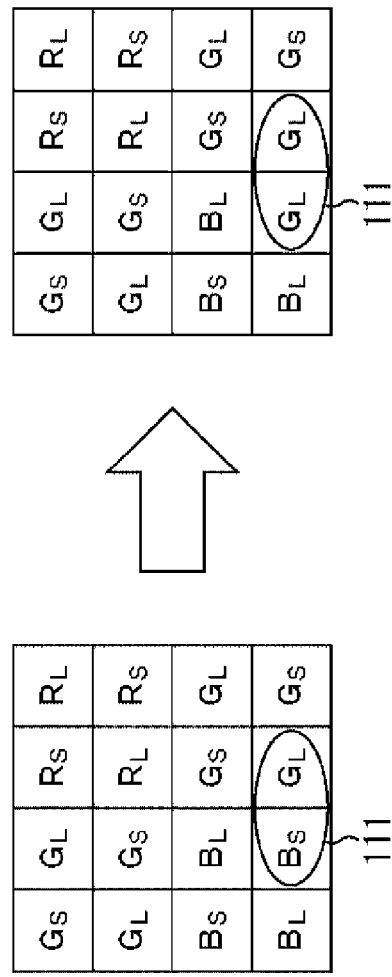
FIG. 25 depicts a configuration of arranging the phase difference pixels in adjacent pixel groups in a case of two types of exposure.

FIG. 25 depicts an example of configuration of arranging the phase difference pixel 100L and the phase difference pixel 100R on adjacent pixel groups 200 in the case of two types of exposure.

There are two types of exposure in FIG. 25, and the four pixels (2×2 pixels) of the pixel groups 200 arranged in the Bayer array include two long-accumulation pixels (L) and two short-accumulation pixels (S) arranged on the same diagonals.

Here, in a case where one on-chip lens 111 is provided for the photodiode 112 of the lower right $B_S$ pixel 100 included in the lower left B pixel group 200 and the photodiode 112 of the lower left $G_L$ pixel 100 included in the lower right G pixel group 200 as illustrated in A of FIG. 25, the structure is as illustrated in B of FIG. 25.

More specifically, the color filter of the lower right $B_S$ pixel 100 included in the lower left B pixel group 200 is set to the G color filter 113 instead of the B color filter 113 at the manufacturing, and the $G_L$ pixel 100 is formed. Furthermore, although the B s pixel 100 is a short-accumulation pixel (S) here, the arrangement of the contact C is changed in the $G_L$ pixel 100 for example, and the exposure time period is set to the long-accumulation exposure time period to form a long-accumulation pixel (M).

As a result, the $G_L$ pixel 100 included in the lower left B pixel group 200 and the $G_L$ pixel 100 included in the lower right G pixel group 200 are provided as the pixels 100 including the photodiodes provided on one on-chip lens 111, and the $G_L$ pixels 100 include the G color filters 113 and have the long-accumulation exposure time period. Therefore, the $G_L$ pixels 100 can be configured as the phase difference pixel 100L and the phase difference pixel 100R.

In the configuration described here, although there are two types of exposure instead of three types of exposure in the case of the 2×1 OCL structure described in the first embodiment, the case of the structure of the light-shielding pixels described in the second embodiment is similarly not limited to three types of exposure, and there can be, for example, two types of exposure.

Figure 26:
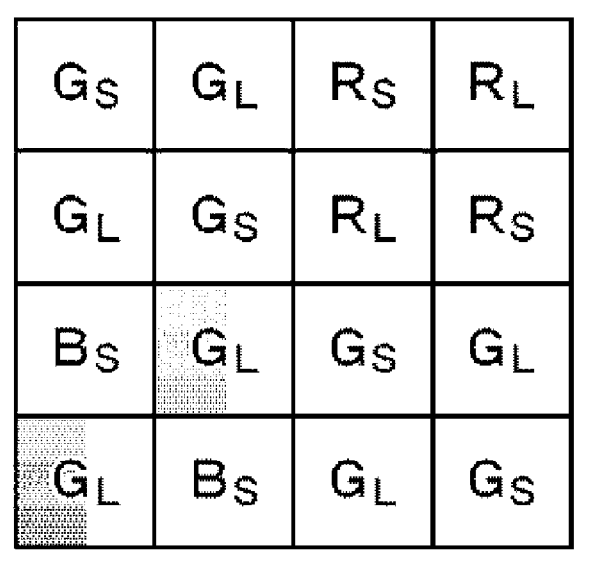

FIG. 26 depicts a configuration of arranging the light-shielding pixels on the pixel groups 200 in the case of two types of exposure.

There are two types of exposure in FIG. 26, and the four pixels (2×2 pixels) of the pixel groups 200 arranged in the Bayer array include two long-accumulation pixels (L) and two short-accumulation pixels (S) arranged on the same diagonals.

Here, in a case where the upper right and lower left $B_L$ pixels 100 included in the lower left B pixel group 200 are the left light-shielding pixels 100L, the structure is as illustrated in FIG. 26.

More specifically, the color filters of the upper right and lower left $B_L$ pixels 100 included in the lower left B pixel group 200 are set to the G color filters 113 instead of the B color filters 113 at the manufacturing, and the $G_L$ pixels 100 are formed. In this case, the $G_L$ pixels 100 are long-accumulation pixels (L) similarly to the $B_L$ pixels 100, and the exposure time period does not have to be adjusted.

In this way, the left areas of the $G_L$ pixels 100 arranged on the upper right and the lower left of the lower left B pixel group 200 are shielded as viewed from the light incident side, and the $G_L$ pixels 100 are configured as left light-shielding pixels 100L. As a result, the upper right and lower left $G_L$ pixels 100 of the four pixels of the lower left B pixel group 200 are left light-shielding pixels 100L.

Although the case of arranging the left light-shielding pixels 100L on the B pixel group 200 is described here, the right light-shielding pixels 100R can be similarly arranged in place of, for example, the $B_L$ pixels 100 arranged on the upper right and the lower left of the B pixel group 200.

(Example of Another Configuration of Phase Difference Pixels)

In the case illustrated in the first embodiment, the phase difference pixel 100L and the phase difference pixel 100R are included in the adjacent B pixel group 200 and G pixel group 200 in the 2×1 OCL structure of the pixel array unit 11 in FIG. 2. However, the phase difference pixel 100L and the phase difference pixel 100R may be included in other pixel groups 200. For example, the phase difference pixel 100L and the phase difference pixel 100R can be included in the adjacent R pixel group 200 and G pixel group 200 in addition to the adjacent B pixel group 200 and G pixel group 200.

Figure 27:
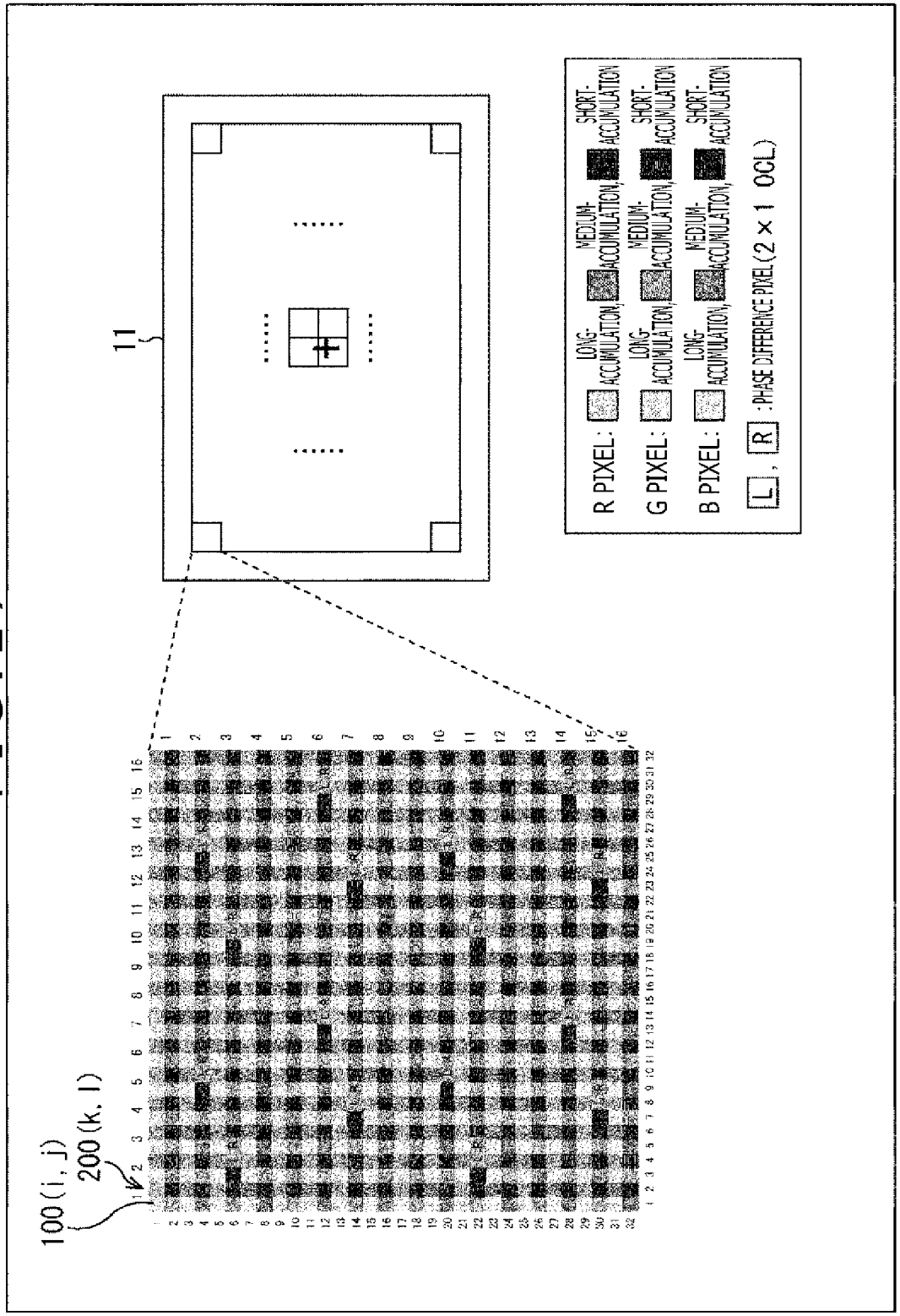
FIG. 27 depicts an example of configuration of arranging the phase difference pixels in adjacent B and G pixel groups and in adjacent R and G pixel groups.

FIG. 27 depicts an example of configuration when the phase difference pixel 100L and the phase difference pixel 100R are arranged in the adjacent R pixel group 200 and G pixel group 200, respectively, in addition to the adjacent B pixel group 200 and G pixel group 200.

FIG. 27 illustrates the pixels 100 in the area of 32 rows and 32 columns arranged in the upper left area as viewed from the light incident side among the plurality of pixels 100 two-dimensionally arranged in the pixel array unit 11 as in FIG. 2.

In the pixel array unit 11 of FIG. 27, the following are combinations of the B pixel group 200 and the G pixel group 200 in which the lower right phase difference pixel 100L of the B pixel group 200 and the lower left phase difference pixel 100R of the G pixel group 200 have the 2×1 OCL structure.

That is, each combination of B pixel group 200 (2, 5) and G pixel group 200 (2, 6), B pixel group 200 (2, 13) and G pixel group 200 (2, 14), B pixel group 200 (6, 7) and G pixel group 200 (6, 8), B pixel group 200 (6, 15) and G pixel group 200 (6, 16), B pixel group 200 (10, 5) and G pixel group 200 (10, 6), B pixel group 200 (10, 13) and G pixel group 200 (10, 14), B pixel group 200 (14, 7) and G pixel group 200 (14, 8), and B pixel group 200 (14, 15) and G pixel group 200 (14, 16) has the 2×1 OCL structure.

In these B pixel groups 200, the $G_M$ pixel 100 is arranged in place of the lower right $B_S$ pixel 100, and the lower right $G_M$ pixel 100 of the B pixel group 200 and the lower left $G_M$ pixel 100 of the G pixel group 200 adjacent to and on the right of the lower right $G_M$ pixel 100 are configured as the phase difference pixel 100L and the phase difference pixel 100R.

Furthermore, in the pixel array unit 11 of FIG. 27, the following are combinations of the R pixel group 200 and the G pixel group 200 in which the lower right phase difference pixel 100L of the R pixel group 200 and the lower left phase difference pixel 100R of the G pixel group 200 have the 2×1 OCL structure.

That is, each combination of R pixel group 200 (3, 2) and G pixel group 200 (3, 3), R pixel group 200 (3, 10) and G pixel group 200 (3, 11), R pixel group 200 (7, 4) and G pixel group 200 (7, 5), R pixel group 200 (7, 12) and G pixel group 200 (7, 13), R pixel group 200 (11, 2) and G pixel group 200 (11, 3), R pixel group 200 (11, 10) and G pixel group 200 (11, 11), R pixel group 200 (15, 4) and G pixel group 200 (15, 5), and R pixel group 200 (15, 12) and G pixel group 200 (15, 13) has the 2×1 OCL structure.

In these R pixel groups 200, the $G_M$ pixel 100 is arranged in place of the lower right $R_S$ pixel 100, and the lower right $G_M$ pixel 100 of the R pixel group 200 and the lower left $G_M$ pixel 100 of the G pixel group 200 adjacent to and on the right of the lower right $G_M$ pixel 100 are configured as the phase difference pixel 100L and the phase difference pixel 100R.

Note that the array patterns of the pixel array unit 11 illustrated in FIG. 2, FIG. 27, or the like are examples of the arrangement of the phase difference pixels 100L and the phase difference pixels 100R scattered and arranged in a repeated pattern in the first embodiment, and the phase difference pixels 100L and the phase difference pixels 100R may be arranged in other patterns as long as a plurality of phase difference pixels 100L and phase difference pixels 100R are arranged side by side at constant intervals. In addition, although the case of systematically arranging the color pixel groups 200 in the Bayer array in the pixel array unit 11 is described in the example of the first embodiment, other array patterns may be adopted.

In addition, although the phase difference pixel 100L and the phase difference pixel 100R in the 2×1 OCL structure are adjusted to the same exposure time period, that is, the medium-accumulation exposure time period, in the description of the first embodiment, the phase difference pixel 100L and the phase difference pixel 100R may be adjusted to other exposure time periods, such as long-accumulation and short-accumulation. Furthermore, although it is preferable that the exposure time periods of the phase difference pixel 100L and the phase difference pixel 100R be the same, the exposure time periods may not be the same.

In the case illustrated in the second embodiment, part of the pixels of B pixel group 200 (for example, upper right and lower left pixels of the four pixels) are replaced with the left light-shielding pixels 100L or the right light-shielding pixels 100R in the structure of the light-shielding pixels in the pixel array unit 11 of FIG. 16. However, part of the pixels of the R pixel group 200 or the G pixel group 200 may be replaced with the left light-shielding pixels 100L or the right light-shielding pixels 100R.

Furthermore, the left light-shielding pixel 100L and the right light-shielding pixel 100R may be arranged on the pixel groups 200 of different colors instead of the pixel groups 200 of the same color. For example, in a case where the left light-shielding pixel 100L is arranged as part of the pixels of the B pixel group 200, the right light-shielding pixel 100R may be arranged as part of the pixels of the G pixel group 200.

Note that the array pattern of the pixel array unit 11 illustrated in FIG. 16 is an example of the arrangement of the left light-shielding pixels 100L and the right light-shielding pixels 100R scattered and arranged in the repeated pattern in the second embodiment, and the left light-shielding pixels 100L and the right light-shielding pixels 100R may be arranged in other patterns as long as a plurality of left light-shielding pixels 100L and right light-shielding pixels 100R are arranged side by side at constant intervals. In addition, although the case of systematically arranging the color pixel groups 200 in the Bayer array in the pixel array unit 11 is described in the example of the second embodiment, other array patterns may be adopted.

(Other Example of Phase Difference Pixels)

Note that in the description above, the phase difference pixel 100L and the phase difference pixel 100R that are two (2×1) pixels included in each of the left and right pixel groups 200 adjacent to each other are described as the 2×1 OCL structure, the 2×2 OCL structure, or the 2×1 OCL×2 structure. However, the two pixels configured as the phase difference pixels are not limited to the combination of the left and right pixels 100 adjacent to each other in the row direction.

For example, there can be a combination of a phase difference pixel 100U and a phase difference pixel 100D that are two (1×2) pixels included in each of the pixel groups 200 adjacent to each other above and below in the column direction. In this case, the photodiode 112 of the phase difference pixel 100U and the photodiode 112 of the phase difference pixel 100D are provided on one on-chip lens 111 in the structure (it is, so to speak, a 1×2 OCL structure).

(Another Example of Light-Shielding Pixels)

Furthermore, in the description above, the left light-shielding pixel 100L as a pixel with shielded left area and the right light-shielding pixel 100R as a pixel with shielded right area are described as the light-shielding pixels. However, the light-shielding pixels are not limited to the combination of the light-shielding pixels with horizontally symmetrical light-shielding areas as long as the light-shielding pixels are shielded in the same direction. For example, for the light-shielding pixels, a combination of an upper light-shielding pixel 100U as a pixel with shielded upper area and a lower light-shielding pixel 100D as a pixel with shielded lower area can be adopted as light-shielding pixels with vertically symmetrical light-shielding areas.

(Other Examples of Solid-State Imaging Apparatus)

Furthermore, in the examples described in the embodiments, the present technique is applied to the CMOS image sensor including two-dimensionally arranged pixels. However, the present technique can be applied not only to the CMOS image sensor, but also to, for example, solid-state imaging apparatuses in general including two-dimensionally arranged pixels, such as a CCD (Charge Coupled Device) image sensor.

Furthermore, the present technique can be applied not only to the solid-state imaging apparatus that takes an image by detecting the distribution of the amount of incident light of the visible light, but also to solid-state imaging apparatuses in general that take images of the distributions of the incident amounts of infrared rays, X rays, particles, or the like.

Although the pixel group 200 includes neighboring pixels 100 (four pixels) of the same color in the description above, the pixel group (shared pixels) including four pixels may be considered as pixels (shared pixels) including four divided pixels. The pixel group including four pixels and the pixels including four divided pixels have substantially the same meaning when the present technique is applied.

4. Configuration of Electronic Device

Figure 28:
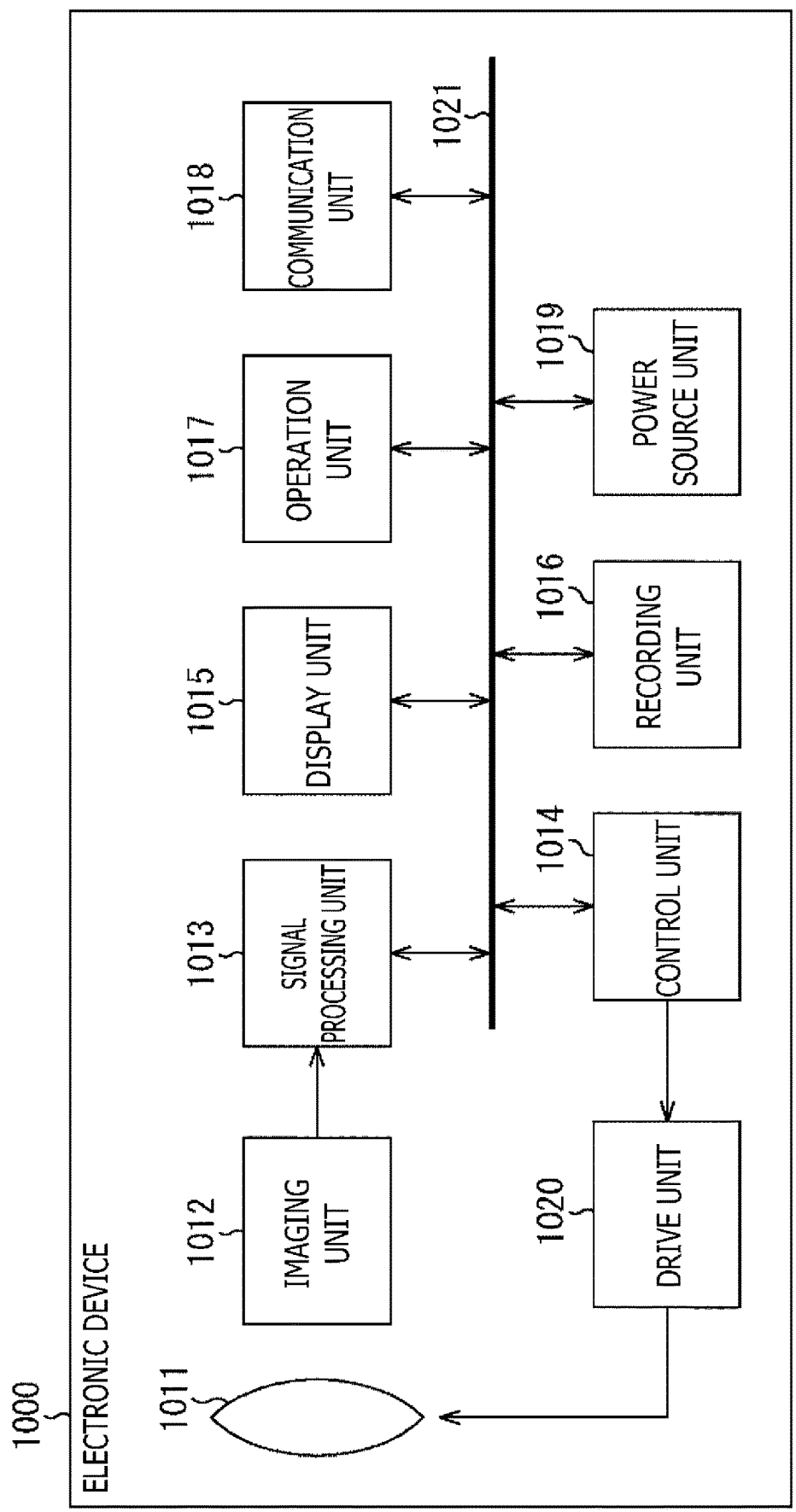
FIG. 28 is a block diagram illustrating a configuration example of an electronic device including the solid-state imaging apparatus according to the technique of the present disclosure.

FIG. 28 is a block diagram illustrating a configuration example of an electronic device including the solid-state imaging apparatus according to the technique of the present disclosure.

An electronic device 1000 is an electronic device with an imaging function, such as an imaging apparatus like a digital still camera or a video camera and a mobile terminal apparatus like a smartphone or a tablet terminal.

The electronic device 1000 includes a lens unit 1011, an imaging unit 1012, a signal processing unit 1013, a control unit 1014, a display unit 1015, a recording unit 1016, an operation unit 1017, a communication unit 1018, a power source unit 1019, and a drive unit 1020. In addition, the signal processing unit 1013, the control unit 1014, the display unit 1015, the recording unit 1016, the operation unit 1017, the communication unit 1018, and the power source unit 1019 are connected to each other through a bus 1021 in the electronic device 1000.

The lens unit 1011 includes a zoom lens, a focus lens, and the like and condenses light from a subject. The light (subject light) condensed by the lens unit 1011 enters the imaging unit 1012.

The imaging unit 1012 includes a solid-state imaging apparatus such as the image sensor according to the technique of the present disclosure (for example, the CMOS image sensor 10 of FIG. 1). The image sensor as the imaging unit 1012 photoelectrically converts the light (subject light) received through the lens unit 1011 into an electrical signal and supplies the signal obtained as a result of the photoelectric conversion to the signal processing unit 1013.

Note that the pixel array unit of the image sensor includes a plurality of pixels systematically arranged in a predetermined array pattern including pixels (normal pixels) that generate signals for generating a photographed image according to the subject light and pixels (phase difference pixels) that generate signals for performing phase difference detection.

For example, in the CMOS image sensor 10 described above (FIG. 1), the normal pixels are equivalent to the R pixels 100 (R pixel groups 200), the G pixels 100 (G pixel groups 200), and the B pixels 100 (B pixel groups 200), and the phase difference pixels are equivalent to the phase difference pixels (phase difference pixels 100L and 100R) and the light-shielding pixels (left light-shielding pixels 100L and right light-shielding pixels 100R).

The signal processing unit 1013 is a signal processing circuit that processes the signal supplied from the imaging unit 1012. For example, the signal processing unit 1013 includes a DSP (Digital Signal Processor) circuit or the like.

The signal processing unit 1013 processes the signal from the imaging unit 1012 to generate image data of still images or moving images and supplies the image data to the display unit 1015 or the recording unit 1016. The signal processing unit 1013 also generates data for detecting the phase difference (data for phase difference detection) on the basis of the signal from the imaging unit 1012 (phase difference pixels of the image sensor) and supplies the data to the control unit 1014.

The control unit 1014 includes, for example, a CPU (Central Processing Unit), a microprocessor, or the like. The control unit 1014 controls operation of each component of the electronic device 1000.

The display unit 1015 includes, for example, a display apparatus, such as a liquid crystal panel and an organic EL (Electro Luminescence) panel. The display unit 1015 processes the image data supplied from the signal processing unit 1013 and displays the still images or the moving images taken by the imaging unit 1012.

The recording unit 1016 includes, for example, a recording medium, such as a semiconductor memory and a hard disk. The recording unit 1016 records the image data supplied from the signal processing unit 1013. The recording unit 1016 also provides recorded image data according to control from the control unit 1014.

The operation unit 1017 includes, for example, physical buttons as well as a touch panel in combination with the display unit 1015. The operation unit 1017 outputs operation commands regarding various functions of the electronic device 1000 according to operation by the user. The control unit 1014 controls operation of each component on the basis of the operation commands supplied from the operation unit 1017.

The communication unit 1018 includes, for example, a communication interface circuit or the like. The communication unit 1018 exchanges data with an external device through wireless communication or wired communication according to a predetermined communication standard.

The power source unit 1019 appropriately supplies various power sources as operation power sources of the signal processing unit 1013, the control unit 1014, the display unit 1015, the recording unit 1016, the operation unit 1017, and the communication unit 1018 to these supply targets.

The control unit 1014 also detects the phase difference between two images on the basis of the data for phase difference detection supplied from the signal processing unit 1013. The control unit 1014 then determines whether the object as a target of focusing (object to be focused) is focused on the basis of the detection result of the phase difference. The control unit 1014 calculates an amount of deviation of focus (amount of defocus) in a case where the object to be focused is not focused and supplies the amount of defocus to the drive unit 1020.

The drive unit 1020 includes, for example, a motor or the like and drives the lens unit 1011 including the zoom lens, the focus lens, and the like.

The drive unit 1020 calculates an amount of drive of the focus lens of the lens unit 1011 on the basis of the amount of defocus supplied from the control unit 1014 and moves the focus lens according to the amount of drive. Note that the drive unit 1020 maintains the current position of the focus lens in a case where the object to be focused is focused.

The electronic device 1000 is configured in this way.

The present technique is applied to the imaging unit 1012 such as an image sensor as described above. Specifically, the CMOS image sensor 10 (FIG. 1) can be applied to the imaging unit 1012. By applying the present technique to the imaging unit 1012 such as an image sensor, the array pattern provided with systematically arranged pixel groups each including neighboring pixels of the same color (shared pixels including four pixels sharing the FD) is adopted for the pixels arranged in the pixel array unit. When the phase difference pixels are to be provided on the pixel array of the pixels included in the pixel groups in the case of adjusting the exposure time period for each pixel of the pixel groups (shared pixels), more suitable phase difference pixels can be provided.

5. Usage Examples of Solid-State Imaging Apparatus

Figure 29:
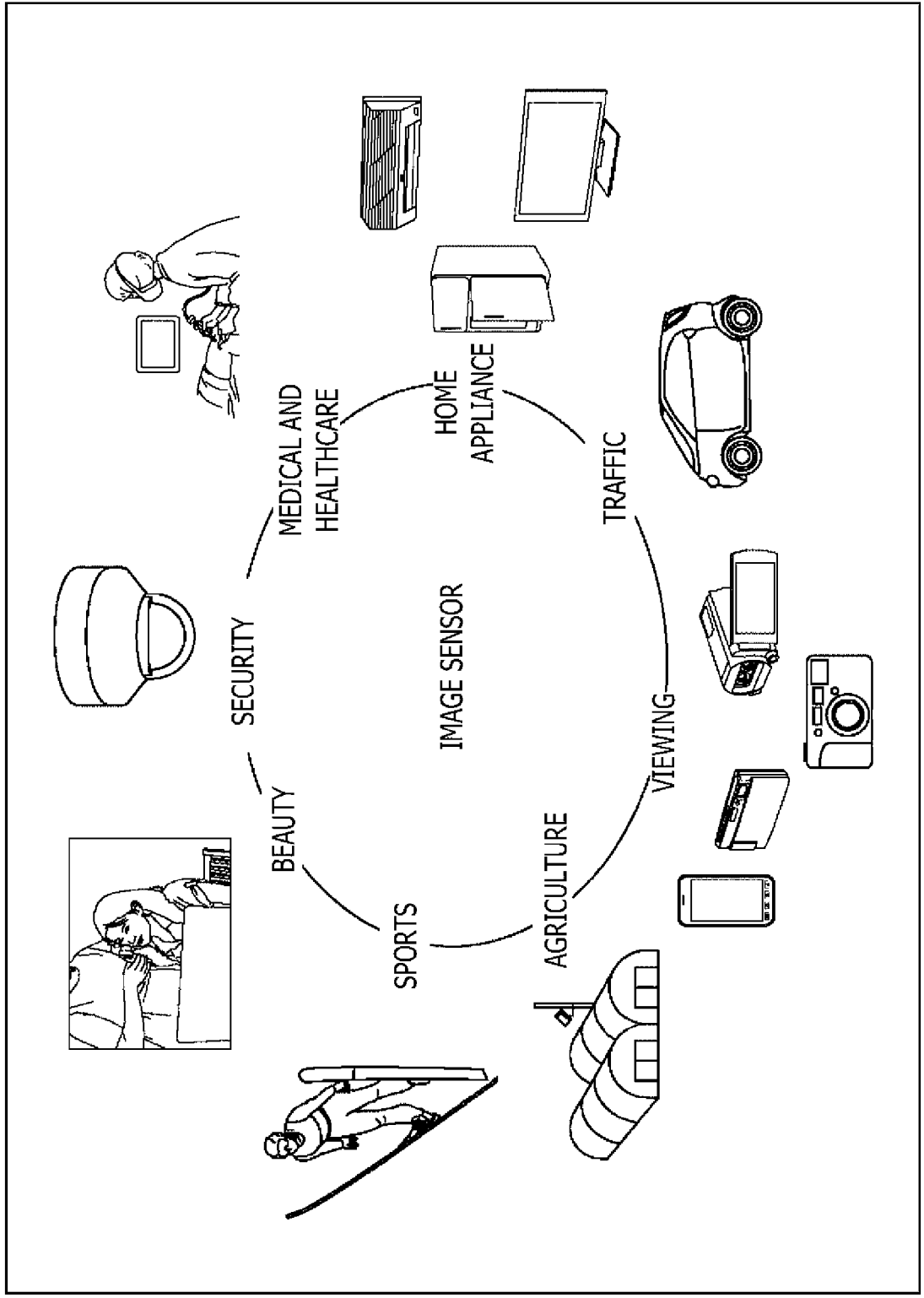
FIG. 29 depicts a usage example of the solid-state imaging apparatus according to the technique of the present disclosure.

FIG. 29 depicts usage examples of the solid-state imaging apparatus according to the technique of the present disclosure.

The CMOS image sensor 10 (FIG. 1) can be used in, for example, various cases of sensing light, such as visible light, infrared light, ultraviolet light, and X rays, as follows. More specifically, as illustrated in FIG. 29, the CMOS image sensor 10 can be used in apparatuses used not only in a field of viewing in which images to be viewed are taken, but also in a field of traffic, a field of home appliance, a field of medical and healthcare, a field of security, a field of beauty, a field of sports, a field of agriculture, or the like, for example.

Specifically, in the field of viewing, the CMOS image sensor 10 can be used in, for example, an apparatus (for example, electronic device 1000 of FIG. 28) for taking an image to be viewed, such as a digital camera, a smartphone, and a mobile phone with a camera function.

In the field of traffic, the CMOS image sensor 10 can be used in, for example, an apparatus used for traffic, such as an on-board sensor that takes images of the front, back, surroundings, or inside of a car, a monitoring camera that monitors traveling vehicles or roads, and a distance measurement sensor that measures the distance between vehicles and the like, for safe drive like automatic stop or for recognizing the state of the driver.

In the field of home appliance, the CMOS image sensor 10 can be used in, for example, an apparatus used as a home appliance, such as a television receiver, a refrigerator, and an air conditioner, that takes an image of a gesture of the user to perform device operation according to the gesture. Furthermore, in the field of medical and healthcare, the CMOS image sensor 10 can be used in, for example, an apparatus used for medical or healthcare, such as an endoscope and an apparatus that takes images of blood vessels by receiving infrared light.

In the field of security, the CMOS image sensor 10 can be used in, for example, an apparatus used for security, such as a monitoring camera for crime prevention and a camera for personal authentication. Furthermore, in the field of beauty, the CMOS image sensor 10 can be used in, for example, an apparatus used for beauty, such as a skin measurement device that takes images of the skin and a microscope that takes images of the scalp.

In the field of sports, the CMOS image sensor 10 can be used in, for example, an apparatus used for sports, such as an action camera and a wearable camera for sports and the like. Furthermore, in the field of agriculture, the CMOS image sensor 10 can be used in, for example, an apparatus used for agriculture, such as a camera that monitors the state of a farm or produce.

6. Example of Application to Movable Body

The technique according to the present disclosure (present technique) can be applied to various products. For example, the technique according to the present disclosure may be realized as an apparatus mounted on a type of movable body, such as a car, an electric car, a hybrid electric car, a motorcycle, a bicycle, a personal mobility, an airplane, a drone, a ship, and a robot.

Figure 30:
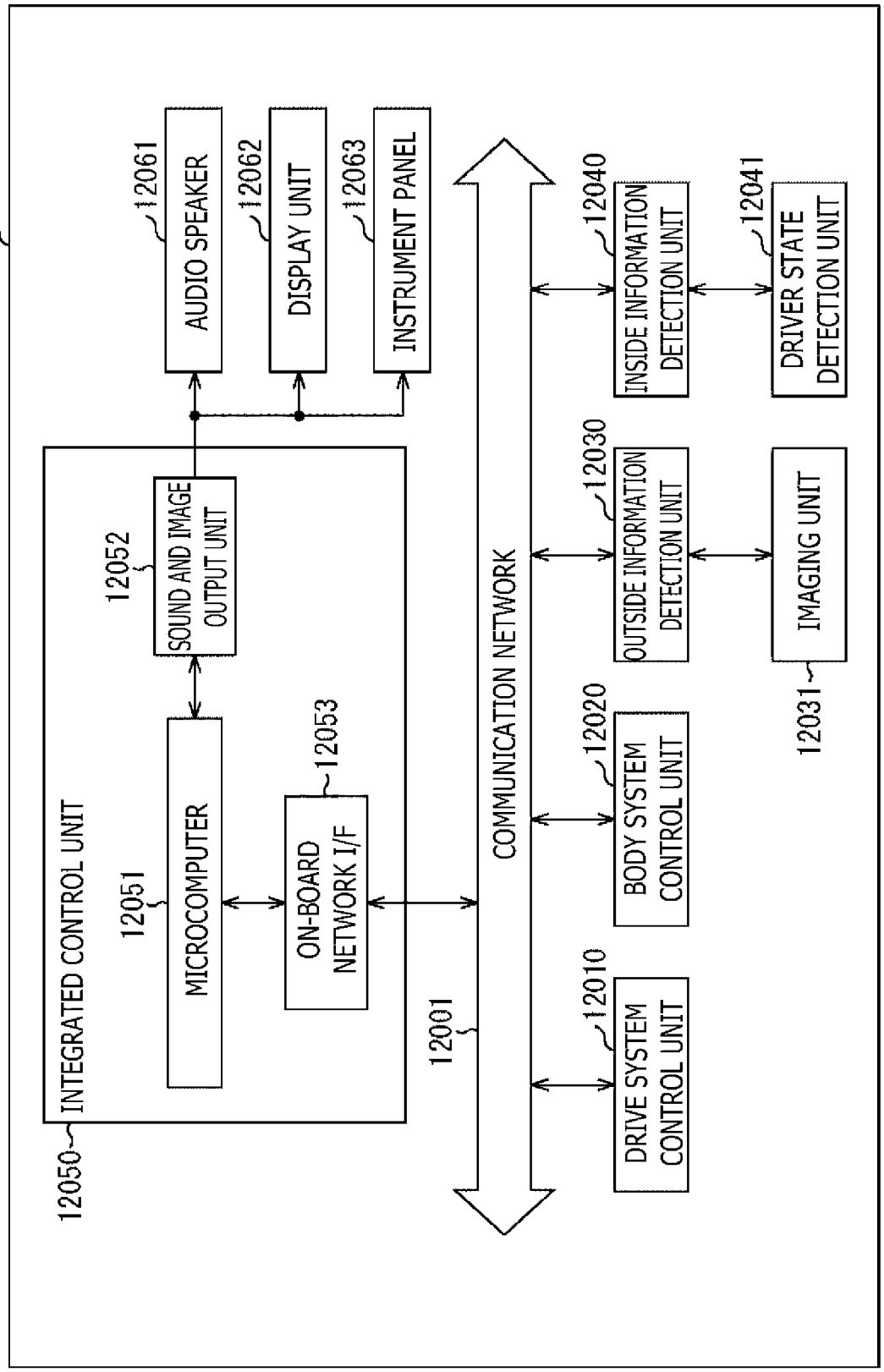
FIG. 30 is a block diagram illustrating an example of a schematic configuration of a vehicle control system.

FIG. 30 is a block diagram illustrating a schematic configuration example of a vehicle control system as an example of a movable body control system to which the technique according to the present disclosure can be applied.

A vehicle control system 12000 includes a plurality of electronic control units connected through a communication network 12001. In the example illustrated in FIG. 30, the vehicle control system 12000 includes a drive system control unit 12010, a body system control unit 12020, an outside information detection unit 12030, an inside information detection unit 12040, and an integrated control unit 12050. In addition, a microcomputer 12051, a sound and image output unit 12052, and an on-bard network I/F (Interface) 12053 are illustrated as functional components of the integrated control unit 12050.

The drive system control unit 12010 controls operation of apparatuses related to the drive system of the vehicle according to various programs. For example, the drive system control unit 12010 functions as a control apparatus of a driving force generation apparatus, such as an internal combustion engine and a driving motor, for generating driving force of the vehicle, a driving force transmission mechanism for transmitting the driving force to the wheel, a steering mechanism for adjusting the steering angle of the vehicle, a braking apparatus that generates braking force of the vehicle, and the like.

The body system control unit 12020 controls operation of various apparatuses installed on the vehicle body according to various programs. For example, the body system control unit 12020 functions as a control apparatus of a keyless entry system, a smart key system, a power window apparatus, or various lamps, such as a headlamp, a back lamp, a brake lamp, a turn signal, and a fog lamp. In this case, radio waves sent from a mobile device substituting the key or signals of various switches can be input to the body system control unit 12020. The body system control unit 12020 receives the input of the radio waves or the signals to control the door lock apparatus, the power window apparatus, the lamps, and the like of the vehicle.

The outside information detection unit 12030 detects external information of the vehicle provided with the vehicle control system 12000. For example, an imaging unit 12031 is connected to the outside information detection unit 12030. The outside information detection unit 12030 causes the imaging unit 12031 to take images outside of the vehicle and receives the taken images. The outside information detection unit 12030 may execute an object detection process or a distance detection process of a person, a car, an obstacle, characters on a sign or a road surface, and the like on the basis of the received images.

The imaging unit 12031 is an optical sensor that receives light and outputs an electrical signal according to the amount of the received light. The imaging unit 12031 can also output the electrical signal as an image or as information of distance measurement. In addition, the light received by the imaging unit 12031 may be visible light or may be invisible light such as infrared rays.

The inside information detection unit 12040 detects information inside of the vehicle. A driver state detection unit 12041 that detects the state of the driver is connected to the inside information detection unit 12040, for example. The driver state detection unit 12041 includes, for example, a camera that images the driver, and the inside information detection unit 12040 may calculate the degree of fatigue or the degree of concentration of the driver or may determine whether the driver is sleeping on the basis of the detection information input from the driver state detection unit 12041.

The microcomputer 12051 can calculate a control target value of the driving force generation apparatus, the steering mechanism, or the braking apparatus on the basis of the information inside or outside of the vehicle acquired by the outside information detection unit 12030 or the inside information detection unit 12040 and can output a control command to the drive system control unit 12010. For example, the microcomputer 12051 can perform cooperative control for realizing functions of ADAS (Advanced Driver Assistance System) including avoidance or shock mitigation of a collision of the vehicle, follow-up traveling based on the following distance, traveling at a constant speed, collision warning of the vehicle, lane departure warning of the vehicle, or the like.

The microcomputer 12051 can also control the driving force generation apparatus, the steering mechanism, the braking apparatus or the like on the basis of the information around the vehicle acquired by the outside information detection unit 12030 or the inside information detection unit 12040 to perform cooperative control aimed at, for example, automatic drive for autonomous traveling without operation by the driver.

The microcomputer 12051 can also output a control command to the body system control unit 12030 on the basis of the information outside of the vehicle acquired by the outside information detection unit 12030. For example, the microcomputer 12051 can control the headlamps according to the position of a leading car or an oncoming car detected by the outside information detection unit 12030 to perform cooperative control for anti-glare, such as switching the high beam to the low beam.

The sound and image output unit 12052 transmits an output signal of at least one of the sound and the image to an output apparatus that can visually or aurally transfer information to the occupant of the vehicle or to the outside of the vehicle. In the example of FIG. 30, an audio speaker 12061, a display unit 12062, and an instrument panel 12063 are illustrated as the output apparatus. The display unit 12062 may include, for example, at least one of an on-board display and a head-up display.

Figure 31:
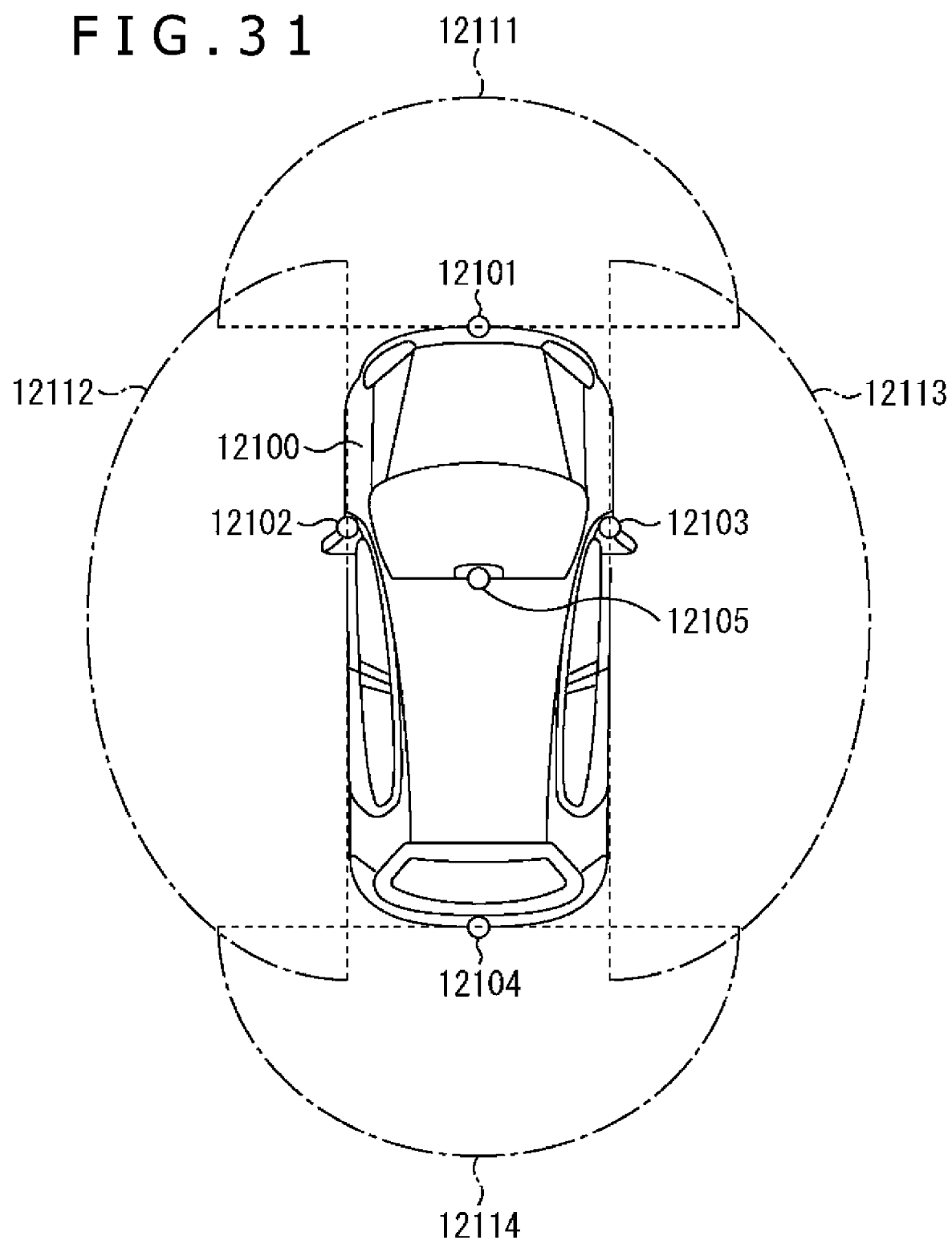
FIG. 31 is an explanatory diagram illustrating an example of installation positions of an outside information detection unit and an imaging unit.

FIG. 31 depicts an example of an installation position of the imaging unit 12031.

In FIG. 31, imaging units 12101, 12102, 12103, 12104, and 12105 are provided as the imaging unit 12031.

The imaging units 12101, 12102, 12103, 12104, and 12105 are provided at positions of, for example, the front nose, the side mirrors, the rear bumper, the back door, the upper part of the windshield of the interior, or the like of the vehicle 12100. The imaging unit 12101 installed on the front nose and the imaging unit 12105 installed on the upper part of the windshield of the interior mainly acquire images in front of the vehicle 12100. The imaging units 12102 and 12103 installed on the side mirrors mainly acquire images at the sides of the vehicle 12100. The imaging unit 12104 installed on the rear bumper or the back door mainly acquires images behind the vehicle 12100. The imaging unit 12105 installed on the upper part of the windshield of the interior is mainly used to detect vehicles in front, pedestrians, obstacles, traffic lights, traffic signs, lanes, or the like.

Note that FIG. 31 illustrates an example of photographing ranges of the imaging units 12101 to 12104. An imaging range 12111 indicates an imaging range of the imaging unit 12101 provided on the front nose. Imaging ranges 12112 and 12113 indicate imaging ranges of the imaging units 12102 and 12103 provided on the side mirrors, respectively. An imaging range 12114 indicates an imaging range of the imaging unit 12104 provided on the rear bumper or the back door. For example, pieces of image data imaged by the imaging units 12101 to 12104 are placed on top of each other to obtain a bird's eye view image as viewed from above the vehicle 12100.

At least one of the imaging units 12101 to 12104 may have a function of acquiring distance information. For example, at least one of the imaging units 12101 to 12104 may be a stereo camera including a plurality of imaging elements or may be an imaging element including pixels for phase difference detection.

For example, the microcomputer 12051 can calculate the distance to each three-dimensional object in the imaging ranges 12111 to 12114 and the temporal variation of the distance (speed relative to the vehicle 12100) on the basis of the distance information obtained from the imaging units 12101 to 12104. As a result, the microcomputer 12051 can particularly extract, as the leading car, a nearest three-dimensional object that is on the path of travel of the vehicle 12100 and that travels at a predetermined speed (for example, 0 km/hour or more) in substantially the same direction as the vehicle 12100. The microcomputer 12051 can further set the distance to the leading car to be secured in advance to perform automatic brake control (including follow-up stop control), automatic acceleration control (including follow-up start control), and the like. In this way, the microcomputer 12051 can perform cooperative control aimed at, for example, automatic drive for autonomous traveling without operation by the driver.

For example, the microcomputer 12051 can classify three-dimensional object data regarding three-dimensional objects into two-wheeled vehicles, ordinary vehicles, large vehicles, pedestrians, telephone poles, and other three-dimensional objects on the basis of the distance information obtained from the imaging units 12101 to 12104 and can extract the data to use the data to automatically avoid obstacles. For example, the microcomputer 12051 distinguishes the obstacles around the vehicle 12100 into obstacles that can be visually recognized by the driver of the vehicle 12100 and obstacles hard to visually recognize. The microcomputer 12051 can then determine a risk of collision indicating the degree of risk of collision with each obstacle. In a situation where the risk of collision is equal to or greater than a set value and there is a possibility of collision, the microcomputer 12051 can output a warning to the driver through the audio speaker 12061 or the display unit 12062 or perform forced deceleration or avoidance steering through the drive system control unit 12010 to support the drive for avoiding the collision.

At least one of the imaging units 12101 to 12104 may be an infrared camera that detects infrared rays. For example, the microcomputer 12051 can determine whether or not there is a pedestrian in the photographed images of the imaging units 12101 to 12104 to recognize the pedestrian. The pedestrian is recognized by, for example, a procedure of extracting feature points in the photographed images of the imaging units 12101 to 12104 as infrared cameras and a procedure of applying a pattern matching process to the series of feature points indicating the contour of the object to determine whether or not the object is a pedestrian. When the microcomputer 12051 determines that there is a pedestrian in the photographed images of the imaging units 12101 to 12104 and recognizes the pedestrian, the sound and image output unit 12052 controls the display unit 12062 to display and superimpose a rectangular outline on the recognized pedestrian to emphasize the pedestrian. The sound and image output unit 12052 may also control the display unit 12062 to display an icon or the like indicating the pedestrian on a desirable position.

This completes the description of the example of the vehicle control system to which the technique according to the present disclosure can be applied. The technique according to the present disclosure can be applied to the imaging unit 12031 among the components described above. Specifically, the CMOS image sensor 10 of FIG. 1 can be applied to the imaging unit 12031. Auto focus control based on the phase difference detection can be performed by applying the technique according to the present disclosure to the imaging unit 12031. Furthermore, in the technique according to the present disclosure, higher phase difference detection accuracy can be realized by, for example, providing more suitable phase difference pixels. Therefore, photographed images with higher quality can be acquired to more accurately recognize obstacles such as pedestrians.

Note that the embodiments of the present technique are not limited to the embodiments described above, and various changes can be made without departing from the scope of the present technique.

Furthermore, the present technique can be configured as follows.

(1)

A solid-state imaging apparatus including:

a pixel array unit including a plurality of two-dimensionally arranged pixels, in which the pixel array unit has an array pattern including systematically arranged pixel groups each including neighboring pixels of a same color, and pixels for phase difference detection each including one of a plurality of photoelectric conversion elements formed on one on-chip lens among the plurality of pixels are pixels of a same color adjacent to each other included in different adjacent pixel groups.

(2)

The solid-state imaging apparatus according to (1), in which the pixel group includes four, 2×2, pixels, and the pixel for phase difference detection is a pixel among the four pixels included in the pixel group.

(3)

The solid-state imaging apparatus according to one or more of (1)-(2), in which the pixels for phase difference detection include a first phase difference pixel and a second phase difference pixel that are two, 2×1, pixels included in respective left and right pixel groups adjacent to each other.

(4)

The solid-state imaging apparatus according to one or more of (1)-(3), in which an exposure time period is adjusted for each pixel included in the pixel group, and the first phase difference pixel and the second phase difference pixel are adjusted to a same exposure time period.

(5)

The solid-state imaging apparatus according to one or more of (1)-(4), in which the pixel group includes shared pixels sharing a pixel circuit with neighboring pixels and shares a floating diffusion area.

(6)

The solid-state imaging apparatus according to one or more of (1)-(5), in which in the pixel array unit, the plurality of pixels are arranged in a matrix, and the first phase difference pixels and the second phase difference pixels are systematically arranged at predetermined pixel intervals in a row direction and a column direction.

(7)

The solid-state imaging apparatus according to one or more of (1)-(6), in which the first phase difference pixel and the second phase difference pixel are each a pixel of a plurality of pixels adjusted to the same exposure time period among the four pixels included in the pixel group.

(8)

The solid-state imaging apparatus according to one or more of (1)-(7), in which the four pixels included in the pixel group include a first pixel adjusted to a first exposure time period, a second pixel adjusted to a second exposure time period shorter than the first exposure time period, and a third pixel adjusted to a third exposure time period with a length between the first exposure time period and the second exposure time period, and the first phase difference pixel and the second phase difference pixel are each the third pixel in a case where there are a plurality of third pixels.

(9)

The solid-state imaging apparatus according to one or more of (1)-(8), in which the four pixels included in the pixel group include a first pixel adjusted to a first exposure time period and a second pixel adjusted to a second exposure time period shorter than the first exposure time period, and the first phase difference pixel and the second phase difference pixel are each the first pixel in a case where there are a plurality of first pixels.

(10)

The solid-state imaging apparatus according to one or more of (1)-(9), in which the pixels for phase difference detection include a first phase difference pixel and a second phase difference pixel, and charge accumulated in a photoelectric conversion element of the first phase difference pixel and charge accumulated in a photoelectric conversion element of the second phase difference pixel are transferred to different floating diffusion areas at the same time.

(11)

The solid-state imaging apparatus according to one or more of (1)-(10), in which a contact of the first phase difference pixel and a contact of the second phase difference pixel are electrically connected to a same drive line.

(12)

The solid-state imaging apparatus according to one or more of (1)-(11), in which in the pixel array unit, the plurality of pixels are arranged in a matrix, the pixel group includes four, 2×2, pixels, contacts of the four pixels included in the pixel group are arranged in a same connection mode in a row direction and a column direction, and the contacts of the four pixels included in a first pixel group including the first phase difference pixel correspond to the contacts of the four pixels included in another pixel group in the same row and are arranged and connected to the same drive lines according to the exposure time period of each pixel.

(13)

The solid-state imaging apparatus according to one or more of (1)-(12), in which in the pixel array unit, the plurality of pixels are arranged in a matrix, the pixel group includes four, 2×2, pixels, contacts of the four pixels included in the pixel group are arranged in a same connection mode as the pixel groups of the same color in a row direction and a column direction, and the contacts of the four pixels included in a first pixel group including the first phase difference pixel correspond to the contacts of the four pixels included in another pixel group of the same color in the same row and are arranged and connected to the same drive lines according to the exposure time period of each pixel.

(14)

The solid-state imaging apparatus according to one or more of (1)-(13), in which the plurality of pixels include red (R) pixels, green (G) pixels, and blue (B) pixels according to red (R), green (G), and blue (B) color filters, and the first phase difference pixel and the second phase difference pixel are pixels of one of the red (R) pixels, the green (G) pixels, and the blue (B) pixels.

(15)

The solid-state imaging apparatus according to one or more of (1)-(14), in which the array pattern is a Bayer array.

(16)

The solid-state imaging apparatus according to one or more of (1)-(15), in which the first phase difference pixel and the second phase difference pixel are the green (G) pixels, the first phase difference pixel is included in a blue (B) pixel group and the second phase difference pixel is included in a green (G) pixel group, and the color filters are formed in order of the green (G) color filters, the red (R) color filters, and the blue (B) color filters at manufacturing.

(17)

A solid-state imaging apparatus including:

a pixel array unit including a plurality of two-dimensionally arranged pixels, in which the pixel array unit has an array pattern including systematically arranged pixel groups each including neighboring pixels of a same color, an exposure time period is adjusted for each pixel included in the pixel group, and a specific pixel group of the plurality of pixel groups arranged in the array pattern includes light-shielding pixels as pixels for phase difference detection in which part of a light incident side is shielded.

(18)

The solid-state imaging apparatus according to (17), in which the pixel group includes four, 2×2, pixels, and in the specific pixel group, two pixels on a same diagonal adjusted to a same exposure time period are first light-shielding pixels that are pixels with shielded left areas or second light-shielding pixels that are pixels with shielded right areas as viewed from the light incident side.

(19)

The solid-state imaging apparatus according to one or more of (17)-(18), in which in the pixel array unit, the plurality of pixels are arranged in a matrix, first pixel groups including the first light-shielding pixels are systematically arranged at predetermined pixel intervals in a row direction, second pixel groups including the second light-shielding pixels are systematically arranged at predetermined pixel intervals in the row direction, and the first pixel groups and the second pixel groups are systematically arranged at predetermined pixel intervals in a column direction.

(20)

An electronic device including:

an imaging unit including a solid-state imaging apparatus that includes a pixel array unit including a plurality of two-dimensionally arranged pixels, the pixel array unit having an array pattern including systematically arranged pixel groups each including neighboring pixels of a same color, pixels for phase difference detection being pixels of a same color adjacent to each other included in different adjacent pixel groups, the pixels for phase difference detection each including one of a plurality of photoelectric conversion elements formed on one on-chip lens among the plurality of pixels; and a control unit that performs auto focus control on a basis of a result of phase difference detection obtained from an output of the pixels for phase difference detection.

(21)

An imaging apparatus comprising:

a pixel array unit including a plurality of pixel groups, each of the plurality of pixel groups being one of i) a normal pixel group including only normal pixels, or ii) a mixed pixel group including at least one normal pixel and at least one phase difference detection pixel, wherein for each normal pixel group, the normal pixels receive light transmitted through a same colored color filter, and for each mixed pixel group, the at least one phase difference detection pixel shares an on-chip lens with at least one other phase difference detection pixel and receives light transmitted through a same colored color filter as the at least one other phase difference detection pixel.

(22)

The imaging apparatus according to (21), wherein each of the plurality of pixel groups includes four pixels in a 2×2 array, and for the mixed pixel groups, the four pixels include the at least one phase difference detection pixel.

(23)

The imaging apparatus according to one or more of (21)-(22), wherein the at least one phase difference detection pixel includes a first phase difference detection pixel and the at least one other phase difference detection pixel includes a second phase difference detection pixel, and the first phase difference detection pixel and the second phase difference detection pixel are adjacent to one another and belong to different mixed pixel groups.

(24)

The imaging apparatus according to one or more of (21)-(23), wherein a contact of the first phase difference detection pixel and a contact of the second phase difference detection pixel are electrically connected to a same drive line.

(25)

The imaging apparatus according to one or more of (21)-(24), wherein contacts of the normal pixels in each of the plurality of pixel groups are electrically connected to respective drive lines to control an exposure time period for each normal pixel, and the contact of the first phase difference detection pixel and the contact of the second phase difference detection pixel are electrically connected to the same drive line such that the first phase difference detection pixel and the second phase difference detection pixel have a same exposure time period.

(26)

The imaging apparatus according to one or more of (21)-(25), further comprising:

a plurality of floating diffusion areas, each floating diffusion area being for a respective pixel group; and a plurality of pixel circuits, each pixel circuit being for a respective pixel group.

(27)

The imaging apparatus according to one or more of (21)-(26), wherein the plurality of pixel groups are arranged in a matrix, and the mixed pixel groups are arranged at predetermined intervals in a row direction and a column direction.

(28)

The imaging apparatus according to one or more of (21)-(27), wherein each of the plurality of pixel groups includes four pixels arranged in a 2×2 array, and the at least one phase difference detection pixel includes a first phase difference detection pixel, and the at least one other phase difference detection pixel includes a second phase difference detection pixel, and the first and second phase difference detection pixels have same exposure time periods.

(29)

The imaging apparatus according to one or more of (21)-(28), wherein the four pixels include a first normal pixel having a first exposure time period, a second normal pixel having a second exposure time period shorter than the first exposure time period, and the same exposure time period of the first phase difference detection pixel and the second phase difference detection pixel is between the first exposure time period and the second exposure time period.

(30)

The imaging apparatus according to one or more of (21)-(29), wherein the four pixels include a first normal pixel having a first exposure time period and a second normal pixel having a second exposure time period shorter than the first exposure time period, and the same exposure time period of first phase difference detection pixel and the second phase difference detection pixel is the first exposure time period.

(31)

The imaging apparatus according to one or more of (21)-(30), wherein the first phase difference detection pixel and the second phase difference detection pixel are coupled to different floating diffusion areas.

(32)

The imaging apparatus according to one or more of (21)-(31), wherein the plurality of pixel groups are arranged in a matrix, each of the plurality of pixel groups includes first, second, third, and fourth pixels arranged in a 2×2 array, each of the first pixels includes a first contact, each of the second pixels includes a second contact, each of the third pixels includes a third contact, and each of the fourth pixels includes a fourth contact, the first contacts are aligned with one another in a row direction and a column direction, the second contacts are aligned with one another in the row direction and the column direction, the third contacts are aligned with one another in the row direction and the column direction, and the fourth contacts are aligned with one another in the row direction and the column direction, and the first contacts are connected to a same first drive line, the second contacts are connected to a same second drive line, the third contacts are connected to a same third drive line, and the fourth contacts are connected to a same fourth drive line.

(33)

The imaging apparatus according to one or more of (21)-(32), wherein the normal pixels and the first phase difference detection pixel and the second phase difference detection pixel are red pixels, green pixels, or blue pixels according to red, green, and blue color filters.

(34)

The imaging apparatus according to one or more of (21)-(33), wherein an array pattern of the pixel groups is a Bayer array pattern.

(35)

The imaging apparatus according to one or more of (21)-(34), wherein the first phase difference detection pixel and the second phase difference detection pixel are the green pixels, and the first phase difference detection pixel is included in a mixed pixel group with normal pixels that are the blue pixels and the second phase difference detection pixel is included in another mixed pixel group with normal pixels that are the green pixels.

(36)

An imaging apparatus comprising:

a pixel array unit including a plurality of pixel groups, each of the plurality of pixel groups being one of i) a normal pixel group including only normal pixels, or ii) a mixed pixel group including at least one normal pixel and a first phase difference detection pixel that is partially shielded from incident light, wherein for each normal pixel group, the normal pixels receive light transmitted through a same colored color filter, and for each mixed pixel group, the first phase difference detection pixel has a single corresponding on-chip lens.

(37)

The imaging apparatus according to (36), wherein
each pixel group includes four pixels arranged in a 2×2 array,
each mixed pixel group includes a second phase difference detection pixel that is partially shielded from incident light,
for each mixed pixel group, the first phase difference detection pixel and the second phase difference detection pixel are diagonal to one another and have a same exposure time period, and
for each mixed pixel group, the first and second phase difference detection pixels are partially shielded on left areas or right areas as viewed from a light incident side.

(38)

The imaging apparatus according to one or more of (36)-(37), wherein
the plurality of pixel groups are arranged in a matrix, and
the mixed pixel groups are arranged at predetermined intervals in a row direction and a column direction.

(39)

The imaging apparatus according to one or more of (36)-(38), wherein some of the mixed pixel groups include first and second phase difference detection pixels shielded on the left areas, and others of the mixed pixel groups include first and second phase difference detection pixels shielded on the right areas.

(40)

An electronic device comprising:
a solid-state imaging apparatus that includes:
a pixel array unit including a plurality of pixel groups, each of the plurality of pixel groups being one of i) a normal pixel group including only normal pixels, or ii) a mixed pixel group including at least one normal pixel and at least one phase difference detection pixel, wherein
for each normal pixel group, the normal pixels receive light transmitted through a same colored color filter, and
for each mixed pixel group, the at least one phase difference detection pixel shares an on-chip lens with at least one other phase difference detection pixel and receives light transmitted through a same colored color filter as the at least one other phase difference detection pixel; and
a control unit that performs auto-focus control based on output of the at least one phase difference detection pixel in each mixed pixel group.

REFERENCE SIGNS LIST

10 CMOS image sensor
11 Pixel array unit
12 Vertical drive circuit
21 Pixel drive line
22 Vertical signal line
100 Pixel
100L, 100R Phase difference pixel
100L Left light-shielding pixel
100R Right light-shielding pixel
111 On-chip lens
112 Photodiode
113 Color filter
114 Light-shielding portion
200 Pixel group
210 Comparator
220 DAC
1000 Electronic device
1012 Imaging unit
1014 Control unit
1020 Drive unit
12031 Imaging unit

What is claimed is:

1. An imaging apparatus, comprising:
a pixel array unit including a plurality of pixel groups, the plurality of pixel groups including i) normal pixel groups including only normal pixels, and ii) mixed pixel groups including at least one normal pixel and at least one phase difference detection pixel,
wherein, for each normal pixel group, color filters of the normal pixels transmit a same wavelength of light,
wherein, for each mixed pixel group, the at least one phase difference detection pixel shares an on-chip lens with at least one other phase difference detection pixel,
wherein a color filter of the at least one phase difference detection pixel transmits a same wavelength of light as a color filter of the at least one other phase difference detection pixel,
wherein each of the plurality of pixel groups includes four pixels in a 2×2 array,
wherein for the mixed pixel groups, the four pixels include the at least one phase difference detection pixel,
wherein the at least one phase difference detection pixel includes a first phase difference detection pixel and the at least one other phase difference detection pixel includes a second phase difference detection pixel, and
wherein the first phase difference detection pixel and the second phase difference detection pixel are adjacent to one another and belong to different mixed pixel groups.

2. The imaging apparatus according to claim 1, wherein a contact of the first phase difference detection pixel and a contact of the second phase difference detection pixel are electrically connected to a same drive line.

3. The imaging apparatus according to claim 2, wherein contacts of the normal pixels in each of the plurality of pixel groups are electrically connected to respective drive lines to control an exposure time period for each normal pixel, and wherein the contact of the first phase difference detection pixel and the contact of the second phase difference detection pixel are electrically connected to the same drive line such that the first phase difference detection pixel and the second phase difference detection pixel have a same exposure time period.

4. The imaging apparatus according to claim 3, wherein the plurality of pixel groups are arranged in a matrix, and wherein the mixed pixel groups are arranged at predetermined intervals in a row direction and a column direction of the matrix.

5. The imaging apparatus according to claim 3, wherein the four pixels include a first normal pixel having a first exposure time period, and a second normal pixel having a second exposure time period shorter than the first exposure time period, and wherein the same exposure time period of the first phase difference detection pixel and the second phase difference detection pixel is between the first exposure time period and the second exposure time period.

6. The imaging apparatus according to claim 1, further comprising:
- a plurality of floating diffusion areas, each floating diffusion area being for a respective pixel group; and
- a plurality of pixel circuits, each pixel circuit being for a respective pixel group.

7. The imaging apparatus according to claim 6, wherein the first phase difference detection pixel and the second phase difference detection pixel are coupled to different floating diffusion areas.

8. The imaging apparatus according to claim 1,
wherein the plurality of pixel groups are arranged in a matrix,
wherein the four pixels in each of the plurality of pixel groups include first, second, third, and fourth pixels arranged in the 2×2 array,
wherein each of the first pixels includes a first contact, each of the second pixels includes a second contact, each of the third pixels includes a third contact, and each of the fourth pixels includes a fourth contact,
wherein the first contacts are aligned with one another in a row direction and a column direction, the second contacts are aligned with one another in the row direction and the column direction, the third contacts are aligned with one another in the row direction and the column direction, and the fourth contacts are aligned with one another in the row direction and the column direction, and
wherein the first contacts are connected to a same first drive line, the second contacts are connected to a same second drive line, the third contacts are connected to a same third drive line, and the fourth contacts are connected to a same fourth drive line.

9. The imaging apparatus of claim 1, wherein the different mixed pixel groups are adjacent to one another.

10. An imaging apparatus, comprising:
a pixel array unit including a plurality of pixel groups, the plurality of pixel groups including i) normal pixel groups including only normal pixels, and ii) mixed pixel groups including at least one normal pixel and at least one phase difference detection pixel,
wherein, for each normal pixel group, color filters of the normal pixels transmit a same wavelength of light,
wherein, for each mixed pixel group, the at least one phase difference detection pixel shares an on-chip lens with at least one other phase difference detection pixel,
wherein a color filter of the at least one phase difference detection pixel transmits a same wavelength of light as a color filter of the at least one other phase difference detection pixel,
wherein each of the plurality of pixel groups includes four pixels arranged in a 2×2 array,
wherein the at least one phase difference detection pixel includes a first phase difference detection pixel,
wherein the at least one other phase difference detection pixel includes a second phase difference detection pixel, and
wherein the first and second phase difference detection pixels have a same exposure time period.

11. The imaging apparatus according to claim 10, wherein the normal pixels and the first phase difference detection pixel and the second phase difference detection pixel are red pixels, green pixels, or blue pixels according to red, green, and blue color filters.

12. The imaging apparatus according to claim 11, wherein an array pattern of the plurality of pixel groups is a Bayer array pattern.

13. The imaging apparatus according to claim 12, wherein the first phase difference detection pixel and the second phase difference detection pixel are the green pixels, and wherein the first phase difference detection pixel is included in a mixed pixel group with normal pixels that are the blue pixels and the second phase difference detection pixel is included in another mixed pixel group with normal pixels that are the green pixels.

14. The imaging apparatus according to claim 10, wherein the four pixels include a first normal pixel having a first exposure time period, and a second normal pixel having a second exposure time period shorter than the first exposure time period, and wherein the same exposure time period of the first phase difference detection pixel and the second phase difference detection pixel is the first exposure time period.

15. An imaging apparatus, comprising:
a pixel array unit including a plurality of pixel groups, the plurality of pixel groups including i) normal pixel groups including only normal pixels, and ii) mixed pixel groups including at least one normal pixel and a first phase difference detection pixel that is partially shielded from incident light,
wherein, for each normal pixel group, color filters of the normal pixels transmit a same wavelength of light,
wherein, for each mixed pixel group, the first phase difference detection pixel has a single corresponding on-chip lens,
wherein each pixel group includes four pixels arranged in a 2×2 array,
wherein each mixed pixel group includes a second phase difference detection pixel that is partially shielded from incident light,
wherein, for each mixed pixel group, the first phase difference detection pixel and the second phase difference detection pixel are diagonal to one another and have a same exposure time period, and
wherein, for each mixed pixel group, the first and second phase difference detection pixels are partially shielded on left areas or right areas as viewed from a light incident side.

16. The imaging apparatus according to claim 15, wherein the plurality of pixel groups are arranged in a matrix, and wherein the mixed pixel groups are arranged at predetermined intervals in a row direction and a column direction of the matrix.

17. The imaging apparatus according to claim 16, wherein some of the mixed pixel groups include the first and second phase difference detection pixels shielded on the left areas, and others of the mixed pixel groups include the first and second phase difference detection pixels shielded on the right areas.

* * * * *